(12) United States Patent
Brown et al.

(10) Patent No.: US 7,643,529 B2
(45) Date of Patent: Jan. 5, 2010

(54) LASER SYSTEM

(75) Inventors: Daniel J. W. Brown, San Diego, CA (US); William N. Partlo, Poway, CA (US); Richard L. Sandstrom, Encinitas, CA (US)

(73) Assignee: Cymer, Inc., San Diego, CA (US)

( * ) Notice: Subject to any disclaimer, the term of this patent is extended or adjusted under 35 U.S.C. 154(b) by 64 days.

(21) Appl. No.: 11/982,103

(22) Filed: Oct. 31, 2007

(65) Prior Publication Data

US 2008/0225904 A1    Sep. 18, 2008

Related U.S. Application Data

(63) Continuation-in-part of application No. 11/787,180, filed on Apr. 13, 2007, which is a continuation-in-part of application No. 11/584,792, filed on Oct. 20, 2006, now abandoned, and a continuation-in-part of application No. 11/522,052, filed on Sep. 14, 2006, now abandoned, and a continuation-in-part of application No. 11/521,906, filed on Sep. 14, 2006, now abandoned, and a continuation-in-part of application No. 11/521,905, filed on Sep. 14, 2006, now abandoned, and a continuation-in-part of application No. 11/521,904, filed on Sep. 14, 2006, now abandoned, and a continuation-in-part of application No. 11/521,860, filed on Sep. 14, 2006, now abandoned, and a continuation-in-part of application No. 11/521,858, filed on Sep. 14, 2006, now abandoned, and a continuation-in-part of application No. 11/521,835, filed on Sep. 14, 2006, now abandoned, and a continuation-in-part of application No. 11/521,834, filed on Sep. 14, 2006, now abandoned, and a continuation-in-part of application No. 11/521,833, filed on Sep. 14, 2006, now abandoned.

(60) Provisional application No. 60/814,424, filed on Jun. 16, 2006, provisional application No. 60/814,293, filed on Jun. 16, 2006, provisional application No. 60/732,688, filed on Nov. 1, 2005.

(51) Int. Cl.
H01S 3/22 (2006.01)

(52) U.S. Cl. .............................. 372/55; 372/57; 372/69; 372/92

(58) Field of Classification Search .................. 372/55, 372/69, 92
See application file for complete search history.

(56) References Cited

U.S. PATENT DOCUMENTS 3,530,388 A    9/1970    Guerra et al. ................. 330/4.3

(Continued)

FOREIGN PATENT DOCUMENTS

| JP | 2000-223408 | 2/1999 |
| WO | WO97/08792 | 3/1997 |

OTHER PUBLICATIONS

Buczek, et al, "C02 Regenerative Ring Power Amplifiers," *Journal of Applied Physics*, vol. 42, No. 8, pp. 33133-33137, (Jul. 1971).

(Continued)

*Primary Examiner*—Dung T Nguyen
(74) *Attorney, Agent, or Firm*—DiBerardino Law LLC

(57) ABSTRACT

An apparatus/method may comprise a line narrowed pulsed lithography laser light source which may comprise: a seed pulse providing laser system which may comprise: a first pulsed seed laser producing seed pulses at a rate of X kHz; a second pulsed seed laser producing seed pulses at a rate of X kHz; an amplification system which may comprise: a first amplifier gain system which may comprise a first and a second pulsed gas discharge amplifier gain medium, each with a nominal center wavelength in the UV range, and each operating at ½ X kHz on output pulses from the first seed laser; a second amplifier gain system which may comprise a first and a second pulsed amplifier gain medium, each with a nominal center wavelength in the UV range, and each operating at ½ X kHz on output pulses from the second seed laser.

15 Claims, 27 Drawing Sheets

U.S. PATENT DOCUMENTS

| | | | |
|---|---|---|---|
| 3,566,128 A | 2/1971 | Arnuad | 250/199 |
| 3,646,468 A | 2/1972 | Buczek et al. | 331/94.5 |
| 3,646,469 A | 2/1972 | Buczek et al. | 331/94.5 |
| 3,969,685 A | 7/1976 | Chenausky et al. | 331/94.5 |
| 4,019,157 A | 4/1977 | Hutchinson | 331/94.5 |
| 4,107,628 A | 8/1978 | Hill et al. | 331/94.5 |
| 4,135,787 A | 1/1979 | McLafferty | 350/294 |
| 4,227,159 A | 10/1980 | Barrett et al. | 331/94.5 |
| 4,229,106 A | 10/1980 | Dorschner et al. | 356/350 |
| 4,239,341 A | 12/1980 | Cason, III et al. | 350/294 |
| 4,247,831 A | 1/1981 | Lindop | 331/94.5 |
| 4,264,870 A | 4/1981 | Avicola et al. | 330/4.3 |
| 4,268,800 A | 5/1981 | Johnson, Jr. | 331/94.5 |
| 4,490,823 A | 12/1984 | Komine et al. | 372/95 |
| 4,499,582 A | 2/1985 | Karning et al. | 372/93 |
| 4,606,034 A | 8/1986 | Eden et al. | 372/57 |
| 4,689,794 A | 8/1987 | Brosnan | 372/18 |
| 4,982,406 A | 1/1991 | Facklan | 372/18 |
| 5,097,478 A | 3/1992 | Verdiell et al. | 372/94 |
| 5,233,460 A | 8/1993 | Partlo et al. | 359/247 |
| 5,694,408 A * | 12/1997 | Bott et al. | 372/6 |
| 5,940,418 A | 8/1999 | Shields | 372/22 |
| 6,031,854 A | 2/2000 | Ming | 372/22 |
| 6,191,887 B1 | 2/2001 | Michaloski et al. | 359/495 |
| 6,320,886 B1 | 11/2001 | Dawber et al. | 372/22 |
| 6,373,869 B1 | 4/2002 | Jacob | 372/22 |
| 6,477,188 B1 | 11/2002 | Takaoka et al. | 372/22 |
| 6,549,551 B2 | 4/2003 | Ness et al. | 372/38.07 |
| 6,560,263 B1 | 5/2003 | Morton et al. | 372/87 |
| 6,567,450 B2 | 5/2003 | Myers et al. | 372/55 |
| 6,577,663 B2 | 6/2003 | Vogler | |
| 6,590,698 B1 | 7/2003 | Ohtsuki et al. | 359/326 |
| 6,590,922 B2 | 7/2003 | Onkels et al. | 372/57 |
| 6,625,191 B2 | 9/2003 | Knowles et al. | 372/55 |
| 6,654,163 B1 | 11/2003 | Du et al. | 359/347 |
| 6,690,704 B2 | 2/2004 | Fallon et al. | 372/58 |
| 6,693,939 B2 | 2/2004 | Klene | |
| 6,721,344 B2 | 4/2004 | Nakao et al. | 372/55 |
| 6,741,627 B2 | 5/2004 | Kitatochi et al. | 372/57 |
| 6,816,520 B1 | 11/2004 | Tulloch et al. | 372/22 |
| 6,839,373 B1 | 1/2005 | Takehisa et al. | 372/57 |
| 6,865,210 B2 | 3/2005 | Ershov et al. | 372/55 |
| 6,901,084 B2 | 5/2005 | Pask et al. | 372/3 |
| 6,904,073 B2 | 6/2005 | Yager et al. | 372/57 |
| 6,928,093 B2 | 8/2005 | Webb et al. | 372/25 |
| 6,940,880 B2 | 9/2005 | Butterworth et al. | 372/22 |
| 7,006,547 B2 | 2/2006 | Steiger | |
| 7,061,959 B2 | 6/2006 | Partlo et al. | 372/55 |
| 7,167,499 B2 | 1/2007 | Das et al. | 219/121.76 |
| 7,184,204 B2 | 2/2007 | Govorkov et al. | 372/25 |
| 7,212,275 B2 | 5/2007 | Ohtsuki | 372/26 |
| 7,227,881 B2 | 6/2007 | Govorkov et al. | 372/57 |
| 7,369,597 B2 | 5/2008 | Smith et al. | 372/94 |
| 2004/0202220 A1 | 10/2004 | Hua et al. | 372/57 |
| 2005/0205811 A1 | 9/2005 | Partlo | |
| 2005/0269300 A1 | 12/2005 | Partlo et al. | 219/121.65 |
| 2005/0286599 A1 | 12/2005 | Rafac et al. | 372/55 |
| 2006/0007978 A1 | 1/2006 | Govorkov et al. | 372/55 |
| 2006/0114958 A1 | 6/2006 | Trinkchouk et al. | 372/55 |
| 2006/0126697 A1 | 6/2006 | Knowles et al. | 372/55 |
| 2006/0146900 A1 | 7/2006 | Jacques et al. | 372/38.1 |
| 2006/0209916 A1 | 9/2006 | Holtaway et al. | 372/55 |
| 2006/0222034 A1* | 10/2006 | Ujazdowski et al. | 372/57 |
| 2006/0227839 A1 | 10/2006 | Besaucele et al. | 372/55 |
| 2006/0291517 A1 | 12/2006 | Gillespie et al. | 372/55 |
| 2007/0001127 A1 | 1/2007 | Reiley et al. | 250/492.2 |
| 2007/0091968 A1 | 4/2007 | Wakabayashi | |
| 2007/0237192 A1 | 10/2007 | Das et al. | 372/25 |
| 2007/0279747 A1 | 12/2007 | Hofmann | 359/583 |

OTHER PUBLICATIONS

Cobb, et al, "EUV Photoresist Performance Results From The VNL and The EUV LLC," *Emerging Lithographic Technologies VI, Roxann L. Engelstad, Editor Proceedings of SPIE*, vol. 4688 (2002).

Fork, et al, "Amplification of Femtosecond Optical Pulses Using A Double Confocal Resonator," *Optics Letters*, vol. 14, No. 19 (Oct. 1989).

Goodman, "Speckle In Certain Imaging Applications," Chapter 6 of *Speckle Phenomena In Optics: Theory and Applications*, pp. 187-233.

Lee, "Effect Of Line Edge Roughness (LER) And Line Width Roughness (LWR) On Sub-100 nm Device Performance, Advances In Resist Technology and Processing XXI," edited by John L. Sturtevant, *Proceedings of SPIE* vol. 5376 (SPIE, Bellinaham, WA. 2004).

Leunissen, et al, "Full Spectral Analysis Of Line Width Roughness, Metrology, Inspection and Process Control For Microlithography XIX," edited by Richard M. Silver, Proc. Of SPIE vol. 5752 (SPIE, Bellingham, WA 2005).

Ming-Lai, et al., "Transversely Pumped 11-Pass Amplifier For Femtosecond Optical Pulses," *Applied Optics*, vol. 30, No. 30, pp. 4365-4367 (Oct. 20, 1991).

Monga, et al., "Collimination Of The Output Beam From An Asymmetric Unstable Ring Resonator," *Applied Optics*, vol. 24, No. 6, pp. 914-916 (Mar. 15, 1985).

Mückenheim, et al., "Attaining The Wavelength Range 189-197 By Frequency Mixing In B-BaB2O4," Appl.Phys. B 45, pp. 259-261 (1988).

Nabors, et al, "Injection Locking Of A 13-W cw Nd:YAG Ring Laser," *Optics Letters*, vol. 14, No. 21, (Nov. 1989).

Nabekawa, et al., "50-W Average Power, 200-Hz Repetition Rate, 480-fs KrF Excimer Laser With Gated Gain Amplification," CLEO, p. 96 (2001).

Naulleau, "Relevance Of Mask-Roughness-Induced Printed Line-Edge Roughness In Recent and Future Extreme-Ultraviolet Lithography Tests," *Applied Optics*, vol. 43, Issue 20, pp. 4025-4032 (2004).

Naulleau, "The Role of Temporal Coherence In Imaging With Extreme Ultraviolet Lithography Optics," *Optics Communications*, 219 pp. 57-63 (2003).

Nilsson, et al., "High-Power Wavelength-Tunable Cladding-Pumped Rare-Earth-Doped Silica Fiber Lasers," *Opt. Fiber Tech.*, 10, pp. 5-30 (2004).

Olson, et al., "Multipass Diode-Pumped Nd:YAG Optical Amplifiers At 1.06 um and 1.32 um," *IEEE Photonics Technology Letters*, vol. 6, No. 5, pp. 605-608 (May 5, 1994).

Pacala, et al., "A Wavelength Scannable XeCl Oscillator-Ring Amplifier Laser System", *App. Phys. Letters*, vol. 40, No. 1 (Jan. 1982).

Partlo, et al., "Diffuser Speckle Model: Application To Multiple Moving Diffusers," *Applied Optics*, vol. 32, No. 16, pp. 3009-3014 (Jun. 1993).

Paschotta, "Regenerative Amplifiers," found at http://www.rp-photonics.com/regenerative_amplifliers.html.

Patsis, et al., "Integrated Simulation Of Line-Edge Roughness (LER) Effects On Sub-65 nm Transistor Operation: From Lithography Simulation, To LER Metrology, To Device Operation," *Emerging Lithographic Technologies X. edited by Michael J. Lercel, Proc. Of SPIE*, vol. 6151, 61513J (2006).

Pawloski, et al., "Characterization Of Line Edge Roughness In Photoresist Using An Image Fading Technique," Advances In Resist Technology and Processing XXI, John L. Sturtevant, Editor, *Proc., of SPIE*, vol. 5376, pp. 414-425 (SPIE, Bellingham, WA 2004).

Plaessmann, et al., "Multipass Diode-Pumped Solid-State Optical Amplifier," *Optics Letters*, vol. 18, No. 17, pp. 1420-1422 (Sep. 1, 1993).

Rydberg, et al., "Dynamic Laser Speckle As A Detrimental Phenomenon In Optical Projection Lithography," *J. Microlith., Microfab., Microsyst.*, vol. 53, No. 1-1-1-8 (Jul.-Sep. 2006).

Sandstrom, et al., "Dynamic Laser Speckle in Optical Projection Lithography: Causes, Effects On CDU and LER, and Possible Remedies," *Optical Microlithography XVIII*, Bruce W. Smith, Editor, *Proc., of SPIE*, vol. 5754, pp. 274-284 (SPIE, Bellingham, WA 2005).

Uppal, et al., "Performance of a General Asymmetric Unstable Nd: Glass Ring Laser", *Applied Optics*, Vo. 25, No. 1, pp. 97-101 (Jan. 1986).

Yamaguchi, et al., "Impact of Long-Period Line-Edge Roughness (LER) on accuracy in CD Measurement," edited by Richard M. Silver, *Proc. Of SPIE*, vol. 5752, (SPIE, Bellingham, WA 2005).

"Ti-Sapphire Laser," found at http://en.wikipedia.org/wiki/Ti-sapphire_laser.

"Second Harmonic Generation," found at http://en.wikipedia.org/wiki/Second_harmonic_genertation.

"Acousto-Optics Introduce Phase Shift," found at http://laserfocusworldcom/articles.

* cited by examiner

- ■—■ 598: CORRELATION
- ▨—▨ 594: NORMALIZED STANDARD DEVIATION
- ▢—▢ 596: EQUIVALENT INDEPENDENT PULSES

■—■ BLACK: CROSS-CORRELATION

Potential Interactions

LASER SYSTEM

CROSS-REFERENCE TO RELATED APPLICATIONS

The present application is a Continuation-in-Part of U.S. patent application Ser. No. 11/787,180, filed on Apr. 13, 2007, entitled LASER SYSTEM, which was a Continuation-in-Part of U.S. patent application Ser. No. 11/584,792, filed on Oct. 20, 2006 now abandoned, entitled LASER SYSTEM, which claimed priority to U.S. Provisional Application Ser. No. 60/732,688 filed on Nov. 1, 2005, entitled 200 W GAS DISCHARGE EXCIMER OR MOLECULAR FLUORINE MULTICHAMBER LASER, and to Ser. No. 60/814,293 filed on Jun. 16, 2006, entitled 200 WATT DUV GAS DISCHARGE LASER SYSTEM, and to Ser. No. 60/814,424, filed on Jun. 16, 2006, entitled LONG LIVED MO IN MOPO CONFIGURED LASER SYSTEM, and was a Continuation-in-Part of U.S. patent application Ser. Nos. 11/521,904, filed on the Sep. 14, 2006 now abandoned, entitled LASER SYSTEM, and 11/522,052, filed on Sep. 14, 2006 now abandoned, entitled LASER SYSTEM, and 11/521,833, filed on Sep. 14, 2006 now abandoned, entitled LASER SYSTEM, and 11/521,860, filed on Sep. 14, 2006 now abandoned, entitled LASER SYSTEM, and 11/521,834, filed on Sep. 14, 2006 now abandoned, entitled LASER SYSTEM, and 11/521,906, filed on Sep. 14, 2006 now abandoned, entitled LASER SYSTEM, and 11/521,858, filed on Sep. 14, 2006 now abandoned, entitled LASER SYSTEM, and 11/521,835, filed on Sep. 14, 2006 now abandoned, entitled LASER SYSTEM, and 11/521,905, entitled LASER SYSTEM, filed Sep. 14, 2006 now abandoned, the disclosures of each of which are hereby incorporated by reference.

The present application is related to U.S. patent application Ser. No. 11/447,380, entitled DEVICE AND METHOD TO STABILIZE BEAM SHAPE AND SYMMETRY FOR HIGH ENERGY PULSED LASER APPLICATIONS, filed on Jun. 5, 2006, and is related to U.S. patent application Ser. No. 10/881,533, entitled METHOD AND APPARATUS FOR GAS DISCHARGE LASER OUTPUT LIGHT COHERENCY REDUCTION, filed on Jun. 29, 2004, and published on Dec. 29, 2005, Pub. No. 20050286599, the disclosures of which are hereby incorporated by reference. The present application is also related to U.S. Pat. Nos. 6,549,551, issued on Apr. 15, 2003, to Ness et al, entitled INJECTION SEEDED LASER WITH PRECISE TIMING CONTROL; and 6,567,450, issued on May 20, 2003, to Myers et al, entitled VERY NARROW BAND TWO CHAMBER HIGH REP RATE GAS DISCHARGE LASER SYSTEM; and 6,625,191, entitled VERY NARROW BAND TWO CHAMBER HIGH REP RATE GAS DISCHARGE LASER SYSTEM, issued on Sep. 23, 2003 to Knowles et al; and 6,865,210, issued on Mar. 8, 2005, to Ershov et al, entitled TIMING CONTROL FOR TWO CHAMBERED GAS DISCHARGE LASER SYSTEM; and 6,690,704, entitled CONTROL SYSTEM FOR TWO CHAMBER GAS DISCHARGE LASER SYSTEM, issued on Feb. 10, 2004 to Fallon et al; and 6561263, issued on May 6, 2003, to Morton et al., entitled DISCHARGE LASER HAVING ELECTRODES WITH SPUTTER CAVITIES AND DISCHARGE PEAKS; and U.S. Pat. No. 6,928,093, entitled LONG DELAY AND HIGH TIS PULSE STRETCHER, issued to Webb et al. on Aug. 9, 2005; the present application is also related to co-pending U.S. patent application Ser. No. 10/781,251, filed on Feb. 18, 2004, entitled VERY HIGH ENERGY, HIGH STABILITY GAS DISCHARGE LASER SURFACE TREATMENT SYSTEM, and Ser. No. 10/884,547, filed on Jul. 1, 2004, entitled LASER THIN FILM POLY-SILICON ANNEALING SYSTEM, published on Jun. 30, 2005, Pub. No. US-2005-0141580; and Ser. No. 11/173,988, entitled ACTIVE BANDWIDTH CONTROL FOR A LASER, filed on Jun. 30, 2005, and to Ser. No. 11/169,203, entitled HIGH PULSE REPETITION RATE GAS DISCHARGE LASER, filed on Jun. 27, 2005, and to Ser. No. 11/095,293, entitled GAS DISCHARGE LASER OUTPUT LIGHT BEAM PARAMETER CONTROL, filed on Mar. 31, 2005, and Ser. No. 11/095,976, entitled 6 KHZ AND ABOVE GAS DISCHARGE LASER SYSTEM, filed on Mar. 31, 2005; and Ser. No. 11/201,877, filed on Aug. 11, 2005, entitled LASER THIN FILM POLYSILICON ANNEALING OPTICAL SYSTEM, Published on Dec. 8, 2005, Pub. No. US-2005-0269300; and Ser. No. 11/254,282, entitled METHOD AND APPARATUS FOR GAS DISCHARGE LASER BANDWIDTH AND CENTER WAVELENGTH CONTROL, and Ser. No. 11/346,519, filed on Feb. 1, 2006, entitled, VERY NARROW BAND, TWO CHAMBER, HIGH REP RATE GAS DISCHARGE LASER SYSTEM, and Ser. No. 11/323,604, filed on Dec. 29, 2005, entitled MULTI-CHAMBER GAS DISCHARGE LASER BANDWIDTH CONTROL THROUGH DISCHARGE TIMING; and Ser. No. 11/363,116, entitled VERY HIGH REPETITION RATE NARROW BAND GAS DISCHARGE LASER SYSTEM, filed on Feb. 27, 2006, and Ser. No. 10/881,533, entitled METHOD AND APPARATUS FOR GAS DISCHARGE LASER OUTPUT LIGHT COHERENCY REDUCTION, filed on Jun. 30, 2004, and Ser. No. 10/847,799, entitled LASER OUTPUT LIGHT PULSE STRETCHER, filed on May 18, 2004, and U.S. patent application Ser. No. 11/394,512, entitled CONFOCAL PULSE STRETCHER, filed on Mar. 31, 2006, the disclosures of each of which are incorporated herein by reference.

FIELD OF THE DISCLOSED SUBJECT MATTER

The subject matter disclosed is related to high power gas discharge laser systems for DUV light sources, e.g., used in integrated circuit photolithography, e.g., in highly line narrowed versions, e.g., for immersion lithography and other lithography uses requiring high power and/or requiring longer component life in lower power applications, or broad band versions used for treatment of material on a workpiece substrate, e.g., laser annealing for low temperature poly-silicon processing ("LTPS"), such as thin beam sequential lateral solidification ("tbSLS"), and more particularly to a seed laser and amplification gain medium system with an improved power amplification stage providing higher gain and reduced ASE and coherency busting, e.g., for reduction in speckle.

BACKGROUND

Laser systems such as applicants' assignee's laser systems, e.g., 7XXX and XLA-1XX, XLA-2XX and XLA-3XX model laser systems, with the 7XXX, being single chamber laser systems, e.g., ArF or KrF excimer laser systems, and the XLA models being multi-chamber laser systems, e.g., master oscillator-power amplifier ("MOPA") configured laser systems, e.g., excimer MOPAs, may be used for such applications as above noted, e.g., laser annealing of materials on a workpiece substrate and as integrated circuit photolithography DUV light sources. The latter of which systems currently operating at 6 kHz and can produce about 60-90 watts delivered to, e.g., a photolithography tool in a burst of hundreds of pulses with about 10-15 mJ per pulse. This operation is relatively close to maximum due, e.g., to high pulse energy and concomitant optical damage problems. Also limitations exist such as in the form of fan size and speed needed to circulate the gas in the lasing chamber(s).

In order to preserve the endless march of Moore's law and with practical and economical EUV light source production perhaps not arriving quite on time, the photolithography tool makers have turned to a technology known as immersion lithography, whereby a fluid is interposed between the wafer and the mask/retical and projection lens assembly.

While much of the photolithography tool may still be utilized for immersion techniques, the DUV 193 nm light source will need to be significantly changed, in order to meet higher throughput requirements, and also for beam stability reasons (bandwidth, dose, center wavelength, etc.).

A further motivation for implementing a very high average power, e.g., 100 W, laser system, e.g., as an XLA laser system or other power amplification stage, is that further advances in lithographic resolution can be achieved through a "double exposure" technique. Scanner makers will no doubt want to produce a stepper that can provide double exposure with no loss in wafer throughput. Thus, wafer stage speed (scan speed) would also have to increase by approximately 2×. Thus, the laser average power must also increase by around 2× or perhaps even more to maintain throughput.

It is also possible that improved performance in the optics, e.g., with the application of optical coatings and/or angle of incidence changes could be used to increase the overall laser system output, although studies by applicants' employer have indicated that there is not enough margin there to get to the required overall output energy levels and/or certain optics could not safely be modified in the effort. Thus this is not currently an available option because as currently perceived a relatively small percentage change in overall output energy is obtainable by this route alone, i.e., somewhere between ten to twenty percent.

Various assumptions and constraints may be applicable regarding illuminator component lifetimes and capabilities and the like which result in the conclusion that for a 6 kHz×33 mJ solution, pulse duration must increase by a factor of 4, and for a 12 kHz×17 mJ solution, pulse duration must increase by a factor of 2. Also, since the same degree of high polarization will be required from the laser light source, one can not use polarization coupling to combine separate laser beams to form a laser system output light pulse beam input to the scanner (though polarization coupling may be used elsewhere) and a 2× increase in power density through various components will cause increased depolarization. Whether or not the scanner (e.g., in the illuminator) can accommodate a change in laser beam size is also an issue. Some scanners may also not be able to accommodate a laser light source in the form of two input beams, e.g., as side-by-side laser beams with, e.g., interleaved pulsing. Applicants assume that laser spectral requirements will remain the same as for the equivalent lens used in single exposure systems.

One possible solution to the requirements noted above, a single XLA running at 6 kHz and with a 20-30 mJ pulse energy output from the power amplifier, has a number of problems in the effective implementation, not the least of which is the difficulties in getting to 6 kHz operation in an excimer seed to excimer amplifier gain medium multi-chamber laser system arrangement, for which applicants' assignee has proposed certain design approaches discussed in one or more co-pending applications noted above. In addition, the most likely deterrent to such an approach is unacceptably high energy density on certain critical optical elements in the XLA system at 20-30 mJ output pulse energy. Alternatively one could try to implement a single MOPA XLA operating at 12 kHz with a 17 mJ output pulse energy from the power amplifier, however, getting to 12 kHz poses a number of problems, e.g., an approximately 8× increase in chamber blower power, significantly accentuated chamber acoustic impacts on output pulse parameters, and difficulties in maintaining chamber robustness at high voltage with such a high repetition rate. Similarly, a single MOPO XLA (with a power oscillator in place of the power amplifier) operating at 12 kHz with a 17 mJ output pulse energy from the amplifier would face much the same detrimental impacts to effective operation. A Single MOPA XLA tic-toc (e.g., a master oscillator—single aperture—seeding a plurality of amplifiers—multiple apertures—and recombined back to a single output—single aperture) with excimer seed operating the MO at 12 kHz and each amplifier gain medium operating at 6 kHz with each having 17 mJ output pulse energy would suffer from the same problems, however, only in the MO. A single MOPA XLA tic-toc with solid state seed operating at 12 kHz (tic-toc to 2 multi-pass PA's at 6 kHz each, 17 mJ output pulse energy from each) is a possibility, however, this would require a high average power solid state seed laser, e.g., with about a 12 W average power output, which is not currently available. Two "standard" six kHz XLAs could be used side by side to tic-toc a total of a 12 kHz of 17 mJ output pulse energy laser pulses, if acceptable from a cost standpoint for very high power (around 200 W) lithography laser light sources, e.g., for immersion lithography. Cost of consumables may be acceptable, e.g., for each individual laser system, but the overall cost of operation of the entire system essentially doubles. Other problems need also be addressed, however the above noted are what applicants currently believe to be the "show stoppers" to the various noted configurations meeting the requirements for performance and cost of operation for very high power laser operations, e.g., for immersion lithography laser light sources.

Applicants' employer's competitor GigaPhoton has utilized multi-chamber seed laser/amplifier laser systems in a master oscillator power oscillator configuration, as shown, e.g., in U.S. Pat. Nos. 6,721,344, entitled INJECTION LOCKING TYPE OR MOPA TYPE OF LASER DEVICE, issued on Apr. 13, 2004 to Nakao et al; 6,741,627, entitled PHOTOLITHOGRAPHIC MOLECULAR FLUORINE LASER SYSTEM, issued on May 25, 2004 to Kitatochi et al, and 6,839,373, entitled ULTRA-NARROWBAND FLUORINE LASER APPARATUS, issued on Jan. 4, 2005 to Takehisha et al. However, not without certain problems not faced by a power amplifier (i.e., a fixed amplification path—one or more passes—through the amplification medium as opposed to laser oscillation). These may include, e.g., two critical challenges in the application of the injection locking method, e.g., to lithography. They are related to ASE and coherence.

Fork, et al. Amplification of femtosecond optical pulses using a double confocal resonator, Optical Letters, Vol. 14, No. 19 (October 1989) refers to a multipass power amplifier. U.S. Pat. Nos. 6,816,520, entitled SOLID STATE SYSTEM AND METHOD FOR GENERATING ULTRAVIOLET LIGHT, issued on Nov. 9, 2004 to Tolloch et al., relates to mixing schemes for 193 nm light generation with a solid state seed to an excimer laser; U.S. Pat. Nos. 6,373,869, entitled SYSTEM AND METHOD FOR GENERATING COHERENT RADIATION AT VACUUM ULTRAVIOLET WAVELENGTHS USING EFFICIENT FOUR WAVE MIXING, issued to Jacob on Apr. 16, 2002, relates to mixing schemes for 193 nm light generation. US Published Patent Application, Pub. No. US20050185683A1 relates to frequency shifting to get 193 nm light. U.S. Pat. No. 5,233,460, entitled METHOD AND MEANS FOR REDUCING SPECKLE IN COHERENT LASER PULSES, issued to Partlo et al. on Aug. 3, 1993 discusses misaligned optical delay paths for coherence busting on the output of gas discharge laser systems such as excimer laser systems. U.S. Pat. No. 6,191,887, entitled LASER ILLUMINATION WITH SPECKLE REDUCTION, issued to Michaloski et al. on Feb. 20, 2001, relates to coherence busting for speckle reduction in a multiple delay path pulse stretcher. U.S. Pat. No. 5,940,418, entitled SOLID-STATE LASER SYSTEM FOR ULTRA-VIOLET MICROLITHOGRAPHY, issued to Shields on Aug. 17, 1999 relates to MOPO/PA configurations where a solid sate laser is the MO for a solid state laser PO or PA but refers to an article as describing the production of 193 nm light using an excimer laser, a dye laser and a birefringent BBO crystal for frequency multiplication harmonic generation, Muckenheim et al., "Attaining the wavelength Range 189-197 by frequency mixing in B-BaB$_2$O$_4$," Appl. Phys. B 45 (1988), pp. 259-261. U.S. Pat. No. 6,031,854, entitled DIODE PUMPED CASCADE LASER FOR DEEP UV GENERATION, issued to Ming on Feb. 29, 2000 relates to a solid state cascade laser in which the output of a diode pumped solid state laser is used to pump another solid state laser to produce DUV light; U.S. Pat. No. 6,320,886, entitled LASER DEVICE, issued to Dawber on Nov. 20, 2001 relates to a solid state optical parametric generator ("OPG") that is pumped by light produced by a pump source 4 that is disclosed also to be a solid state laser, and where the OPG is in a resonance cavity. U.S. Pat. No. 6,477,188, entitled LIGHT SOURCE, issued to Takaoka on Nov. 5, 2002, relates to solid state lasers seeding and/or pumping other solid state lasers or OPGs or OPOs. U.S. Pat. No. 6,590,698, entitled ULTRAVIOLET LASER APPARATUS AND EXPOSURE APPARATUS USING SAME, issued to Ohtsuki on Jul. 8, 2003, relates to a solid state feed of a seed into distributed fiber-optic amplifiers. U.S. Pat. No. 6,654,163, entitled OPTICAL AMPLIFIER ARRANGEMENT FOR SOLID STATE LASER, issued to Du on Nov. 25, 2003, relates to an amplifier gain medium that can be a gas discharge or solid state laser seeded from an undisclosed type of laser. U.S. Pat. No. 6,721,344, entitled INJECTION LOCKING TYPE OR MOPA TYPE OF LASER DEVICE, issued to Nakao et al. on Apr. 13, 2004 discloses an F$_2$ gas discharge laser in a MOPA or MOPO configuration with a gas discharge master oscillator seeding a gas discharge amplifier. U.S. Pat. No. 4,982,406, entitled SELF INJECTION-LOCKING LASER TECHNIQUE, issued to Facklam on Jan. 1, 1999, relates to a laser system that has so-called "self-injection locking" and appears to disclose a number of prior art systems, that inject a seed beam into an amplifier laser. U.S. Pat. No. 4,019,157, entitled METHOD AND APPARATUS FOR TUNING HIGH POWER LASERS, issued to Hutchinson on Apr. 19, 1977, relates to a pulsed gas laser (CO$_2$) seeded with a CW laser beam from a seed laser disclosed to be a CW CO$_2$ laser. U.S. Pat. No. 4,227,159, entitled COMMON-RESONATOR PRE-LOCKED LASER, issued to Barrett on Oct. 10, 1980 relates to a dye laser simultaneously pumped in a resonator cavity by an argon ion laser and a solid state Nd:YAG frequency doubled laser. U.S. Pat. No. 4,019, 157, entitled METHOD AND APPARATUS FOR TUNING HIGH POWER LASERS, issued to Hutchinson on Apr. 19, 1977, relates to high power gas lasers which are seeded by a beam from a low power laser. U.S. Pat. No. 4,264,870, entitled AUTOMATIC LOCKING SYSTEM FOR AN INJECTION LOCKED LASER, issued to Avicola on Apr. 28, 1981, relates to an injection locked oscillator which is an optically pumped dye laser that is provided with a seed laser pulse from a "master oscillator" but this MO actually acts to create a population inversion in the ILO cavity at a wavelength selected by the wavelength of the master oscillator pulse prior to stimulated emission lasing in the ILO resulting from the pumping of the ILO flash lamp. U.S. Pat. No. 4,490, 823, entitled INJECTION-LOCKED UNSTABLE LASER, issued to Komine on Dec. 25, 1984, relates to a laser system that has an optical switch to form the cavity first to include line narrowing in a stable resonator and thereafter to switch to an unstable resonator with the line narrowing package not in the cavity any longer. U.S. Pat. No. 4,606,034, entitled ENHANCED LASER POWER OUTPUT, issued to Eden et al. on Aug. 12, 1986, relates to population inversion created by a "seed" pulse before stimulated emission is caused in the amplifier by the amplifier being pumped. U.S. Pat. No. 4,689, 794, entitled INJECTION-LOCKING A XENON CHLORIDE LASER AT 308.4 NM, issued to Brosman on Aug. 25, 1987, relates to an injection locked excimer gas discharge laser system, e.g., a XeCl laser which either uses line narrowing or an injection of a low level amount of radiation into the cavity to essentially do preionization so the gain achieved by the main pumping need not be so high.

Partlo et al, Diffuser speckle model: application to multiple moving diffusers, Appl. Opt. 32, 3009-3014 (1993), discusses speckle reduction techniques.

Ti:sapphire (Titanium-sapphire) lasers emit near-infrared light, tunable in the range from 650 to 1100 nanometers. These lasers are tunable and can generate ultrashort pulses. Titanium-sapphire refers to the lasing medium, a crystal of sapphire ($Al_2O_3$) that is doped with titanium ions. A Ti:sapphire laser is usually pumped with another laser with a wavelength of 514 to 532 nm, for which argon lasers (514.5 nm) and frequency-doubled Nd:YAG, Nd:YLF, and Nd:YVO lasers (527-532 nm) may be used as discussed at http://en.wikipedia.org/wiki/Ti-sapphire_laser Second harmonic generation (SHG, also called frequency doubling) is a nonlinear optical process, in which photons, e.g., at a given wavelength, interacting with a nonlinear material are effectively "combined" to form new photons with twice the energy, and therefore twice the frequency and half the wavelength of the initial photons. Only under special circumstances, the rate of conversion of photons to the higher-energy photons is significant. The two fundamental requirements for efficient nonlinear power conversion are that the pump intensity is high over a certain propagation length, and that the involved beams preserve a certain phase relationship over that length. Under properly optimized conditions, it is possible to obtain more than 50% conversion efficiency (sometimes even more than 80%) by focussing an intense laser beam into a suitable nonlinear crystal. This is widely used, for example to generate green light at 532 nm from the near infrared output of a Nd:YAG laser at 1064 nm. Some common materials used for second harmonic generation are potassium titanyl phosphate (KTP), lithium triborate (LBO), cesium lithium borate (CLBO), lithium tantalate, and lithium niobate.

As mentioned above, a high conversion efficiency requires that the input light and the second harmonic light are kept in phase. This is not the case without special measures, because the speed of light in a material generally varies with wavelength due to dispersion of the index of refraction. In some nonlinear crystals, a particular combination of crystal orientation and crystal temperature can be found where, due to birefringence, the fundamental and second harmonic light both see the same index of refraction, and so remain in phase as they propagate. In other nonlinear materials, where this is not possible, periodic poling is used to keep the waves approximately in phase. This technique, called quasi-phase matching, is commonly used for lithium niobate and lithium tantalate, and greatly expands the options for efficient frequency doubling at various wavelengths and temperatures. http://en.wikipedia.org/wiki/Second_harmonic_generation.

Acousto-optic ("AO") crystals are often used in optical systems to modulate, frequency shift, or diffract a laser beam. In the case of frequency shifting, the beam interacts with an acoustic wave that moves inside the crystal, Bragg-reflecting from the wave. The frequency of the reflected beam is the sum of the frequency of the original beam and the frequency of the acoustic wave. Depending on its direction of motion, the acoustic wave can contribute either a positive or negative frequency component. In an AO phase shifter, the beam to be phase shifted reflects first from one AO crystal that adds a radio-frequency (RF) component, then from a second AO crystal that subtracts an RF component of the same magnitude, restoring the beam's original frequency. The phase delays between the two RF signals can be varied, adding a controllable phase shift to the beam, as is discussed at http://lfw.pennnet.com/Articles/Article_Display.cfm?Section=ARTCL&ARTICLE_ID=221417&VERSION_NUM=3&p=12

Published International Application WO 97/08792, published on Mar. 6, 1997 discloses an amplifier with an intracavity optical system that has an optical path that passes each pass of a sixteen pass path through the same intersection point at which is directed a pumping source to amplify the light passing through the intersection point.

R. Paschotta, Regenerative Amplifiers, found at http://www.rp-photonics.com/regenerative_amplifiers.html (2006) discusses the fact that a regenerative amplifier, may be considered to be an optical amplifier with a laser cavity in which pulses do a certain number of round trips, e.g., in order to achieve strong amplification of short optical pulses. Multiple passes through the gain medium, e.g., a solid state or gaseous lasing medium may be achieved, e.g., by placing the gain medium in an optical cavity, together with an optical switch, e.g., an electro-optic modulator and/or a polarizer. The gain medium may be pumped for some time, so that it accumulates some energy, after which an initial pulse may be injected into the cavity through a port which is opened for a short time (shorter than the round-trip time), e.g., with the electro-optic (or sometimes acousto-optic) switch. Thereafter the pulse can undergo many (possibly hundreds) of cavity round trips, being amplified to a high energy level, often referred to as oscillation. The electro-optic switch can then be used again to release the pulse from the cavity.

Alternatively, the number of oscillations may be determined by using a partially reflective output coupler that reflects some portion, e.g., around 10%-20% of the light generated in the cavity back into the cavity until the amount of light generated by stimulated emission in the lasing medium is such that a useful pulse of energy passes through the output coupler during each respective initiation and maintenance of an excited medium, e.g., in a pulsed laser system.

Uppal et al, Performance of a general asymmetric Nd: glass ring laser, Applied Optics, Vol. 25, No. 1 (January 1986) discusses an Nd:glass ring laser. Fork, et al. Amplification of femptosecond optical pulses using a double confocal resonator, Optical Letters, Vol. 14, No. 19 (October 1989) discloses a seed laser/power amplifier system with multiple passes through a gain medium in a ring configuration, which Fork et al. indicates can be "converted into a closed regenerative multi pass amplifier by small reorientations of two of the four mirrors that compose the resonator [and providing] additional means . . . for introducing and extracting the pulse from the closed regenerator". This reference refers to an open-ended amplifier portion with fixed number of passes through the amplifier portion (fixed by the optics and, e.g., how long it takes for the beam to walk off of the lens and exit the amplifier portion) as a "resonator".

Mitsubishi published Japanese Patent Application Ser. No. JP11-025890, filed on Feb. 3, 1999, published on Aug. 11, 2000, Publication No. 2000223408, entitled SEMICONDUCTOR MANUFACTURING DEVICE, AND MANUFACTURING OF SEMICONDUCTOR DEVICE, discloses a solid state seed laser and an injection locked power amplifier with a phase delay homogenizer, e.g., a grism or grism-like optic, between the master oscillator and amplifier. United States Published application 20060171439, published on Aug. 3, 2006, entitled MASTER OSCILLATOR—POWER AMPLIFIER EXCIMER LASER SYSTEM, a divisional of an earlier published application 20040202220, discloses as master oscillator/power amplifier laser system with an optical delay path intermediate the master oscillator and power amplifier which creates extended pulses from the input pulses with overlapping daughter pulses.

As used herein the term resonator and other related terms, e.g., cavity, oscillation, output coupler are used to refer, specifically to either a master oscillator or amplifier portion, a power oscillator, as lasing that occurs by oscillation within the cavity until sufficient pulse intensity exists for a useful pulse to emerge from the partially reflective output coupler as a laser output pulse. This depends on the optical properties of the laser cavity, e.g., the size of the cavity and the reflectivity of the output coupler and not simply on the number of reflections that direct the seed laser input through the gain medium a fixed number of times, e.g., a one pass, two pass, etc. power amplifier, or six or so times in the embodiment disclosed in Fork, et al. Amplification of femtosecond optical pulses using a double confocal resonator, Optical Letters, Vol. 14, No. 19 (October 1989) and not on the operation of some optical switch in the cavity. In some of the literature an oscillator in which the round trip through the amplification gain medium, e.g., around a loop in a bow-tie or racetrack loop, is not an integer number of wavelengths, may be referred to as an amplifier, e.g., a power amplifier, while also constituting an oscillator laser. The term power amplification stage and more specifically ring power amplification stage is intended herein to cover both of these versions of a power oscillator, i.e., whether the path through the gain medium is an integer multiple of the laser system nominal center wavelength or not and whether the literature, or some of it, would refer to such an "oscillator" as a power amplifier or not. The closed loop path or oscillation loop as used herein refers to the path through the amplification gain medium, e.g., an excimer or similar gas discharge laser amplification stage, around which the seed laser pulse light oscillates in the amplification stage.

$Yb^{3+}$ fiber lasers are inherently tunable, as discussed in J Nilsson et al "High-power wavelength-tunable cladding-pumped rare-earth-doped silica fiber lasers," Opt. Fiber Technol. 10, pp 5-30 (2004).

SUMMARY

An apparatus and method are disclosed which may comprise a line narrowed pulsed lithography laser light source which may comprise: a seed pulse providing laser system which may comprise: a first pulsed seed laser producing seed pulses at a rate of X kHz; a second pulsed seed laser producing seed pulses at a rate of X kHz; an amplification system which may comprise: a first amplifier gain system which may comprise a first and a second pulsed gas discharge amplifier gain medium, each with a nominal center wavelength in the UV range, and each operating at ½ X kHz on output pulses from the first seed laser; a second amplifier gain system which may comprise a first and a second pulsed amplifier gain medium, each with a nominal center wavelength in the UV range, and each operating at ½ X kHz on output pulses from the second seed laser; a first and a second line narrowing module each selecting a desired bandwidth for, respectively, the first and second seed laser; a pulse combiner combining the output pulses from the first and second amplifier gain systems to produce an output laser light pulse beam at a pulse repetition rate of 2× kHz. The first and second pulsed seed laser systems each may comprise a gas discharge laser, e.g., a single seed with a single aperture or a plurality of seeds with a plurality of apertures may seed a plurality of amplifiers or a plurality of groups of amplifiers constituting many apertures and with the output all combined through a single aperture output. The system and method may comprise a seed laser output beam divider providing output pulses of the first pulsed seed laser to the respective first amplifier gain medium and second amplifier gain medium of the first amplifier gain system and a second seed laser output beam divider providing output pulses of the second pulsed seed laser respectively to the first amplifier gain medium and the second amplifier gain medium of the second amplifier gain system. Each pulsed amplifier gain medium may comprise a gas discharge laser system. X kHz may be at least 4 kHz. Each respective amplifier gain medium may comprise a ring power amplification stage. The apparatus and method may comprise a narrow band pulsed lithography laser light source which may comprise: a seed pulse providing laser system which may comprise a single pulsed solid state seed laser with a nominal center wavelength outside of the UV range and operating at 2X kHz; an amplification system which may comprise: a first amplifier gain system which may comprise a first and a second pulsed gas discharge amplifier gain medium, each with a nominal center wavelength in the UV range, and each operating at ½ X kHz on output pulses from the first seed laser system; a second amplifier gain system which may comprise a first and a second pulsed amplifier gain medium, each with a nominal center wavelength in the UV range, and each operating at ½ X kHz on output pulses from the second seed laser system; a seed pulse divider providing pulses from the solid state seed laser to a first amplifier gain system pulse divider and to a second amplifier gain system pulse divider, the first amplifier gain system pulse divider providing pulses to the first and second pulsed amplifier gain medium of the first amplifier gain system and the second amplifier gain system pulse divider providing pulses to the first and second amplifier gain medium of the second amplifier gain system; a pulse combiner combining the output pulses from the first and second amplifier gain systems to produce a light source output laser light pulse beam at a pulse repetition rate of 2X kHz. The apparatus and method may comprise a frequency converter converting the wavelength of the output of the seed laser to a UV wavelength suitable for amplification in the amplifier gain medium. Each pulsed amplifier gain medium may comprise a gas discharge laser system. X kHz may be at least 6 kHz. Each respective amplifier gain medium may comprise a ring power amplification stage. The apparatus and method may comprise a line narrowed pulsed lithography laser light source which may comprise: a first pulsed seed laser system producing seed pulses at a rate of X kHz; a second pulsed seed laser system producing seed pulses at a rate of X kHz, an nth pulsed seed laser system producing seed pulses at a rate of X kHz; a first amplifier gain system which may comprise A amplifier gain mediums each with a nominal center wavelength in the UV range, and each operating at $(1/A)*X$ kHz on respective Ath output pulses from the first seed laser system; a second amplifier gain system which may comprise A pulsed amplifier gain mediums, each with a nominal center wavelength in the UV range, and each operating at $(1/A)*X$ kHz on respective Ath output pulses from the second seed laser system; an nth amplifier gain system comprising A pulsed amplifier gain mediums, each with a nominal center wavelength in the UV range, and each operating at $(1/A)*X$ kHz on respective Ath output pulses from the nth seed laser system; n line narrowing modules each selecting a desired bandwidth for, respectively, the first through nth seed laser system; a pulse combiner combining the output pulses from the n amplifier gain systems to produce an output laser light pulse beam at a pulse repetition rate of nX kHz. Each pulsed seed laser system may comprise a gas discharge laser with a nominal center wavelength essentially the same as the nominal center wavelength of the respective amplifier gain medium. The apparatus and method may comprise a seed laser beam divider providing output pulses of a respective pulsed seed laser to one of n amplifier gain system beam dividers; the respective n amplifier gain system beam divider providing each Ath pulse to a respective one of the A amplifier gain mediums in the respective amplifier gain system. Each pulsed amplifier gain medium may comprise a gas discharge laser system. X kHz is at least 4 kHz. Each respective amplifier gain medium may comprise a ring power amplification stage. The apparatus and method may comprise a line narrowed pulsed lithography laser light source which may comprise: a first pulsed solid state seed laser system producing seed pulses at a rate of X kHz; a second pulsed solid state seed laser system producing seed pulses at a rate of X kHz, an nth pulsed solid state seed laser system producing seed pulses at a rate of X kHz; a first amplifier gain system comprising A pulsed gas discharge amplifier gain mediums, each with a nominal center wavelength in the UV range, and each operating at $(1/A)*X$ kHz on respective Ath output pulses from the first seed laser system; a second amplifier gain system comprising A pulsed amplifier gain mediums, each with a nominal center wavelength in the UV range, and each operating at $(1/A)*X$ kHz on respective Ath output pulses from the second seed laser system; an nth amplifier gain system comprising A pulsed amplifier gain mediums, each with a nominal center wavelength in the UV range, and each operating at $(1/A)*X$ kHz on respective Ath output pulses from the nth seed laser system; a pulse combiner combining the output pulses from the amplifier gain systems to produce an output laser light source pulse beam at a pulse repetition rate of nX kHz. The apparatus and method may comprise a seed laser beam divider providing output pulses of the respective pulsed seed laser to each of the A amplifier gain mediums in the respective nth amplifier gain system. Each pulsed amplifier gain medium may comprise a gas discharge laser system. X kHz may be at least 6 kHz. Each respective amplifier gain medium may comprise a ring power amplification stage. The apparatus and method may comprise a broad band pulsed laser light source which may comprise a first pulsed seed laser system producing seed pulses at a rate of X kHz; a second pulsed seed laser system producing seed pulses at a rate of X kHz; an nth pulsed seed laser system producing seed pulses at a rate of X kHz; a first amplifier gain system comprising A pulsed gas discharge amplifier gain mediums, each with a nominal center wavelength in the UV range, and each operating at $(1/A)*X$ kHz on respective Ath output pulses from the first seed laser system; a second amplifier gain system comprising A pulsed amplifier gain mediums, each with a nominal center wavelength in the UV range, and each operating at $(1/A)*X$ kHz on respective Ath output pulses from the second seed laser system; an nth amplifier gain system comprising A pulsed amplifier gain mediums, each with a nominal center wavelength in the UV range, and each operating at (1/A)*X kHz on respective Ath output pulses from the nth seed laser system; a pulse combiner combining the output pulses from the amplifier gain systems to produce an output laser light pulse beam at a pulse repetition rate of nX kHz. The pulsed seed laser systems may comprise a gas discharge laser with a nominal center wavelength essentially the same as the nominal center wavelength of the amplifier gain medium. The apparatus and method may comprise a seed laser beam divider providing output pulses of the pulsed seed laser to a respective one of the n amplifier gain system beam dividers; the respective nth amplifier gain system beam divider providing each Ath pulse to a respective one of the A amplifier gain mediums in the respective amplifier gain system. Each pulsed amplifier gain medium may comprise a gas discharge laser system. X kHz may be at least 6 kHz. Each respective amplifier gain medium may comprise a ring power amplification stage. The apparatus and method may comprise a line narrowed pulsed lithography laser light source which may comprise: a narrow band seed pulse providing laser system which may comprise a pulsed seed laser system producing a beam of seed pulses with a bandwidth of ≦0.2 pm FWHM or ≦0.5 pm E95%, at a rate of X kHz; a beam splitter receiving the output of the seed laser system and providing a split output of every pulse from the pulse splitter; an amplifier gain system comprising a first gas discharge amplifier gain medium and operating at Y kHz on respective outputs from the pulse splitter and a second gas discharge amplifier gain medium operating at Z kHz on respective outputs from the pulse splitter, where Y+Z=X; a pulse combiner combining the output pulses from the first and second amplifier gain systems to produce an output laser light pulse beam at a pulse repetition rate of X kHz. The apparatus and method may comprise a plurality of N light sources; a pulse combiner providing an output of line narrowed laser pulses at a pulse repetition rate of NX. The seed pulse providing system may comprise a solid state laser, e.g., a fiber laser, e.g., selected from a group comprising Nd-based, Er-based and Yb-based solid state lasers, or a gas discharge laser and a line narrowing module. The beam splitter may comprise a geometric beam splitter transmitting at least one spatial portion of the pulse beam on one path and at least a second portion of the pulse beam on a second path. The beam splitter may comprise a partially reflective optic reflecting a portion of each pulse in the pulse beam on one path and transmitting a portion of each pulse in the pulse beam on a second path. The beam splitter may comprise a stimulated optical path modulator directing a first portion of a pulse in the pulse beam in a first path during a first time period and a second portion of a pulse on a second path during a second time period, or directing separate pulses on respective ones of a plurality of separate path in respective time periods. The gas discharge amplifier gain medium may comprise a power amplifier. Each gas discharge amplification gain medium may comprise a power oscillator. The apparatus and method may comprise: the pulse combiner comprising a beam combining optical element forming a laser light source output beam comprising a first spatially defined component from the first amplifier gain medium and a second spatially defined component from the second amplifier gain medium. The pulse combiner may comprise a beam combining optical element forming a laser light source output beam comprising a first component from the first amplifier gain medium and a second component from the second amplifier gain medium exiting the pulse combiner along a path comprising a single optical axis. The pulse combiner may comprise comprising an OPuS pulse stretcher.

DETAILED DESCRIPTION

Figure 1:
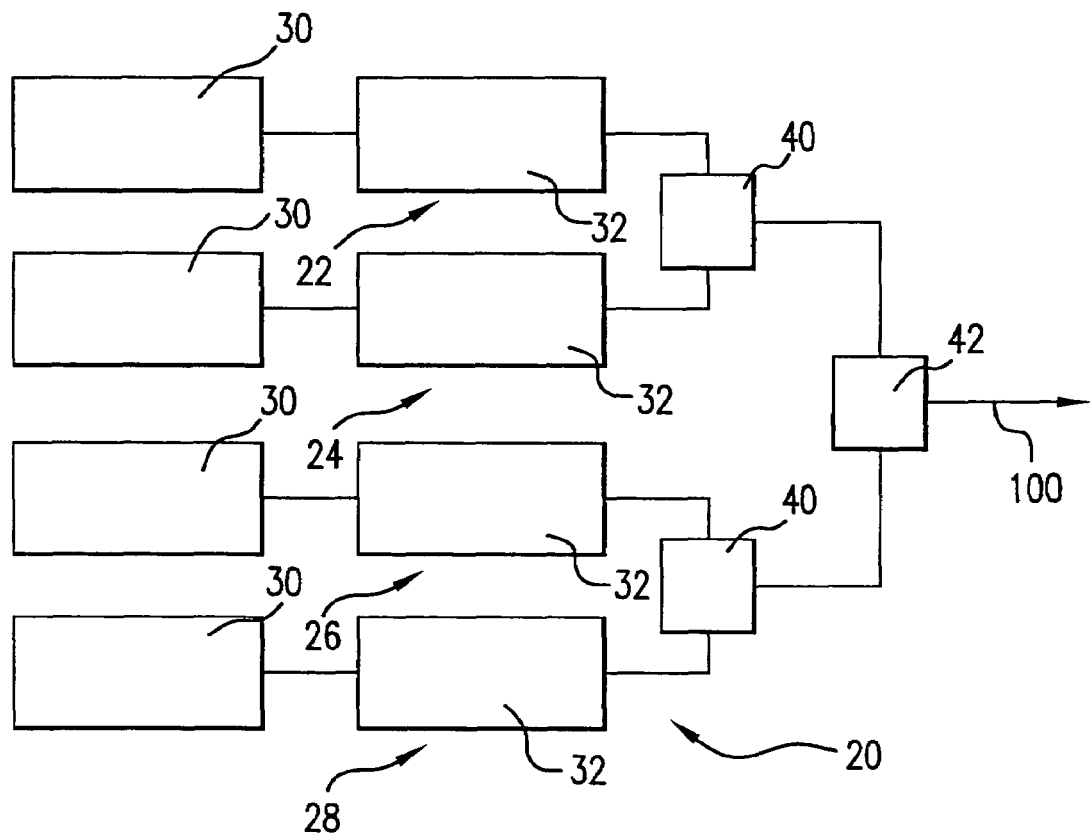
FIG. 1 shows schematically and in block diagram form a very high average power laser light source according to aspects of an embodiment of the disclosed subject matter.

According to aspects of an embodiment of the disclosed subject matter there are certain performance requirements necessary of a very high power amplification stage cavity for, e.g., a 200 w laser system, e.g., with two amplifier gain medium chambers in parallel. They should produce linear polarization (>98%). Each amplification stage should produce, and survive, $\geqq 100$ W average output energy, e.g., at 193 nm wavelength of ArF, or less stringently at longer wavelengths, e.g., 248 for KrF and 351 for XeF or 318 for XeCl, though even more stringent for $F_2$ at 157 nm. Each amplification stage in one embodiment may operate at about 6 kHz or above. The amplification stage optics must survive energy densities associated with 17 mJ/(losses)≅29 mJ per pulse near the amplification stage output. According to aspects of an embodiment of the disclosed subject matter, the amplification stage(s) can exhibit full seeding (at or near saturation) with relatively small seed laser energy. According to aspects of an embodiment of the disclosed subject matter seed laser energy may be no more than around 1 µJ, though the system overall output power in such cases may be less than 200 W. Applicants believe that the amplification stage should also support a moderately large angular distribution, e.g., to maintain the same angular spread of the seed laser, in order to avoid inadvertently improving coherence by, e.g., removing coherence cells, e.g., with a range of angles of within a few m Rad. Protection of the seed laser from reverse traveling radiation is also an important operational requirement. When properly seeded, ASE levels produced by the amplification stage, according to aspects of an embodiment of the disclosed subject matter, should be less than 3xe-4 of total output.

According to aspects of an embodiment of the disclosed subject matter applicants expect that (1) the gain cross-section will be similar to existing ArF chambers, e.g., applicants' assignee's XLA ArF laser system power amplifier ("PA") chambers, (2) the gain length will also be similar to existing ArF chambers, (3) the gain duration will also be similar to existing ArF chambers.

According to aspects of an embodiment of the disclosed subject matter, applicants propose, e.g., a single MO/gain amplification medium XLA tic-toc with a solid state seed laser operating at 12 kHz with about a 1 mJ seed laser output light pulse energy and the two amplification stages each operating at around a 17 mJ output pulse energy. In addition, according to aspects of an embodiment of the disclosed subject matter, applicants propose the utilization of a regenerative gain media in which the oscillating laser generated light photons pass through the gain media at least twice per oscillation, e.g., a ring power amplification stage, which can enable the generation of up to ten times the output pulse energy in the ring power amplification stage compared, e.g., to a power amplifier ("PA") in a MOPA configuration. With such a ring power amplification stage, in the tic-toc mode, the MO energy required may be significantly lower, e.g., in the µJ to tens of µJs range. For testing purposes applicants have simulated the input from a solid state 193 nm seed laser using a line-narrowed ArF laser.

Figure 45:
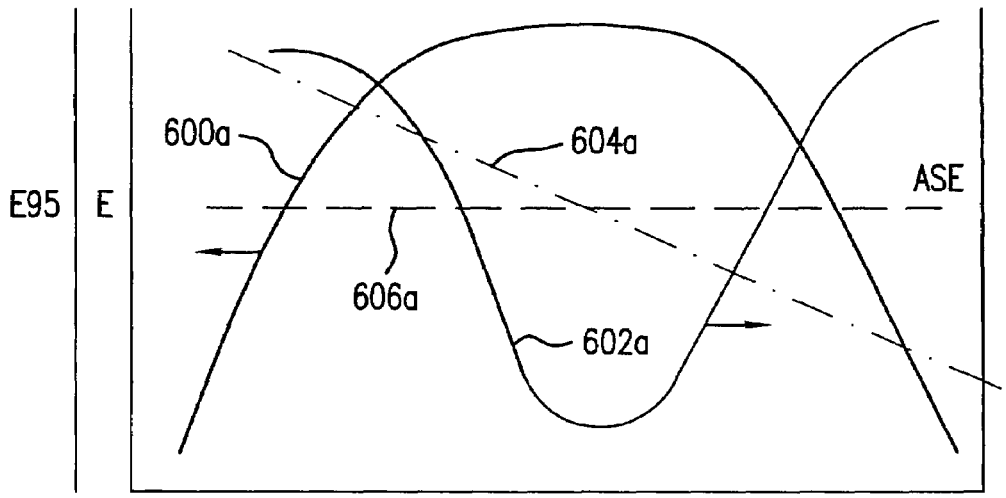
FIG. 45 illustrates plots of ASE and output energy vs. seed pulse to amplifier delay time according to aspects of an embodiment of the disclosed subject matter.

Applicants have studied ASE vs. MO-PO timing difference for the different values of the above noted parameters with results as indicated in FIG. 45. Similarly a study of MOPO energy vs. MO-PO timing as a function of these same parameters also illustrated in FIG. 45.

In order to meet the requirements noted above, including, e.g., the constraints of known lithography laser light source technology, applicants propose, according to aspects of an embodiment of the disclosed subject matter, a number of overall architectures that are believed to provide workable ways to address the requirements and constraints noted above. The first may be to provide two multi-chamber laser systems along the lines of applicants' assignee's XLA XXX laser system series, e.g., with two dual chamber laser oscillator/amplifier arrangements whereby each is configured to run at around 6 kHz producing output pulses at about 17 mJ with interleaved firing times to produce a single approximately 12 kHz system producing about 17 m per pulse.

Thus, e.g., according to aspects of an embodiment of the disclosed subject matter, illustrated schematically and in block diagram form in FIG. 1, a very high average power laser system, e.g., a 200 W immersion lithography laser light source 20 may comprise a plurality of oscillator/amplifier laser system output light pulse beam sources, e.g., 22, 24, each of which comprising, e.g., a master oscillator portion comprising master oscillator chambers 30, such as those being sold by applicants' assignee Cymer Inc. as part of an existing XLA XXX model multi-chamber laser system. Also included in each oscillator/amplifier laser system 22, 24 may be a power amplifier portion 32, e.g., comprising an amplifier gain medium. Each of the two oscillator/amplifier laser systems 22, 24 provide an output light pulse beam to a beam combiner 40, e.g., in an overleaving fashion.

Thus, e.g., with each laser system 22, 24 operating at 6 kHz and 17 mJ output laser light pulse beam pulse energy the combined output from the beam combiner 40 could be a 12 kHz 17 mJ output resulting in about a 200 W average power laser system. It will also be understood that the embodiment of FIG. 1 may also be implemented with, e.g., a further plurality of identical oscillator amplifier laser systems 26, 28 to produce a 400 W average power laser system. Alternatively, each of the oscillator/amplifier systems 22, 24, 26, 28 could, e.g., operate at less than 6 kHz, e.g., each at 4 kHz and/or with a higher overall oscillator/amplifier system 22, 24, 26, 28 output laser light pulse beam pulse energy, e.g., up to around 33 mJ, to the extent that optical damage limits and cost of operation and other factors will allow, for various combinations of ultimate output 100 pulse repetition rate and pulse energy for a similar variety of average output power values from the system 20.

Figure 2:
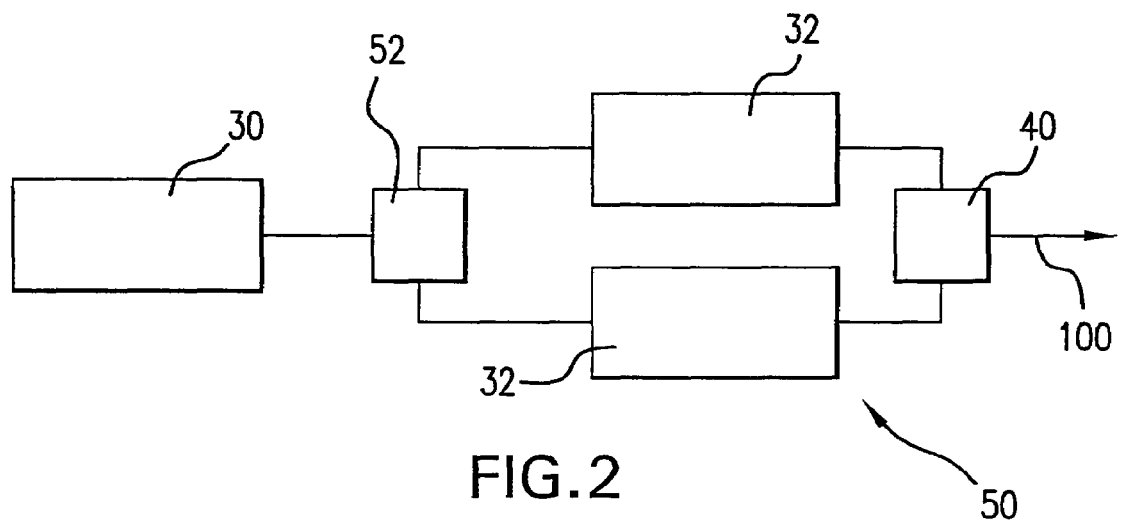
FIG. 2 illustrates schematically and in block diagram form a very high average power laser light source according to aspects of an embodiment of the disclosed subject matter.

Referring now to FIG. 2 there is illustrated schematically and in block diagram form a very high average power tic-toc seed laser/amplifier system 50 according to aspects of an embodiment of the disclosed subject matter. The seed laser amplifier system 50 may include, e.g., a seed laser portion 30, e.g., a solid state seed laser such as a Nd:YAG or a Nd:YLF or a Ti:Sapphire or a fiber laser or other solid state laser, e.g., operating at around 12 kHz with a 1-2 mJ output energy pulse and a pair of amplifier portions 32, each being supplied with, e.g., the alternating output pulses from the seed laser portion 30, e.g., through a beam splitter 52, discussed in more detail elsewhere in the present application. The pulse could be supplied in other than an alternating fashion, depending on the repetition rates of the amplification stages. Each of the amplifier portions 32 can then be run at, e.g., around 6 kHz for a 200 W output with only a 17 mJ output from each of the amplifier portions 32.

Figure 3:
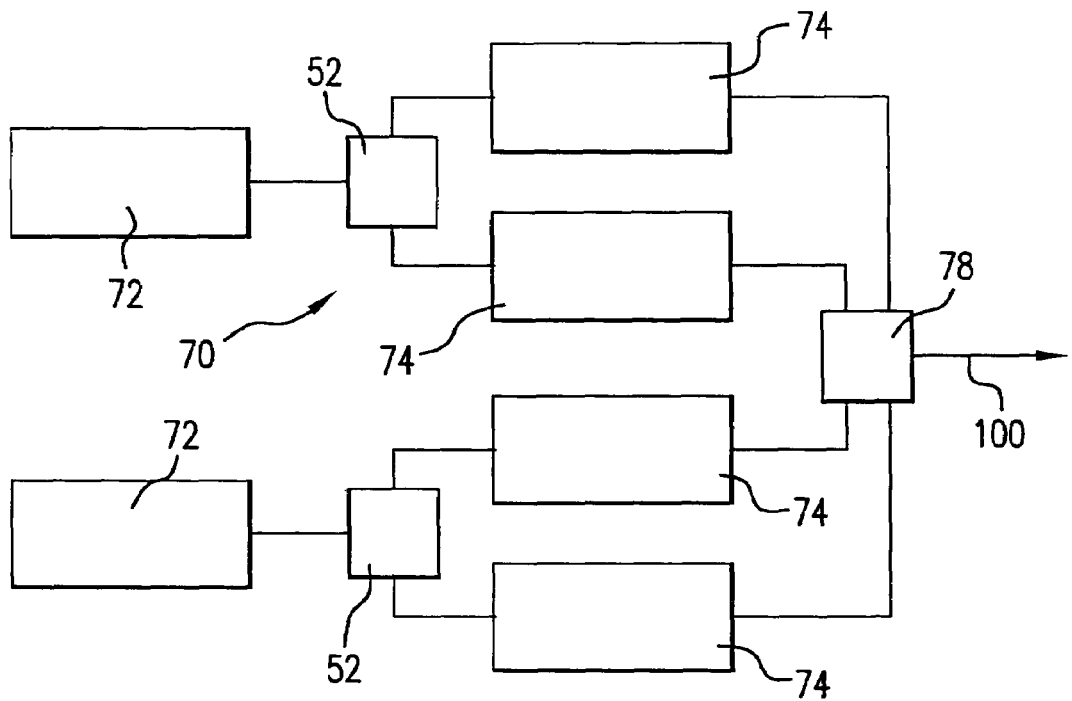
FIG. 3 shows schematically in block diagram form an example of a very high average power laser light source according to aspects of an embodiment of the disclosed subject matter.

Referring to FIG. 3 there is shown schematically in block diagram form an example of a very high average power multiple tic-toc seed laser/amplifier system 70 according to aspects of an embodiment of the disclosed subject matter. The system 70 may include, e.g., a first and a second seed laser 72 each supplying seed laser pulses to a pair of amplifier portions, e.g., amplifier gain media 74, through a beam splitter 52 and with the output of each combined in a beam combiner 78 to provide a laser light source system output laser light pulse beam 100 with an average output power of at or above 200 W. The seed lasers could be, e.g., solid state lasers operating at, e.g., around 12 kHz and the amplifier portions could be, e.g., gas discharge lasers, e.g., excimer or molecular fluorine lasers operating at around 6 kHz. Alternatively, e.g., the seed lasers 72 could be excimer lasers, e.g, KrF, ArF, XeCl, XeF or molecular fluorine lasers operating at about 6 kHz with the respective pairs of tic-toc amplifier portions each operating at 3 kHz for a total of 12 kHz and 17 mJ per lithography or LTPS laser light source system output laser light pulses and a resultant average power of around 200 W. Frequency conversion, as discussed in more detail elsewhere in the present application may be needed to shift the wavelength of the seed laser(s) 72, e.g., solid state lasers, up to the wavelength of the gas discharge laser amplifier portions 74. The beam combiner 78 may be a single beam combiner as shown or cascading combiners as shown in the combiners 40, 42 in FIG. 1.

It will also be understood by those skilled in the art that various combinations and permutations of the arrangement illustrated in FIG. 3 may be utilized. For example there may be a plurality of A seed lasers 72 operating at X kHz with each seeding a plurality of B amplifier portions 74, each operating at X/B kHz and the combination providing AX system output laser light source output pulses in the output beam 100 of FIG. 3. Then, depending on the necessary average system output power, the pulse energy for the output of each of the plurality of amplifier portions 74 may be determined, e.g., with A=2 and B=2, as illustrated in FIG. 3 and X=6 kHz the overall output beam 100 can have a 12 kHz output and with 17 mJ pulses out of the amplifier portions one gets around 200 w of average output power. The same may be said for the possible arrangements of FIG. 1.

It will be noted that a tic-toc amplifier LTPS or immersion lithography light source, e.g., seeded by a master oscillator running at, e.g., twice the repetition frequency of the, e.g., two amplifier chambers, could be two excimer laser chambers in a MO/amplification gain medium configuration. For example, each amplification medium could have a recirculating/regenerative ring power amplification stage, each of which is alternatively seeded by a master oscillator running at twice the repetition rate of either amplification stage excimer laser chamber. Such systems can be run at any of the desired wavelengths, e.g., DUV wavelengths, e.g., with the MO and PA/PO operating at 157 nm ($F_2$), 193 nm (ArF), 248 nm (KrF), 308 nm (XeCl) or 351 nm (XeF). Further, such systems could include solid state or excimer seed lasers operating at a higher pulse repetition rate seeding a plurality of power amplification stages, e.g., two, in tic-toc configuration, such as ring power amplification stages.

Figure 4:
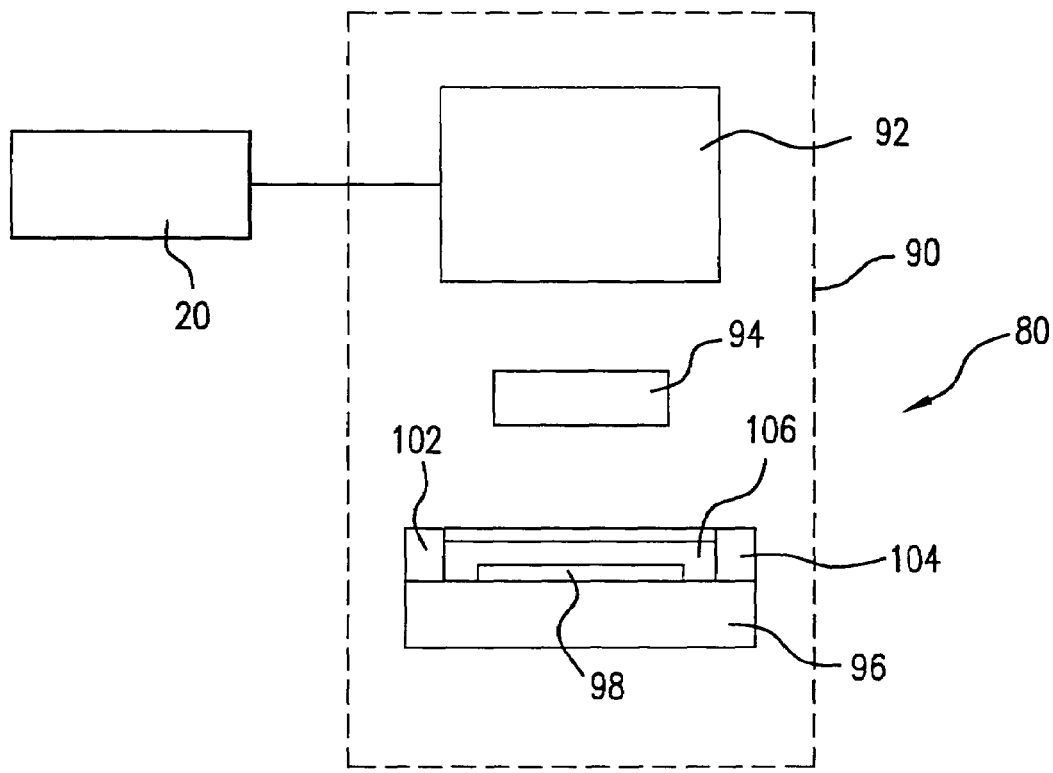
FIG. 4 shows partly schematically and partly in block diagram form, by way of example an immersion laser lithography system according to aspects of an embodiment of the disclosed subject matter.
Figure 50:
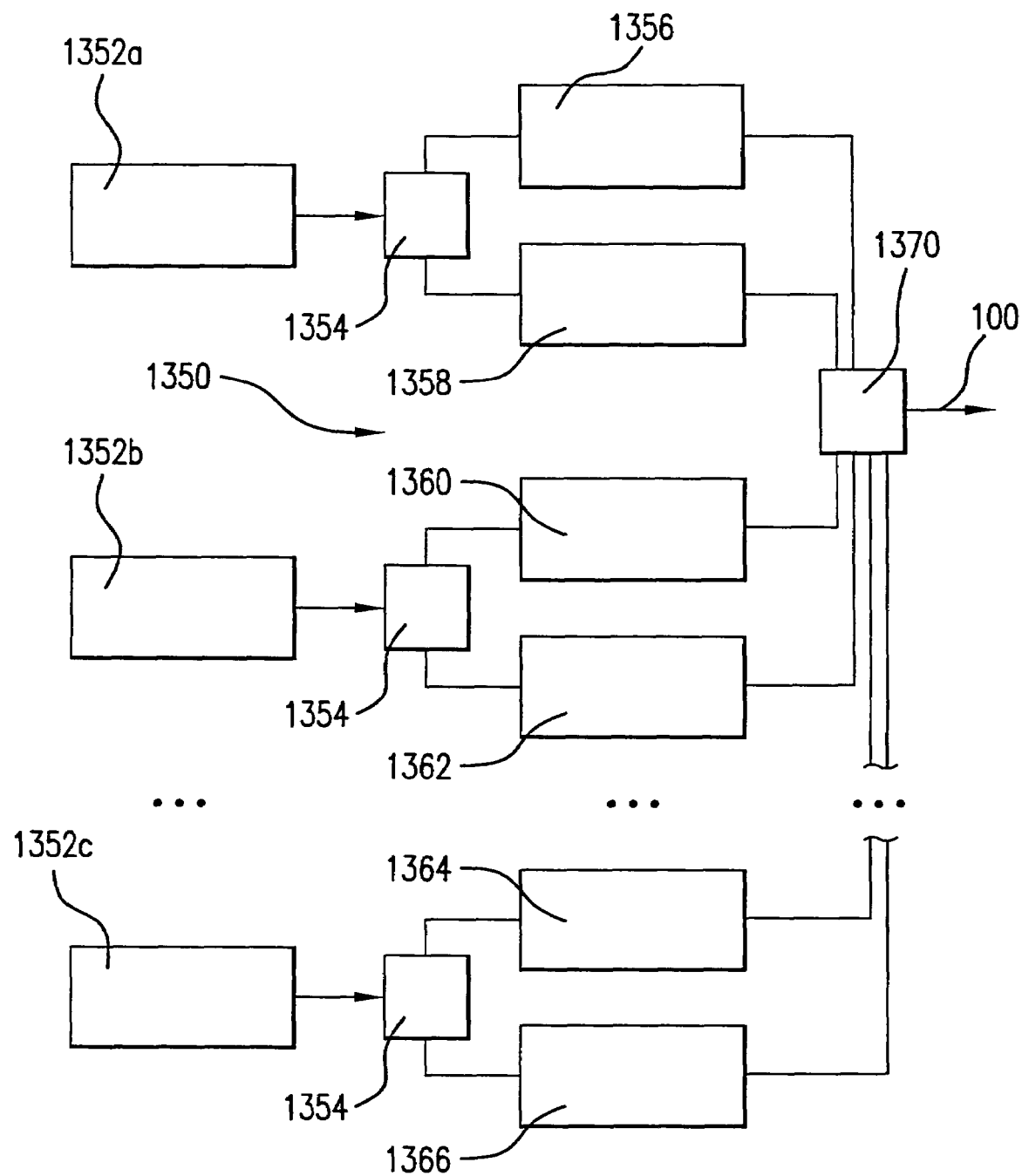
FIG. 50 shows schematically and in block diagram form a laser system according to aspects of an embodiment of the disclosed subject matter.

In FIG. 4 there is shown partly schematically and partly in block diagram form, by way of example an immersion laser lithography system 80 according to aspects of an embodiment of the disclosed subject matter. The system 80 may include, e.g., a very high average power output laser light pulse beam source 20 such as shown in FIG. 1 or 50 such as shown in FIG. 2 or 70 such as shown in FIG. 3, supplying line narrowed pulses at 200 W or above average power to a scanner 90, such as those made by ASML, Canon or Nicon. The scanner 90 may incorporate an illuminator 92, a reticle 94 and a wafer stage 96 carrying a wafer 98 for exposure by the radiation from the light source 20. On the wafer stage 96 may be a liquid source 102, e.g., with the liquid being water having a different index of refraction than the ambient around the reticle 94 and stage 96, and a liquid drain 104, supplying the liquid 106 to cover the wafer 98 for immersion lithography.

It will also be understood that for purposes of coherence busting, either for excimer or other gas discharge seed lasers supplying excimer or other gas discharge laser amplifier portions or for solid state seed lasers, use of multiple amplifier portions with the beams combined as noted elsewhere in the present application may have beneficial effects in busting up the coherency and therefore, assisting in reducing the effects of the speckle, e.g., in integrated circuit photolithography or LTPS or tbSLS processing. It will also be understood that one or more of the various coherence busting techniques and/or combinations thereof disclosed herein may be utilized inside of the scanner 90, whether that scanner 90 is an immersion scanner or not.

Figure 5:
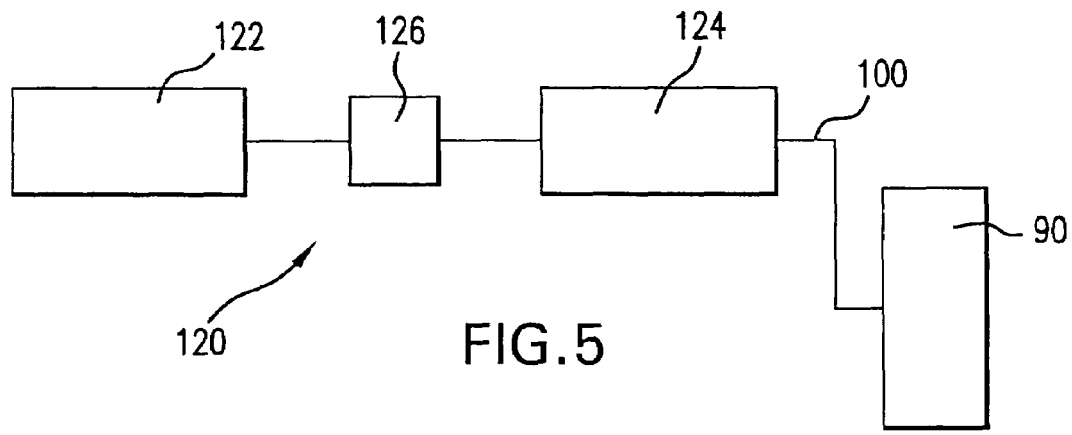
FIG. 5 shows schematically and in block diagram form a solid state seed laser to gas discharge amplifier laser system according to aspects of an embodiment of the disclosed subject matter.

Turning now to FIG. 5 there is shown schematically and in block diagram form a solid state seed laser to gas discharge amplifier laser system 120 according to aspects of an embodiment of the disclosed subject matter. The system 120 may include, e.g., a solid state pulsed seed laser 122, e.g., an Nd:YAG or an ND:YLF tunable solid state laser 122. The output of the laser 122 may pass through a coherence buster/frequency multiplier 126, which may, e.g., be a single optical element, e.g., capable of both frequency shifting the output of the seed laser 122 and beam steering, as is explained in more detail elsewhere in this application with respect to coherency busting, or could be a frequency shifter along with a coherency buster in series, e.g., as shown in FIG. 6 The system may also have, e.g., an amplifier gain medium such as a PA or PO 124, or, e.g., a ring power amplification stage 124, e.g., with the output 100 supplied to a scanner 90 (Shown in FIG. 5).

It will be understood that with various tuning mechanisms may be used, e.g., operating temperature, as is know in the art, the solid state laser, e.g., a 1064 ns wavelength Nd:YAG (neodymium-doped yttrium aluminum garnet (Nd:$Y_3Al_5O_{12}$)), or 1053 ns Nd:YLF (neodymium doped yttrium lithium fluoride) or a 1054 Ti:Sapphire laser (tunable from about 650 to 1100 nm, which can also produce ultra-short pulses of about_nm in length), and/or by line selection. This can take advantage of different transition spectra for the solid state laser 122 harmonic frequency generation and/or frequency addition/subtraction or other frequency shifting techniques, e.g., Raman shifting, which may be utilized to change the output frequency of the seed laser 122. The desired frequency/wavelength for amplification in the amplifier portion 124 may be attained, e.g., within an acceptable $\Delta\lambda$ from the nominal center wavelengths of around 351 for XeF, 248 for KrF, 193 for ArF and 157 for molecular fluorine to have acceptable amplifying lasing occur in the amplifier portion 124, e.g., by amplified stimulated emission lasing, as is well understood in the art. As noted above, coherency busting of the type discussed elsewhere herein may be used inside the scanner 90 or other application tool, e.g., another microlithography tool or a thin beam laser annealing tool.

Figure 6:
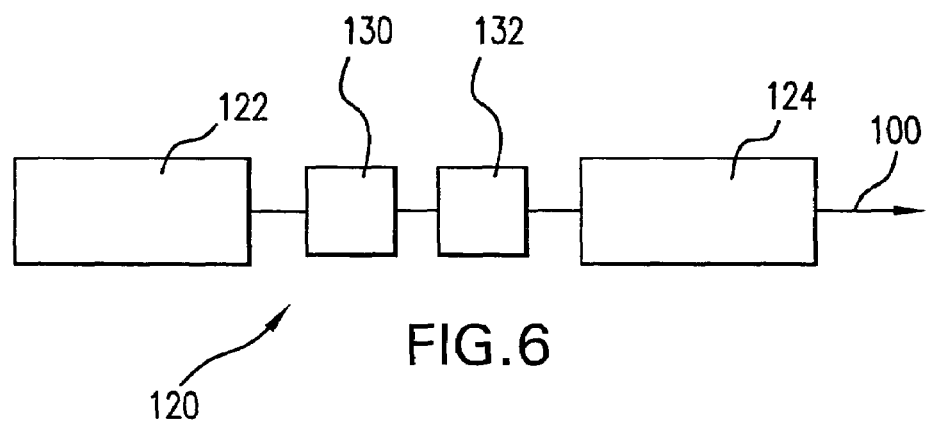
FIG. 6 shows in block diagram form a solid state seed laser/amplifier laser system according to aspects of an embodiment of the disclosed subject matter.

Turning to FIG. 6 there is shown in block diagram form a solid state seed laser/amplifier laser system 120 according to aspects of an embodiment of the disclosed subject matter similar to that of FIG. 6 wherein, e.g., a frequency multiplier 130 and a coherence buster 132 may be utilized to provide appropriate seed pulses to the amplifier laser portion 124 to accommodate, e.g., the high coherency of the seed laser output laser light pulse beam pulses and also their frequency shift to the desired frequency/wavelength for amplification, e.g., in the gas discharge amplification gain medium of the amplification stage 124.

Figure 7:
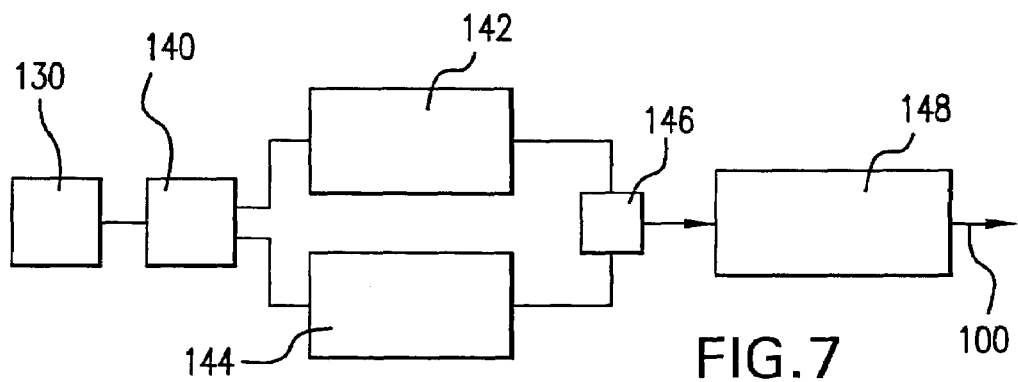
FIG. 7 shows schematically and in block diagram form conversion of the output of a seed laser, e.g., with a frequency converter along with a beam divider, followed by coherency busting according to aspects of an embodiment of the disclosed subject matter.

Turning to FIG. 7 there is shown schematically and in block diagram form conversion of the output of a seed laser, e.g., with a frequency converter 130 along with a beam divider 140, followed by coherency busting in one axis, e.g., the long axis of the laser beam or a first axis if the beam is not an elongated rectangle and the short axis or a second orthogonal axis if the beam is not an elongated rectangle, with a respective vertical axis coherency buster 142 and horizontal axis coherency buster 144, as explained in more detail herein. The outputs of the coherency busters 142, 144 may be combined in a beam combiner 146, which, as noted elsewhere, may also serve a coherency busting role, e.g., as shown in connection with FIG. 35, and/or FIGS. 20 A and B, and provided as seed laser pulses to the amplifier gain medium portion 148.

Figure 8:
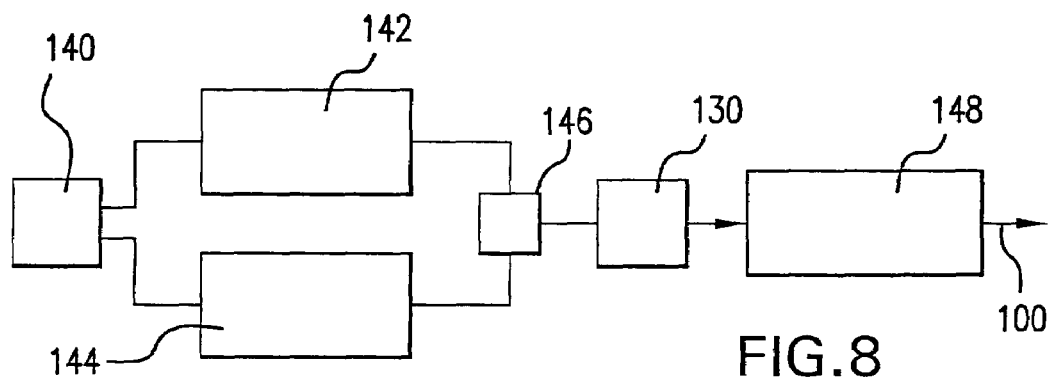
FIG. 8 shows schematically and in block diagram form a version of the embodiment of FIG. 7 according to aspects of an embodiment of the disclosed subject matter.

Turning to FIG. 8 there is shown schematically and in block diagram form a version of the embodiment of FIG. 7 in which, e.g., the frequency conversion in a frequency converter 130 occurs after the coherency busting, i.e., intermediate the beam combiner 146 and the amplifier portion 148.

Figure 9:
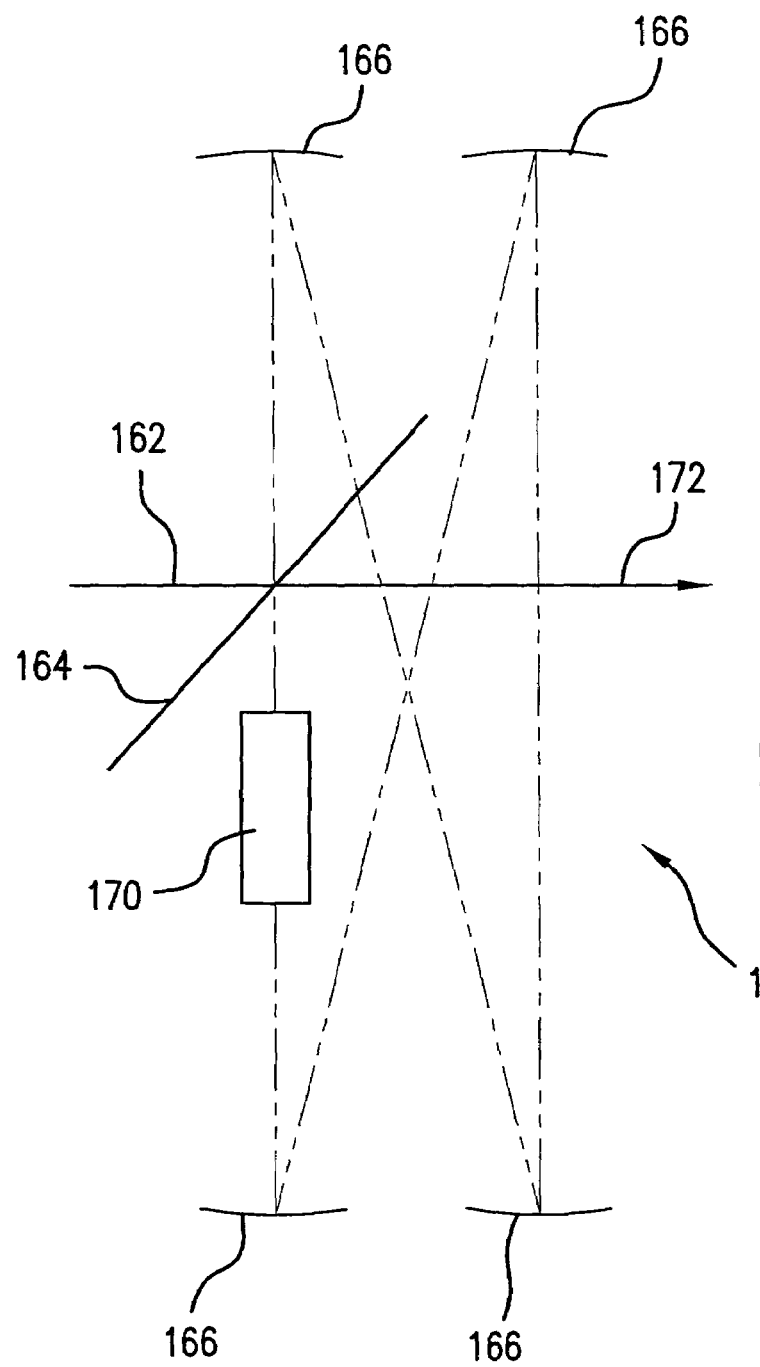
FIG. 9 shows schematically a coherency buster according to aspects of an embodiment of the disclosed subject matter.

Turning now to FIG. 9 there is shown in schematic form a pulse stretcher 160, which can be, e.g., a version of the optical pulse stretcher ("OPuS") sold with applicants' assignee's laser systems however with, e.g., much shortened delay paths, as explained elsewhere (a so called mini-OPuS) not designed for pulse stretching per se, i.e., enough stretching for significant pulse elongation in the spatial and temporal domains, e.g., increasing the $T_{is}$ by 4× or more and creating overlapping pulses, as in applicants' assignee's currently sold OPuS pulse stretchers, as are more fully described in, e.g., U.S. Pat. No. 6,928,093, entitled LONG DELAY AND HIGH TIS PULSE STRETCHER, issued to Webb et al. on Aug. 9, 2005 referenced above. However, the same folding/inverse imaging effects on the beam for coherency busting purposes, or also as explained in regard to the beam mixer of FIG. 35, can be achieved.

The coherency buster 160 may have an input beam 162 incident on a beam splitter 164, e.g., a partially reflective mirror 164 for the pertinent wavelength. Part of the beam 162 that is reflected into the delay path comprised of a plurality of mirrors, e.g., mirrors 166a, is negatively imaged, e.g., twice, and on the final leg of the delay path passes through a pulse trimmer 170. It will be understood that such optical coherence busters may have more or less than four mirrors, e.g., six mirrors, but are illustrated schematically with four for convenience and clarity. A portion of the light exiting the pulse trimmer 170 is reflected into the output beam 172 and a portion reenters the delay path. The delay path may be much shorter than the seven to ten meters or so of, e.g., a 4× OPuS, such that the second and third passes through the delay path do not overlap the pulses entering and leaving the coherency buster 160, but rather do not even substantially stretch the pulses. The pulse trimmer 160 may be used, e.g., to shorten the ultimate output pulse 172, e.g., by cutting off a portion of the pulse circulating in the coherency buster delay path using the pulse trimmer 170, or much or all or substantially all of the second and subsequent passes through the delay path. The pulse trimmer 170 may be, e.g., a Pockels cell or other suitable fast acting light transmission switch, e.g., a light beam modulator/deflector, e.g., an electro-optic or acousto-optic device, e.g., a crystal that changes refractive index when excited by a field, e.g., an electric field, an acoustic field or a magnetic field.

In addition to traditionally used integrated circuit photolithography laser light sources, e.g., ArF and KrF, a fiber-laser-based solid-state 351 nm MO can also be realized according to aspects of an embodiment of the disclosed subject matter. Such a master oscillator architecture may be a simpler more robust solution than a bulk-solid-state laser. Such a laser may be utilized in the field of IC lithography as a very high power (200 w or greater) laser surface processing light source architecture that may, e.g., incorporate the fiber-laser-based master oscillator and also in a very low power MO output pulse laser system (e.g., with the MO operating at the µJ output pulse energy level for greater efficiency and lower cost of use and other advantages noted in the above referenced co-pending application filed on the same day as the present application), or in a very high power broad band application such as for LTPS or tbSLS use, e.g., as a 351 nm laser system. The use of pulse trimming with stimulated optical switches/modulators may be particularly useful between the master oscillator and amplification stage since the pulse energy may be lower there according to aspects of an embodiment of the disclosed subject matter.

According to aspects of an embodiment of the disclosed subject matter the generation of 351 nm radiation, e.g., coherent 351 nm radiation, can be done with a solid-state configuration having, e.g., a solid-state drive laser (or lasers) that drive linear or nonlinear frequency conversion stages. Generation of 351 nm laser radiation can be, as illustrated, attained by third harmonic conversion of the output of a Nd:YLF laser operating at 1053 nm. In order to use this approach as a seed laser for an XeF excimer amplifier/oscillator, however, one must ensure that the nominal center wavelength of the, e.g., Nd:YLF seed laser master oscillator matches the gain spectrum of XeF (two lines at 351.12 and 351.26 nm). An alternative approach could be to use an Yb-doped fiber laser as the fundamental drive laser seed pulse source. Yb3+ fiber lasers are inherently tunable, as discussed in J Nilsson et al "High-power wavelength-tunable cladding-pumped rare-earth-doped silica fiber lasers," Opt. Fiber Technol. 10, pp 5-30 (2004), to allow operation between 1050 and 1065 nm. Fiber lasers offer some simplifications in design that may be of particular benefit in applications requiring ultra-reliability, such as LTPS and microlithography. Applicants propose using a pulsed fiber laser system as the source of moderate peak power (5-50 kW) high-repetition-rate (multi-kHz, e.g., up to about 12-15 kHz) 1054 nm narrow-band pulsed radiation. Such a laser could be constructed using standard $Yb^{3+}$ pulsed fiber laser technology—either a q-switched fiber oscillator, a pulsed diode source that is fiber amplified, or a CW source (fiber oscillator or diode) that is modulated (internally or externally) and is fiber amplified. For example a CW solid state laser, e.g., a diode laser, with a very narrow bandwidth (very high spectral purity), e.g., a broadband laser, e.g., matched to the fiber laser, to provide a very narrow band seed to the pulsed solid state fiber laser for amplification and the production of a very narrow band pulsed solid state seed to the power amplification stage(s). Appropriate LMA (large-mode area) fiber technology may be used to minimize spectral degradation due to nonlinear effects in the fiber comprising the fiber laser amplification oscillator or any subsequent amplification stages. Using such approaches allows spatial beam quality to be maintained (there are techniques for ensuring single-mode operation in large mode area fibers) while reducing the peak power in the core of the fiber. After the 1054 nm radiation is generated, it can, e.g., be frequency upconverted directly to, e.g., about 351.2 nm, using two stages of nonlinear frequency conversion (second harmonic generation ("SHG") of 1054 to 527 nm then sum frequency generation ("SFG") with the residual fundamental to 351.2 nm (with ~+/−0.1 nm bandwidth).

Turning now to FIGS. 10-13 there are shown schematically and partly in block diagram form a plurality of injection seeded DUV gas discharge master oscillator/amplifier gain medium laser system solid state master oscillators 200 according to aspects of an embodiment of the disclosed subject matter. The master oscillator 200 may include, e.g., a $Yb^{3+}$ doped fiber oscillator amplifier 210, e.g., with a diode pump 212 and a seed laser, e.g., a 1054 nm CW seed diode laser 214, which may have a spectral purity of $\leq 100$ MHz FWHM in the fundamental.

Figure 10:
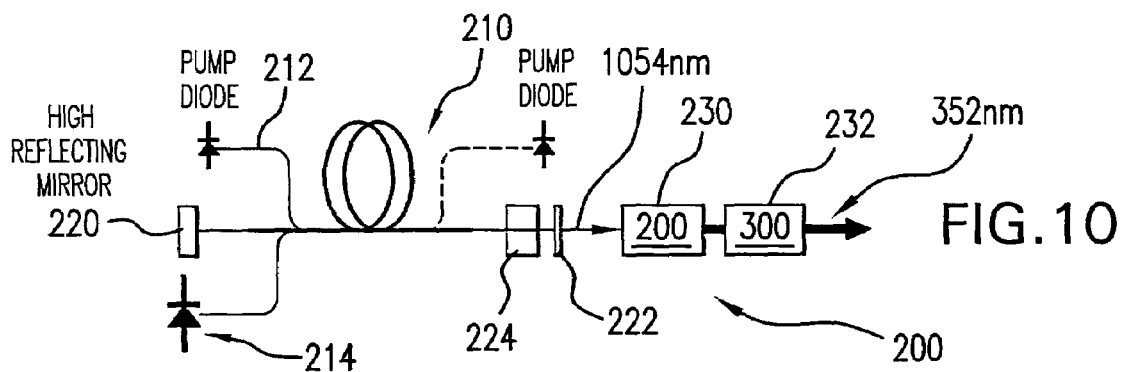
FIG. 10 shows schematically and partly in block diagram form an injection seeded DUV gas discharge master oscillator/amplifier gain medium laser system solid state master oscillator according to aspects of an embodiment of the disclosed subject matter.

Referring to FIG. 10 the master oscillator oscillation cavity may be formed by a rear cavity fully reflective mirror 220 and a partially reflective output coupler 222, which may be 90% reflective at the nominal 1054 nm center wavelength of the fiber oscillator 210. The master oscillator 200 may employ a Q switch 224 to allow for the output pulse energy of the master oscillator 210 to accumulate in the oscillation cavity until sufficiently high in energy before the Q-switch 224 is opened, as is well known in the art. The output of the master oscillator 200 may thus be pulsed by the frequency of operation of the Q-switch, e.g., at a rate of about 12 kHz. The output of the fiber oscillator laser 210 may be passed through a second harmonic generator 230, followed by a frequency adder 232, to add the original frequency to the second harmonic to generate a third harmonic, i.e., a wavelength of about 352 nm suitable for amplification, perhaps with some slight shifting to closer to 351, in, e.g., a XeF gas discharge laser power amplifier or power oscillator or ring power amplification stage amplifying gain medium (not shown in FIGS. 10-13).

Figure 11:
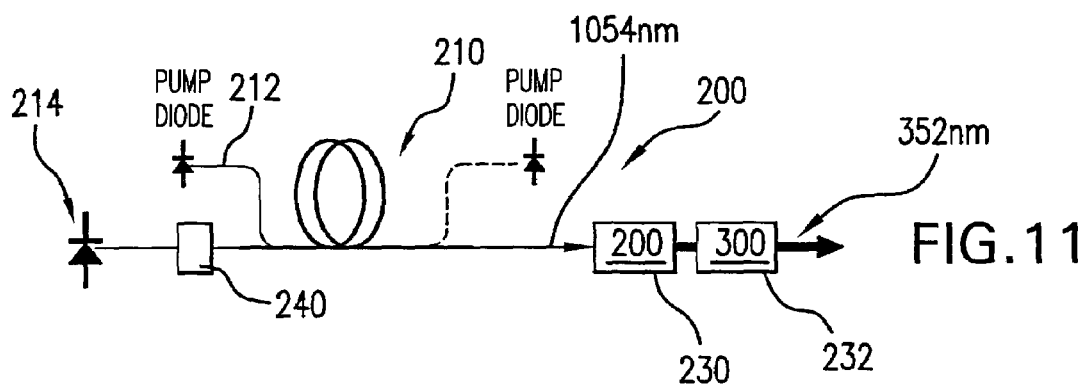
FIG. 11 shows schematically and partly in block diagram form an injection seeded DUV gas discharge master oscillator/amplifier gain medium laser system solid state master oscillator according to aspects of an embodiment of the disclosed subject matter.

Turning to FIG. 11 there is shown schematically and partly in block diagram form a solid state master oscillator 200 according to aspects of an embodiment of the disclosed subject matter. In this embodiment an external amplitude modulator 240, e.g., an acousto-optic or electro-optic switch or other suitable mechanism, may be used to pulse the CW seed 214 into the fiber amplifier 210 to produce a pulsed output of the master oscillator 200.

Figure 12:
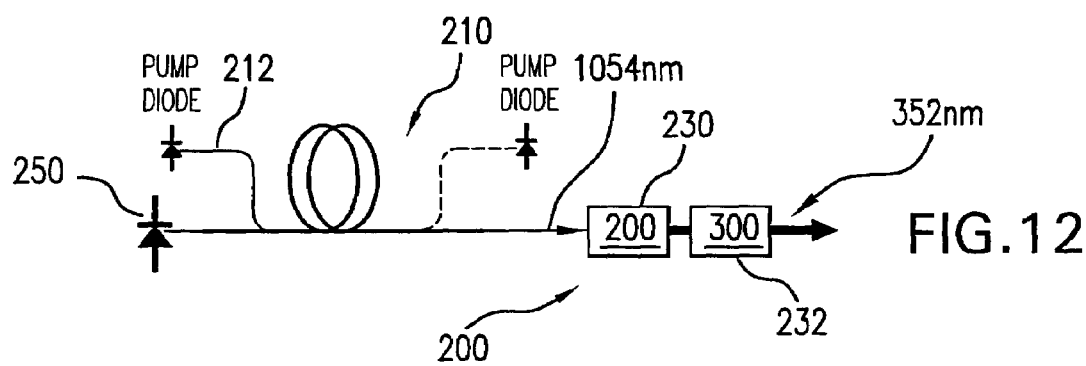
FIG. 12 shows schematically and partly in block diagram form an injection seeded DUV gas discharge master oscillator/amplifier gain medium laser system solid state master oscillator according to aspects of an embodiment of the disclosed subject matter.
Figure 13:
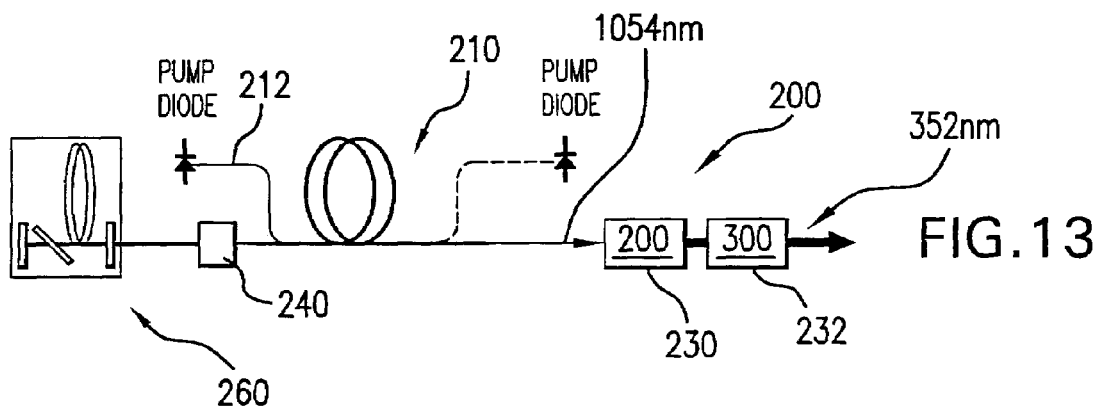
FIG. 13 shows schematically and partly in block diagram form an injection seeded DUV gas discharge master oscillator/amplifier gain medium laser system solid state master oscillator according to aspects of an embodiment of the disclosed subject matter.

In the embodiment of FIG. 12 the 1054 seed may utilize, e.g., a pulsed seed diode 250 to produce a pulsed output out of the master oscillator 210, e.g., at around 12 kHz. In the embodiment of FIG. 13 a tunable CW $Yb^{3+}$ master oscillator 260 may be switched into the fiber amplifier 210 with an external amplitude modulator, such as is discussed above, to get a pulsed seed laser output from the master oscillator 200. The fiber amplifier 210 may utilize pump diodes 212 to pump the fiber amplifier 210.

According to aspects of an embodiment of the disclosed subject matter applicants have determined certain characteristics desirably evidenced by a seed laser, e.g., a solid state seed laser, for a very high average power laser system, e.g., for photolithography or LTPS applications, including, e.g., pulse energy, pulse duration and timing jitter, which can drive the selection of a seed laser, e.g., a solid state seed laser to the choice(s) of Nd:YAG, Nd:YLF, Ti:Sapphire, and fiber lasers, as discussed elsewhere.

According to aspects of an embodiment of the disclosed subject matter applicants have also studied certain amplification stage resonator cavity properties. On the one hand may be a flat-flat cavity with simple beam splitter input/output coupling, which is simple of construction, though perhaps more wasteful of seed laser energy than is practical in a production system. On the other hand may be a recirculating or regenerative power oscillator, e.g., a ring power amplification stage, e.g., with a beam splitter/mirror input/output coupler and multiple passes through the gain medium per each oscillation within the oscillator cavity of the power amplification stage. It will be understood by those skilled in the art, as noted above, terms like oscillator, cavity and the like used in reference to, e.g., a MOPO configured laser system mean that the amplification portions of the laser system, seeded by a seed laser portion, lases due to stimulated emission from the seed beam pulse oscillating in the cavity. This is distinguished from what may be referred to as a power amplifier, such as the PA portions of applicants' assignee's MOPA configured XLA XXX series laser systems. By contrast the amplification occurs in a power amplifier by stimulated emission during a gas discharge in the amplification gain medium of the amplifier portion of the laser system as the seed laser pulse is directed through the amplification gain medium in an excited state a fixed number of times by an optical arrangement, e.g., a two pass optical system as used in applicants' assignee's current XLA XXX series laser systems. In some of the literature, however, an oscillating amplifier wherein the number of passes through the gain medium in the oscillation path, e.g., a bow-tie or racetrack loop path which is not an integer multiple of the nominal center wavelength of the laser output may be considered to be a "power amplifier" rather than a "power oscillator." Therefore for purposes of this application and the appended claims the use of the term "ring power amplification stage" is intended to cover either type of power oscillator, regardless of the relation of the cavity size to the wavelength.

The flat-flat configuration may use a traditional polarization input/output coupling e.g., with a polarizing beam splitter and a quarter wave plate and partially reflective output coupler, e.g., as described in more detail below with respect to FIGS. 23 and 28. This may make more efficient use of the seed laser energy but could also be more susceptible to, e.g., thermal effects at high pulse energy and/or high average output power. Other input/output coupling could also be employed as explained in more detail in the above referenced co-pending provisional application filed concurrently with the present application,.

Figure 14:
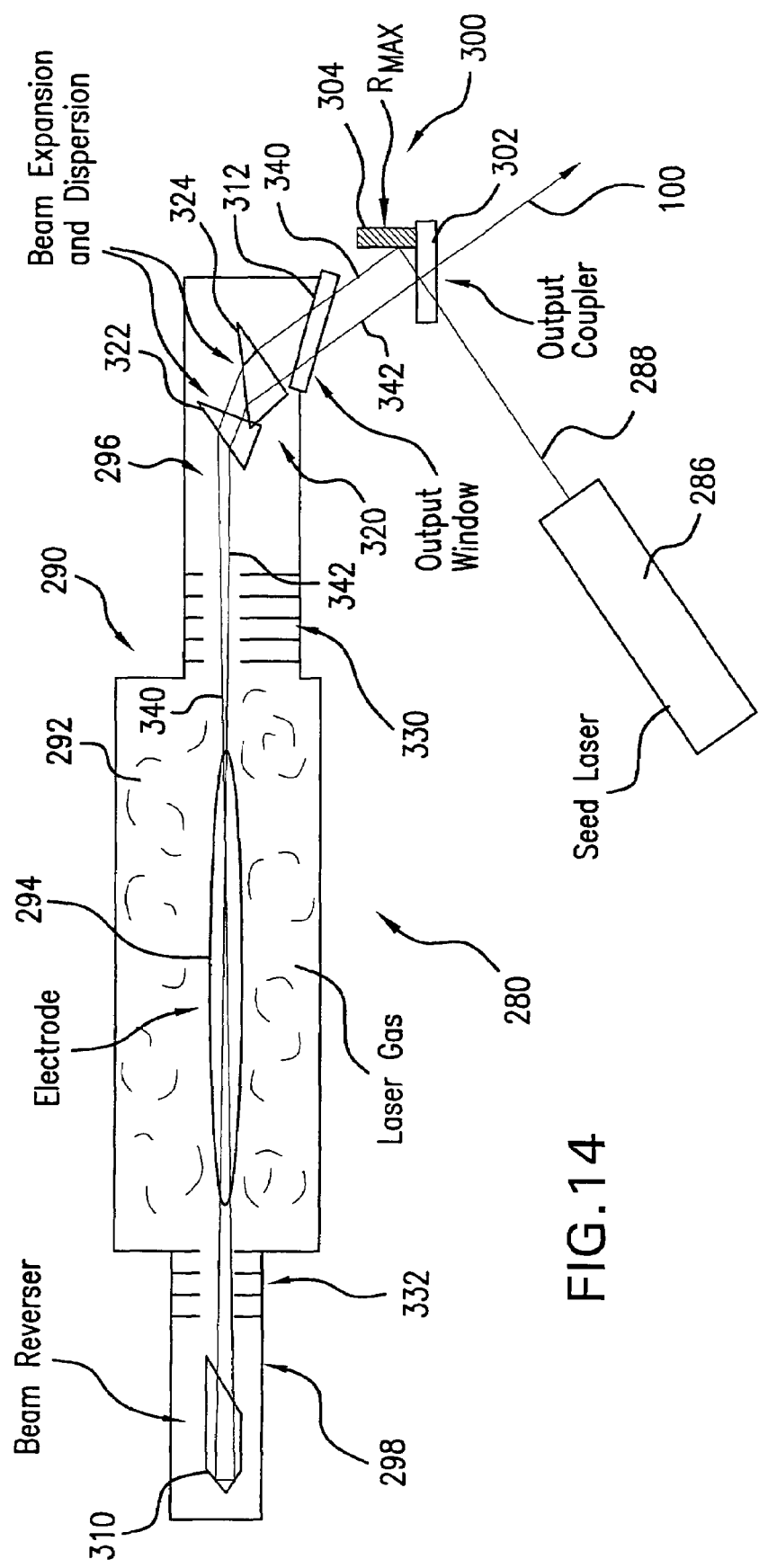
FIG. 14 illustrates in schematic and partly block diagram form an example of very high average output power laser system power amplification stage according to aspects of an embodiment of the disclosed subject matter.
Figure 16:
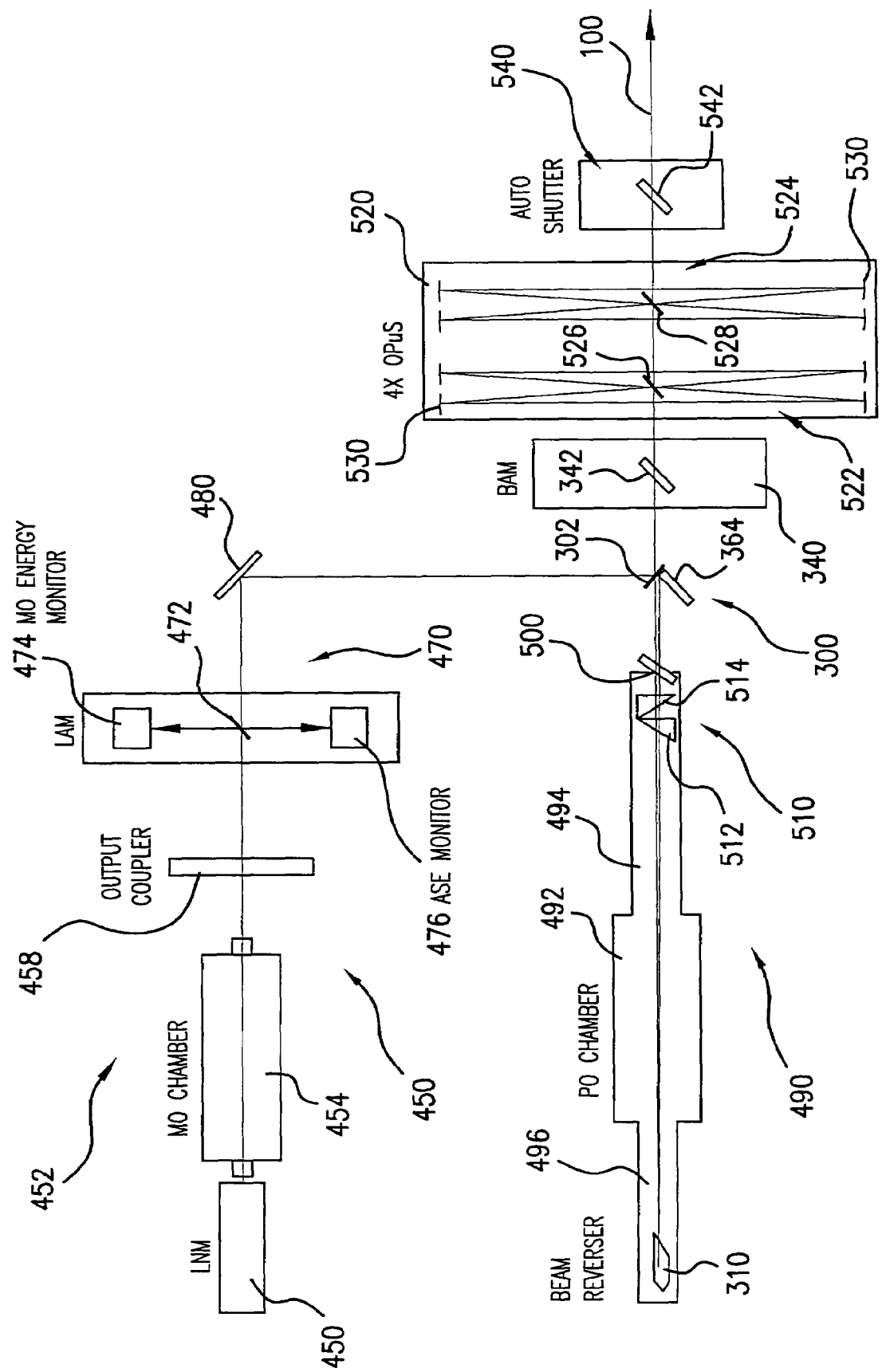
FIG. 16 illustrates in schematic and partly block diagram form an example of very high average output power laser system according to aspects of an embodiment of the disclosed subject matter.

Turning now to FIGS. 14 and 16 there are illustrated in schematic and partly block diagram form examples of very high power, e.g., around 200 W or better average output power, laser systems, 280, and 450, respectively, according to aspects of an embodiment of the disclosed subject matter. These laser systems 280, 450 may be used, e.g., for immersion lithography use or for LTPS use, or the like, which may include, e.g., in the case of FIG. 14 a ring power oscillator amplification stage configured laser system 280. The system 280 may include a seed laser 286, which may provide seed laser pulses at, e.g., around 0.1 mJ or less and a pulse repetition rate of, e.g., around 6 kHz, in a seed laser output light pulse beam 288 of laser output light pulses. The beam 288 from the seed laser 286 may pass through a seed injection coupling mechanism 300 into an amplifier gain medium portion 290 of the laser system 280.

The amplifier gain portion 290 may comprise a ring power amplification stage chamber 292 containing a pair of gas discharge electrodes 294 one of which is seen in the view of FIG. 14. The chamber 292 may also comprise an input chamber section 296 and a beam reverser chamber section 298, each of which may be formed with or attached to, e.g., by suitable leak proof means, the chamber 292, such that, e.g., the optics in the input section 296 and in the beam reverser section 298 can be beneficially exposed to fluorine in the lasing gas mixture enclosed in the chamber sections 292, 296, 298.

The seed injection mechanism may include, e.g., a beam splitter/input-output coupler 302 which may be coated with a coating or otherwise selected or made to be partially reflective to the seed laser light, e.g., at a nominal center wavelength of around 193 nm for ArF, 248 nm for KrF, 318 for XeCl or 351 for XeF laser systems, and a maximally reflective mirror 304 that is maximally reflective at the selected nominal center wavelength for the respective ArF, Krf, XeCl or XeF or the like gas discharge laser systems.

The beam reverser 310 may be similar to the power amplifier beam reversers, e.g., sold in applicants' assignee's XLA MOPA configured laser systems, XLA XXX systems, or as discussed in more detail in the above referenced co-pending patent application filed on the same date as the present application. In the input section 296 optically accessible through an input window 312 may be placed a beam expander 320, which may be comprised of a prism 322 and a prism 324, which together may narrow the beam 288 on its way into the chamber 292 and conversely expand it on its way out of the chamber 292, the expansion on the way out serving to, e.g., protect the optical elements, e.g., the input/output coupler 300 and the narrowing of the beam 288 on the way into the chamber 292 serving to, e.g., narrow the beam 340 entering the amplification gain medium to approximately the width of the discharge between the electrodes 294 in a direction generally perpendicular to the separation of the electrodes 294.

Baffles 330 may serve to, e.g., protect the optics in the input section 296 and the beam reverser section 298 of the chamber 292 from damage resulting from, e.g., debris circulating with the lasing gas mixture in the chamber 292.

Inside the cavity of the ring power amplification stage 290 the beam 288 may take a first direction recirculating oscillation path 340 and return on a second direction recirculating oscillation path 342 to the seed injection mechanism 300 where the partially reflective input/output coupler acts as a traditional output coupler for an oscillator laser cavity and reflects part of the oscillating laser light photons to the Rmax mirror 304 and back along the path 340. Thus the oscillation in the cavity formed by the seed injection mechanism 300 and the beam reverser 310 is a multi-pass oscillation path such that the oscillating photons pass through the gain medium between the electrodes 294 more than once, in the illustrated case twice, in different directions and on different paths for each oscillation loop. Such multi-pass oscillation, as noted, is distinct from the photons in a power amplifier making a fixed number of passes through the gain medium, e.g., two in applicants' assignee's XLA XXX laser systems, without oscillating along such power amplifier light path. When the oscillation in the recirculating/regenerative path 340, 342 builds up enough pulse energy a laser system output laser light pulse beam 100 is produced from the seeded power oscillator laser system 280. The seed laser 286 could be either a gas discharge, e.g., excimer or fluorine laser or a solid state laser.

FIG. 16 illustrates schematically and partly in block diagram form a ring power amplification stage laser system 490 configured similarly to applicants' assignee's XLA XXX multi-chambered MOPA laser systems with the PA replaced by a ring power amplification stage 490 according to aspects of an embodiment of the disclosed subject matter. The laser system 450 may be comprised of an excimer gas discharge laser seed laser 452 which may comprise a master oscillator laser chamber 454, with a line narrowing module 456 having a reflective element, e.g., a wavelength and bandwidth selective grating, forming a rear cavity mirror and a partially reflective output coupler 458 forming the other end of the master oscillator 452 oscillation cavity. The master oscillator 452 seed laser output laser light pulse beam of pulses leaving the output coupler 458 may pass through a metrology module (line center analysis module "LAM") 470, which may sample a portion of the output of the MO chamber 454, using a beam splitter 472, and also, in addition to a wavemeter (not shown) for measuring nominal center wavelength of the master oscillator seed laser output laser light pulse beam pulses may comprise an MO laser output light pulse beam pulse energy monitor 474 and an ASE monitor 476, such as a fluorescence detector. The ASE detector, e.g., a broad band photodetector, may serve to detect the presence of a high enough intensity of broadband light to indicate the timing of the discharge in the amplification gain medium is off such that significant lasing in band is not occurring (the seed pulse is not timed to be in the cavity of the amplification stage during the discharge) and essentially only broad band lasing is occurring during the discharge in the amplification stage.

The master oscillator seed laser 452 output laser light pulse beam may then pass to a turning mirror 480 and from there to a seed injection mechanism 300 input to an amplifier gain medium portion 490, which may comprise a ring power amplification stage chamber 492, having a chamber input section 494 and a chamber beam reverser section 496. It will be understood by those skilled in the art that this schematic view of the laser system 450 does not reflect various aspects of the optical path of the beam from the MO 452 to the PO chamber 442, which are drawn schematically to conform to the plane of the paper and not the optical realities of the optical path between the two and into the amplification stage chamber 492.

The seed injection mechanism 300 may include, e.g., a partially reflective input/output coupler 302, e.g., a beam splitter similar to those sold with applicants' assignee's laser systems, e.g., as part of an optical pulse stretcher ("OPuS"), and a maximally reflective mirror Rmax 304 for the given nominal center wavelength, with the partially reflective output coupler 302 serving as an input/output coupler as noted above and specifically as the output coupler for the ring power amplification stage 490 oscillation cavity (defined also by the beam reverser 310). The seed laser output laser light pulse beam from the MO 452 may pass into the ring power amplification stage chamber 492 through an input window 500 and also pass through a beam expander 510 as noted above with respect to FIG. 14. The input section 494 of the ring power amplification stage chamber 492 may also house the beam expander 510, consisting of, e.g., a prism 512 and a prism 514. Other forms of seed injection mechanisms may include those discussed in the above referenced co-pending provisional application filed on the same as the provisional application from which this application claims priority and the other co-pending applications claiming priority to that provisional application or the provisional application from which this present application claims priority.

The output of the ring power amplification stage oscillator 490 may be the overall system output laser light pulse beam of laser pulses, however, as illustrated in FIG. 16, this beam (eventually output beam 100 to the utilization tool, e.g., the scanner) passes also through a metrology unit (bandwidth analysis module "BAM") 340, where output laser light pulse beam bandwidth may be measured, e.g., for each pulse in the beam, and through a pulse stretcher, e.g., a 4× OPuS 520 which may include, e.g., a first delay path 522, which the laser system output beam enters through beam splitter 526 and a second delay path 524 entered through beam splitter 528 (the delay paths formed by mirrors 530). Leaving the OPuS 520 the output beam 100 passes through a shutter 540 which may also have a beam splitter 542, e.g., to take off a portion of the laser system output laser light pulse beam 100 to measure, e.g., pulse energy.

With the beam expander 320 in FIG. 14 and 510 in FIG. 16 placed inside the ring power amplification stage oscillation cavity there is, e.g., a reduction of the energy density on the maximum reflector 304 and partial reflector 302 that make up the input/output coupler 300 of the ring cavity of the amplification stage 290, 490 is achieved. With the beam reverser 310 moved to inside the cavity, the space vacated can house the BAM (or SAM). The use of protective optical coatings, e.g., with protectively coated calcium fluoride ("PCCF") optics can be eliminated, e.g., on the beam reverser 310 and beam expander 320, 510. There could also be no need for PCCF on the amplification stage chamber window 500 and the output window 500 could be at a 47 degree orientation.

A ring power amplification stage in certain applications can actually allow the use of much less energy from the MO, approximately 1-100 uJ instead of the present value of about 1-3 mJ. For example in regular photolithography where about one third to one half of the 200 W is actually required from, e.g., a non-immersion very high average power laser lithography light source system, a reduction in MO energy requirement of about 3 to 10 times could lead to a corresponding increase in LNM lifetime, based on current LNM lifetime models. In addition, such small MO energy could likely allow use of a low MO chamber pressure and partial pressure of fluorine, necessary for operation at greater than 1 mJ, e.g., at around 1.5-3 mJ, with beneficial results from a chamber lifetime perspective. And also, since the power amplification stage reaches strong saturation with 100 uJ of MO energy and below, e.g., down to about 5 µJ or so, output energy stability will be dominated by the good ring power amplification stage characteristics and not the less than ideal MO energy stability characteristics. The present Cymer XLA XXX MOPA systems are dominated by the MO energy instabilities. Other output laser beam parameters, e.g., pointing stability, profile stability, and ASE stability may also be beneficially impacted by a configuration according to aspects of an embodiment of the disclosed subject matter utilizing reduced MO energy output.

According to aspects of an embodiment of the disclosed subject matter applicants propose to use a 6 mirror coherency busting mechanism (for convenience herein optical pulse delay paths are indicated schematically as having four mirrors per delay path) which has been developed by applicants' assignee for additional path delay inside either or both of the $1^{st}$ or $2^{nd}$ pulse stretchers in the OPuS used with applicants' assignee's XLA model multi-chamber laser systems. Such a delay path can, e.g., produce −1 imaging for each sub-pulse. This is illustrated schematically and in cartoon fashion, e.g., in FIG. 20A wherein is illustrated the summation of these "flipped" sub-pulses. The flipped sub-pulses shown, e.g., in FIG. 20B can be used, e.g., for improved profile uniformity and symmetry. A 6 mirror design can convert pointing shifts into a divergence increase which may, e.g., be beneficial in a ring arrangement for ASE reduction. The standard 4 mirror design does not. It will be understood that the delay path for this coherency busting purpose need not be as long as the actual OPuS used for pulse stretching to get a much increased pulse $T_{is}$, and overlapping pulses. Rather the coherency busting mechanism, a so-called "mini-OPuS", among other characteristics can fold the pulses a certain number of times. This is illustrated by the pulse 580, with the corner (pre-flip) designated 582 and the pulses 584, 586, 588. In addition, due to misalignment of mirrors in the delay path, a "hall of mirrors" effect due to subportions of the beam being misaligned, may also reduce the coherency in the seed laser pulse, and, e.g., so long as the delay path exceeds the spatial coherency length of the beam. In this regard, a four mirror mini-OPuS, e.g., with confocal spherical mirrors for ease of alignment, may serve as a satisfactory coherency buster, even without beam flipping in both axis as explained elsewhere in this application.

According to aspects of an embodiment of the disclosed subject matter it may be necessary to combine two separate laser beams at various points within a system according to aspects of an embodiment of the disclosed subject matter. If only half of the entrance to a 6 mirror pulse stretcher is illuminated, the sub-pulses flip between top and bottom as shown, e.g., in FIG. 20B. The summation of these "flipped" sub-pulses can lead to a filled in, full size profile, e.g., as illustrated in the pulse stretching simulation shown in FIG. 33, with the curve 562 showing the pulse before entering the delay path and curve 564 (black) after one delay path and 566 (red) after a second delay path. Laser divergence may then be used to fill in the center portion 568, e.g., after some propagation, e.g., over about 1 m or so.

Figure 26:
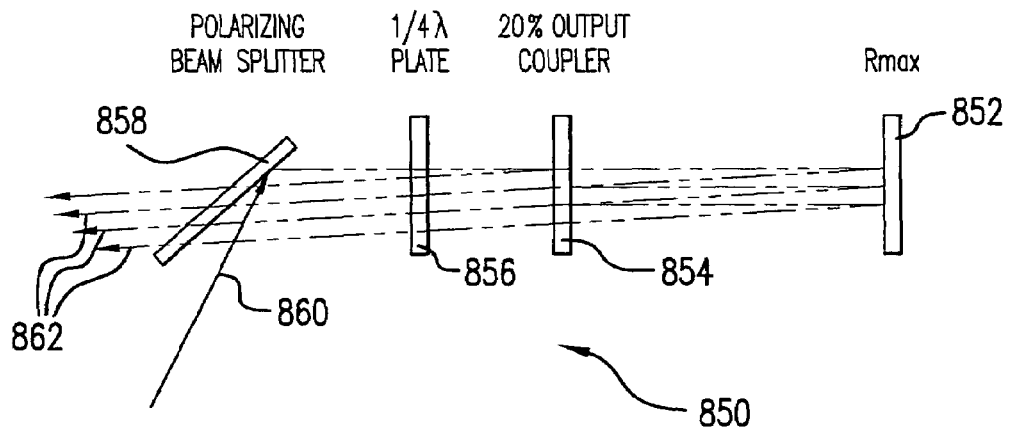
FIG. 26 illustrates schematically a coherency reduction scheme according to aspects of an embodiment of the disclosed subject matter.
Figure 33:
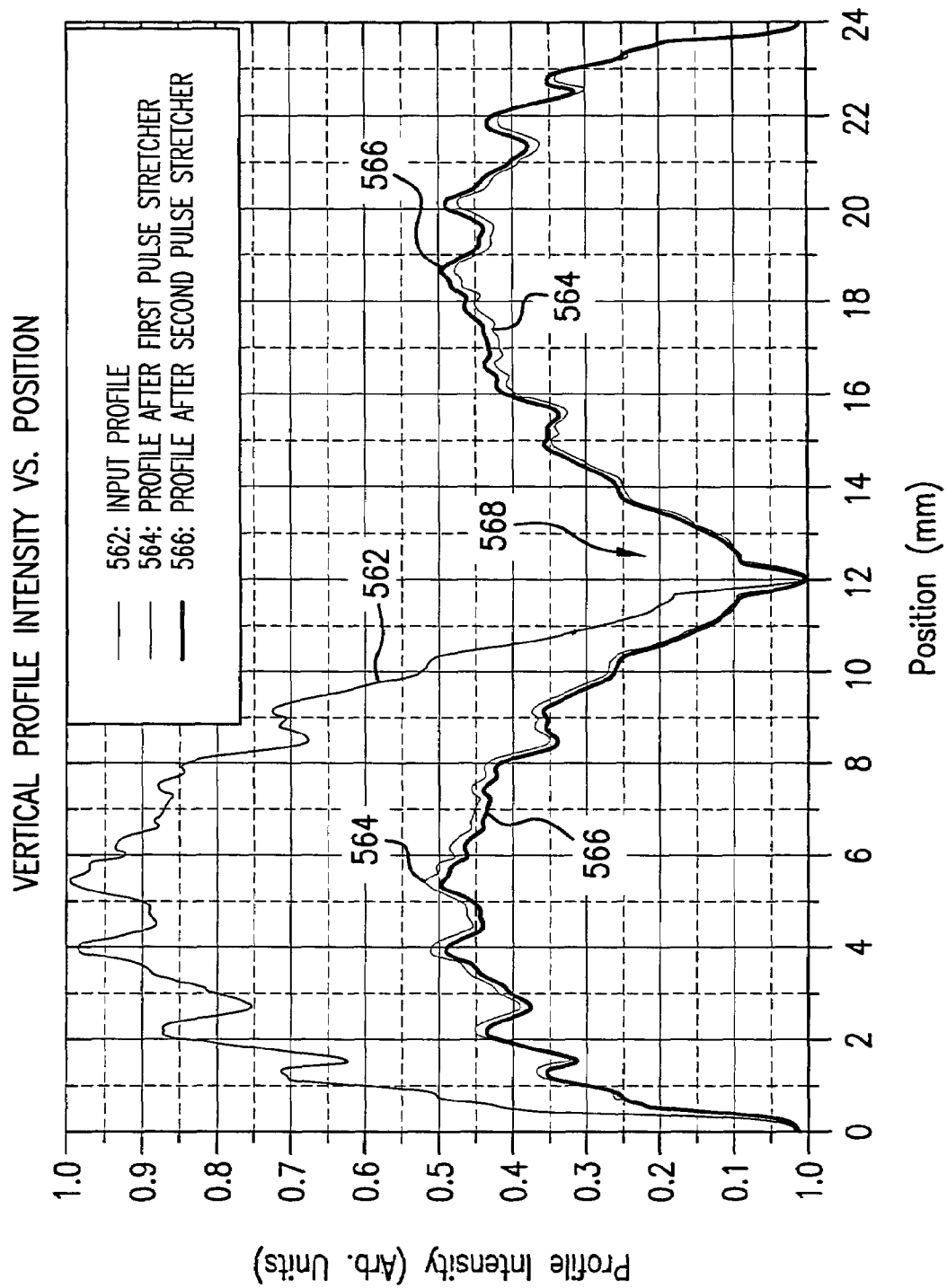
FIG. 33 illustrates results of simulated beam pulse recombination results.

Turning now to FIG. 26 there is shown a schematic representation of the effects of coherence busting according to aspects of an embodiment of the disclosed subject matter. Utilizing an imaging delay path, e.g., a pulse stretcher, e.g., a so-called optical pulse stretcher ("OPuS"), e.g., a 4× $T_{is}$ six mirror OPuS sold with the above noted applicants' assignee's laser systems, and illustrated in United States patents and co-pending applications noted above, or a modified version thereof with a shorter delay path used, e.g., for folding the beam on itself and/or for delay exceeding the coherence length as discussed herein, the so-called mini-OPuS, one can achieve a degree of coherence busting, e.g., between the MO and amplifier gain medium, e.g., a PA or a PO or a ring power amplification stage. Other forms of coherence busting e.g., as illustrated in FIG. 35 could be used alone or in combination with such a "mini-OPuS," e.g., as illustrated in FIG. 33 and elsewhere herein or as the mini-OPuS itself.

Figure 21:
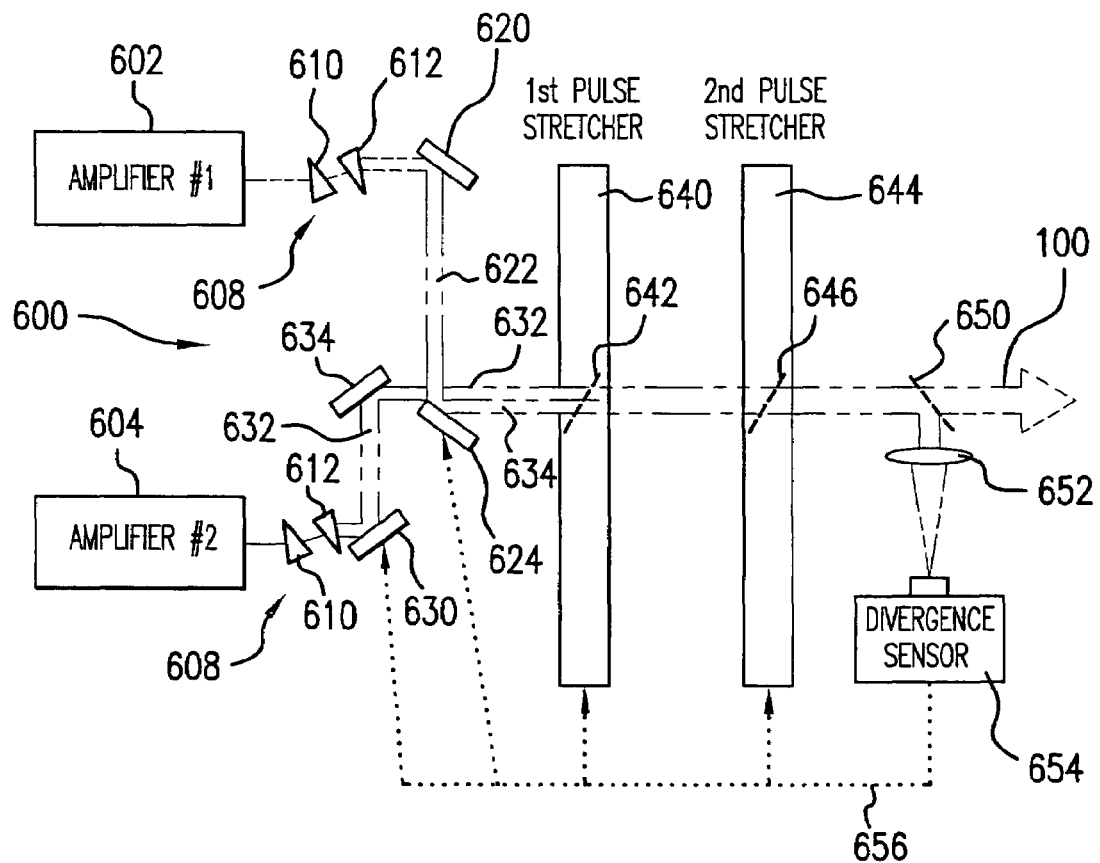
FIG. 21 illustrates schematically and in partly block diagram form a beam combiner with divergence control according to aspects of an embodiment of the disclosed subject matter.
Figure 23:
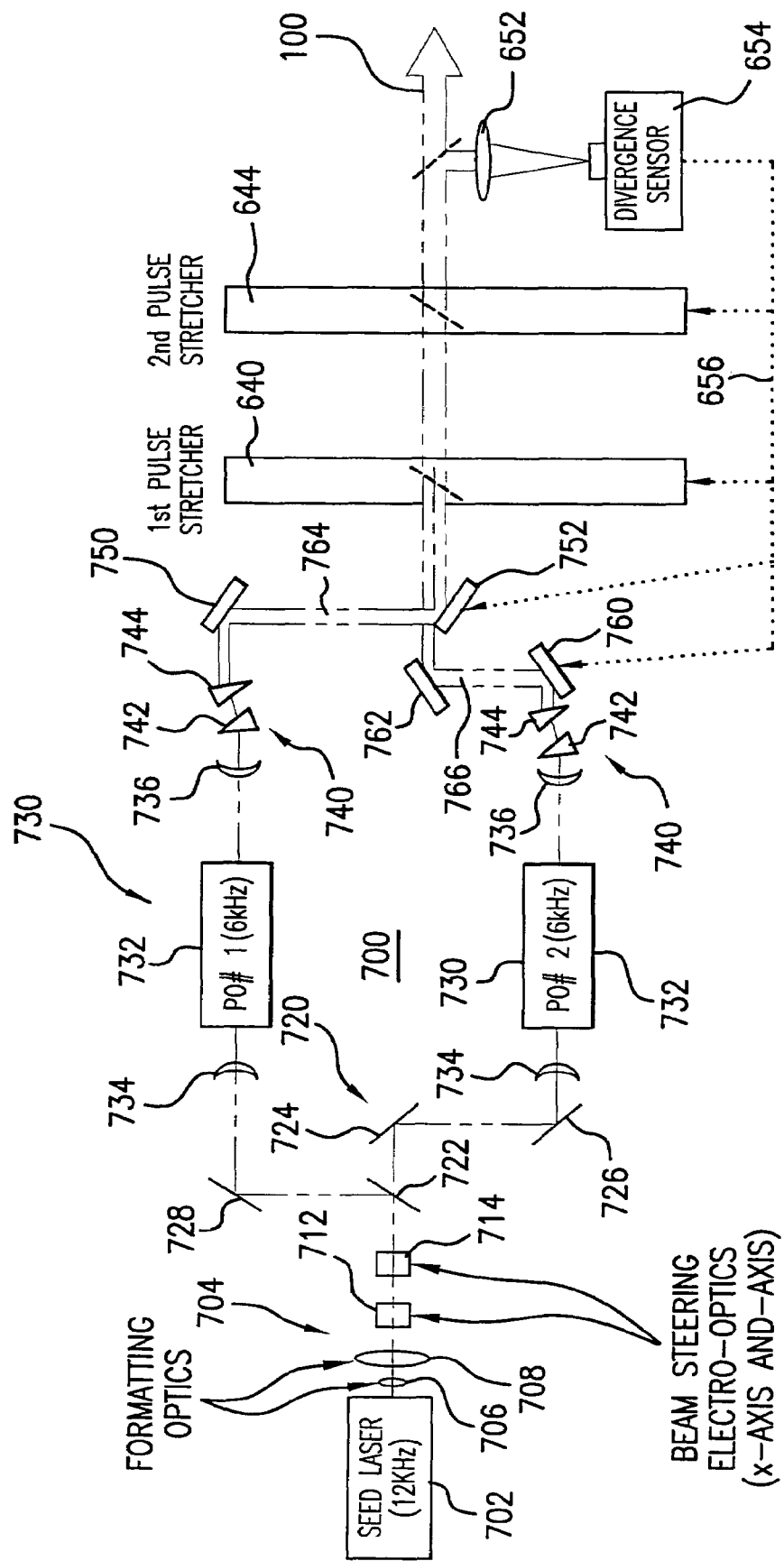
FIG. 23 illustrates schematically and in partly block diagram form a very high power solid state seed laser and gain amplifier laser system according to aspects of an embodiment of the disclosed subject matter.
Figure 35:
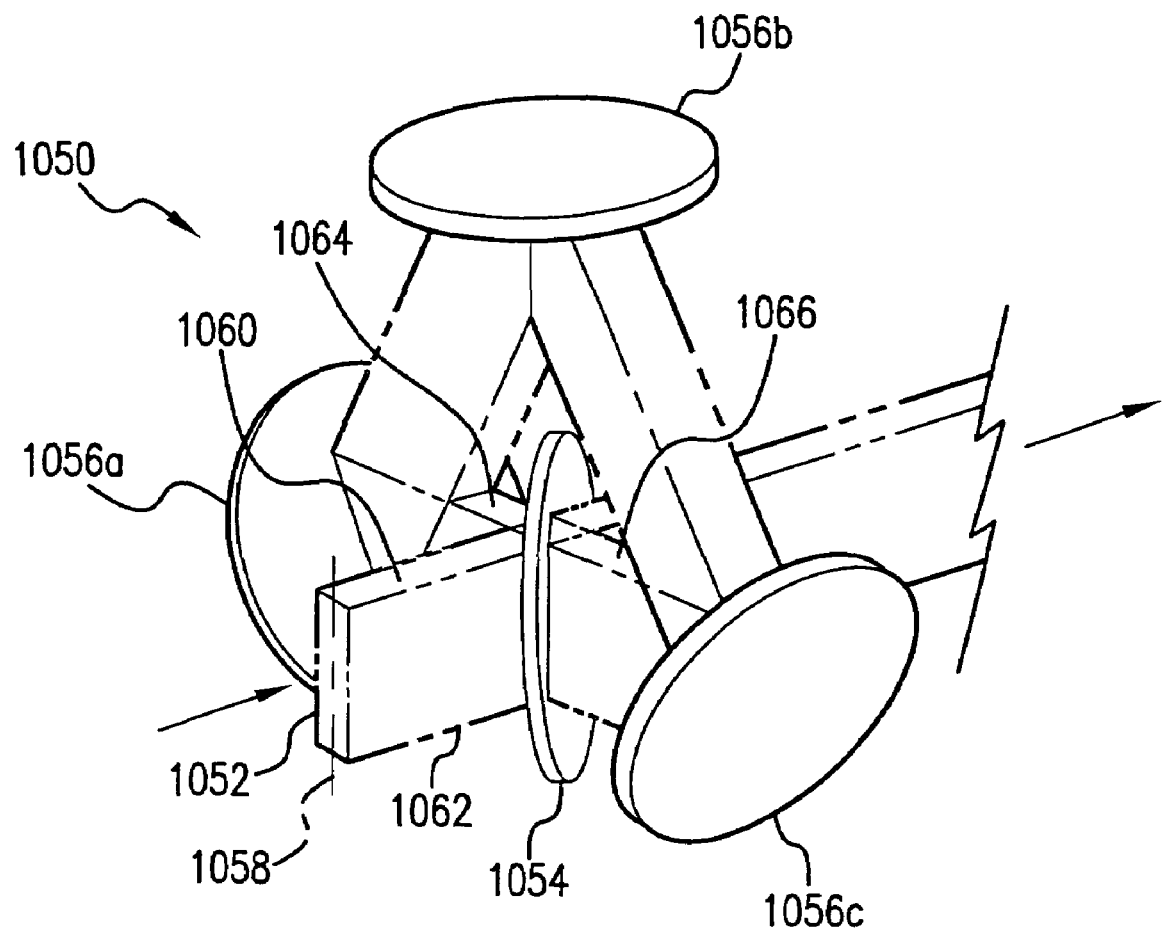
FIG. 35 illustrates schematically a coherency buster according to aspects of an embodiment of the disclosed subject matter.

According to aspects of an embodiment of the disclosed subject matter, the pointing/divergence sensitivity of a pulse stretcher, e.g., a 4 mirror 6 mirror pulse stretcher, e.g., a regular OPuS such as a 4× $T_{is}$ OPuS, or a so-called mini-OPuS, or the delay path discussed in more detail in regard to FIG. 35, can be put to advantage, e.g., by adding active mirror control with feedback from, e.g., a pointing/divergence sensor, illustrated, e.g., in FIGS. 21 and 23. Such advantages include creating or sustaining, e.g., a hall of mirrors effect whereby, e.g., the laser output light pulse beam being smoothed in the delay path actually becomes something like a plurality of beams of very slightly different pointing and thus angle of incidence on the various mirrors of the pulse stretcher and/or down stream of the delay path(s). Applicants assignee has observed this in pulse stretchers where it is very difficult to perfectly align the mirrors, e.g., of the currently used 4× $T_{is}$ OPuS pulse stretcher, thus creating the hall of mirrors effect that reduces the coherence of the laser output light pulse beam exiting the pulse stretcher. Thus the beam 860 forms a plurality of separate beams 82. In FIG. 26 this is also illustrated schematically and as a result of a flat-flat cavity 850 with slightly misaligned mirrors forming the rear of the cavity 852 and an output coupler 854, but the same effect has been observed in an OPuS by applicants employer with the coherence busting effect noted above. The cavity illustrated in FIG. 26 may also have a polarizing input coupler 858 and a quarter wave plate 856.

FIG. 26 illustrates a reduction in coherency, e.g., when using both the reflectivity of an OC and an Rmax, e.g., in a flat-flat cavity with, e.g., a polarizing input coupling from a seed laser source of seed laser pulses. The angles have been exaggerated for clarity of illustration. There are, e.g., multiple rays produced by a static fan out, i.e., "hall of mirrors" effect, e.g., created between the OC and the Rmax. The theoretical energy weighting of these rays, assuming no transmission losses through the cavity and perfect reflectivity is shown below.

| Ray Number | Fractional Energy | | Normalized Energy |
|---|---|---|---|
| 1 | 0.2 = | 0.200 | 0.3125 |
| 2 | 0.8*0.8 = | 0.640 | 1.000 |
| 3 | 0.8*0.2*0.8 = | 0.128 | 0.2000 |
| 4 | 0.8*0.2*0.2*0.8 = | 0.0256 | 0.0400 |
| 5 | 0.8*0.2*0.2*0.2*0.8 = | 0.00512 | 0.0080 |
| 6 | 0.8*0.2*0.2*0.2*0.2*0.8 = | 0.00102 | 0.0016 |

One may assume that each ray is incoherent from all others, e.g., where the path length between the OC and the Rmax is maintained to be longer than the temporal coherence length and, e.g., with non-overlapping stretching, i.e., of much less than the pulse length. Each ray may also be assumed, e.g., to be angled slightly different from all others since, e.g., perfect alignment is believed to be extremely difficult, especially in the vertical direction. Applicants believe that about 37 μrad of angle difference in the vertical direction is needed to create uncorrelated speckle. Summing the normalized energy weighting to give the equivalent number of independent pulses and taking the square root to give the reduction in standard deviation, the sum from the above is 1.56. The square root is 1.25 and thus the standard deviation when using both OC and Rmax reflections is predicted to be 0.551/1.25=0.440, which comports well with a value that applicants have measured, i.e., 0.427.

Static fan out, otherwise referred to herein as a hall of mirrors effect, believed to be essentially unavoidable with manual alignment, produces a single pulse speckle contrast with amplification in an amplification gain medium that is 2.50× smaller than the seed laser alone. This reduction is the equivalent of 6.3 uncorrelated sub-pulses. Some of this contrast reduction is due to the weak line content from the XeF power oscillator used for testing the effects of the oscillation amplification stage, but most is believed to be due to the static fan out effect. Likely, many of the sub-pulses created by the OPuS-like static fan out characteristics of the OC-Rmax (OC-rear cavity mirror) reflections are all amplified to nearly equal intensities and thus create more equivalent independent pulses than shown in the above table.

Figure 37:
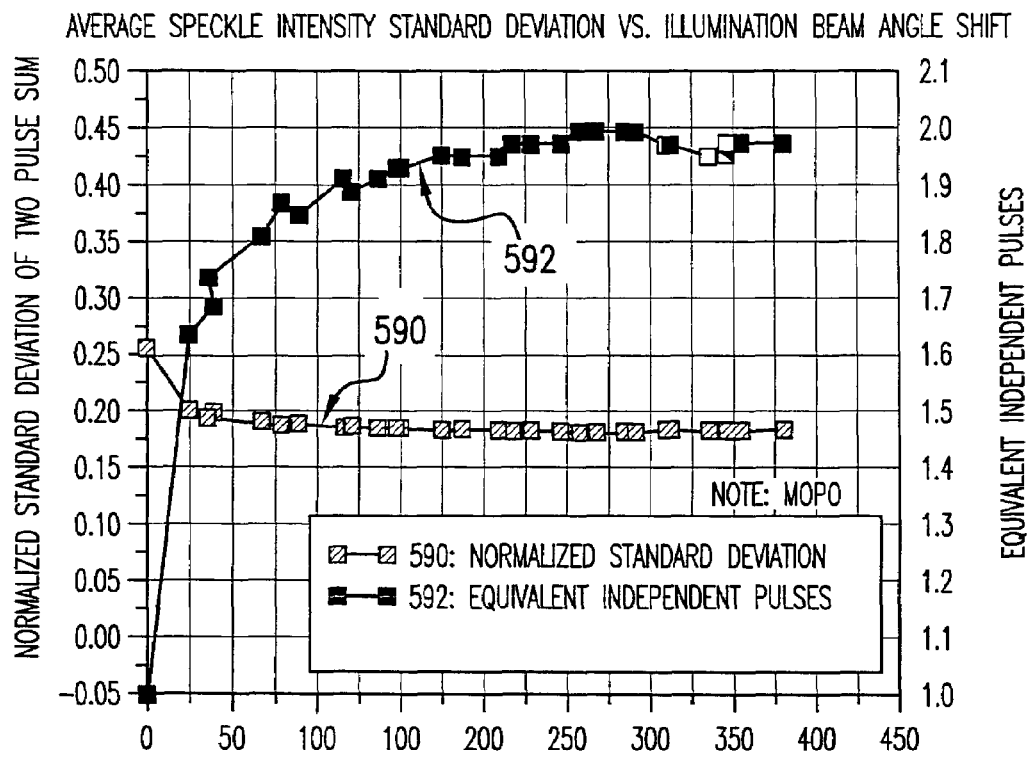
FIG. 37 illustrates exemplary coherency busting test results according to aspects of an embodiment of the disclosed subject matter.

Tilt angle required to produce uncorrelated speckle patterns may be significant. The first big jump in equivalent pulses, from 1.0 to 1.55, is believed by applicants to be mostly due to the poor pulse-to-pulse repeatability of the speckle patterns when running as a MOPO. Even without changing the mirror tilt at all, two pulses are correlated no better than 30-35%. With seed only, this pulse-to-pulse correlation has been found to be about 85-90%. The long slow rise in equivalent pulse number does not even reach a value of 2.0 until about 400 μrad of mirror tilt as illustrated, e.g., in FIG. 37. This result could mean, e.g., there may be a need for a large angular sweep, of about ±500-1000 μrad, e.g., to create several uncorrelated speckle patterns in a single pulse.

Through experimentation relating to coherence applicants' employer has learned that, e.g., sub-pulses produced by a pulse stretcher are incoherent and lead to a different fringe pattern if their angles are slightly shifted. The pin hole fringe pattern shifts maximum to minimum when input angle is $\lambda/2d$.

Figure 18:
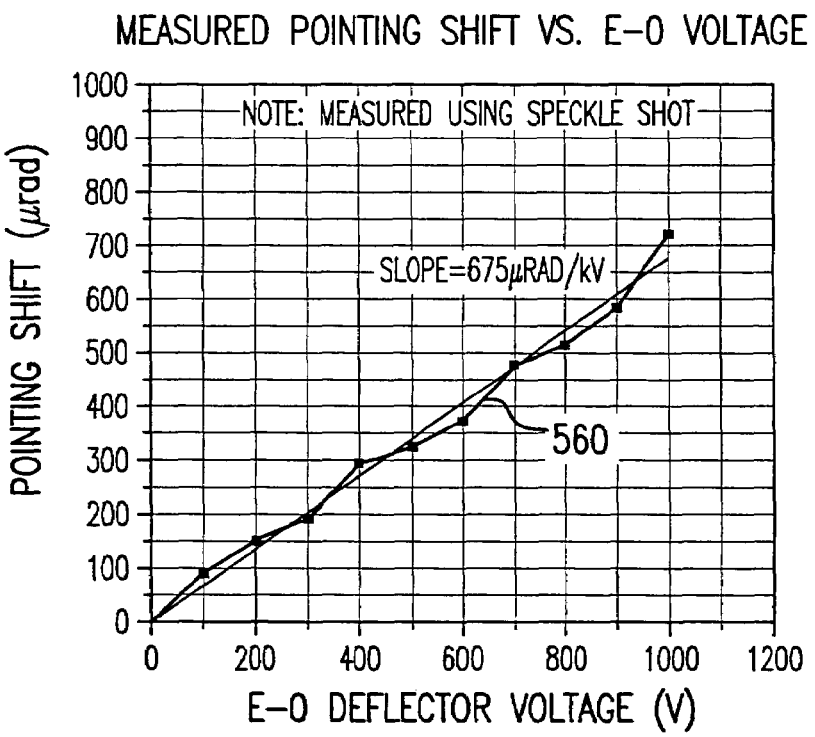
FIG. 18 illustrates pointing shift relative to E-O voltage according to aspects of an embodiment of the disclosed subject matter.

A plot of pointing shift (inferred by applicants from speckle shift measurements) v. E-O cell applied voltage is shown in FIG. 18. According to aspects of an embodiment of the disclosed subject matter applicants propose to sweep the pointing of the seed laser within a single pulse in order to reduce the speckle contrast within. This may be done, e.g., with electro optical elements, e.g., elements 712 and 714 shown illustratively in the schematic and partly block diagram illustration of aspects of an embodiment of the disclosed subject matter found in FIG. 23. Using vertical expansion prior to input of a seed laser pulse into an excimer power oscillator, e.g., a XeF chamber, placed as close to an input coupler, e.g., a beam splitter, and with a clear aperture of the E-O deflector at around 3.2 mm in diameter, the deflector may have to be upstream of the vertical expansion (not shown in FIG. 23). To minimize any translation in the oscillator cavity, e.g., the XeF cavity 730, e.g., associated with the angular tilt from the E-O deflector, it may be desirable to place the E-O deflector as close to the amplifier cavity as possible.

Use of a solid state laser source for lithography has been proposed in the past and not pursued for two reasons. Solid state lasers are not considered capable of the high average power required for lithography and a solid state laser produces single mode output which is highly (perfectly) coherent. According to aspects of an embodiment of the disclosed subject matter applicants propose to address the low average power problem with, e.g., a hybrid solid state seed/excimer amplifier combination. The high coherence properties of the solid state seed can be addressed in a number of ways according to aspects of embodiments of the disclosed subject matter, e.g., by creating sub-pulses, e.g., that are separated in time longer than the coherence length along with changing the seed laser pointing, e.g., over very short time scales, e.g., within a single laser pulse, or a combination of both. Coherency busting has been found by applicants to be of benefit in dual chamber gas discharge (e.g. excimer) seed/gas discharge (e.g., excimer) amplifier portion lasers as well.

Figure 22:
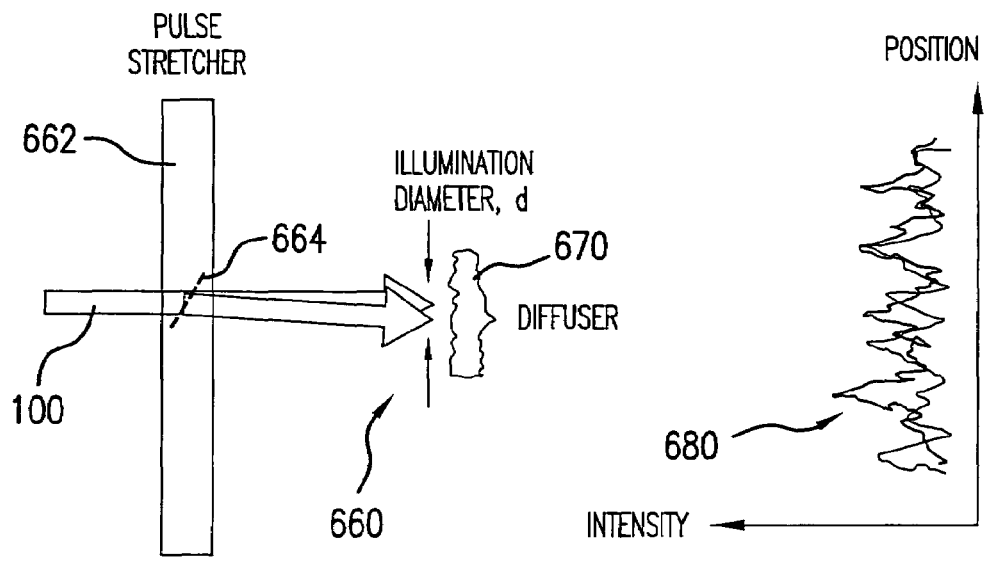
FIG. 22 illustrates the effect of beam sweeping/painting on coherency according to aspects of an embodiment of the disclosed subject matter.

De-phasing of a speckle pattern can be seen from a diffuser 670 to occur with a $\lambda/2d$ where d is the illumination length of a slit aperture or diameter of a circular aperture, e.g., as illustrated schematically and in cartoon fashion in FIG. 22. Incoherence of a speckle pattern can also be seen to occur from each sub-pulse produced by a pulse stretcher, which can, e.g., be further exploited by, e.g., intentionally misaligning each pulse stretcher, e.g., a mirror(s) in the pulse stretcher, by a very slight amount. In point of fact, applicants' employer has discovered by testing that it is very hard to precisely align the mirrors in, e.g., an 4×$T_{is}$ OPuS type of pulse stretcher, and they are slightly out of alignment almost all the time, without having to intentionally misalign them. This amount of "ordinary" misalignment has been found by applicants employer to be an amount sufficient to achieve a desired level of speckle reduction and is illustrated schematically in FIG. 26, as discussed above.

The effective number of equivalent independent laser pulses can be seen to be equal to the $T_{is}$ magnification of the each pulse stretcher. Each OPuS pulse stretcher of the kind noted above may have a multiplication of around ~2.4×. With, e.g., three stages of pulse stretching, the number of independent sub-pulses will be $(2.4)^3=13.8$. Since speckle contrast scales with the number of independent sub-pulses, N, as $1/\sqrt{N}$, pulse stretchers can provide an output speckle contrast of $1\sqrt{13.8}=26.9\%$ with an input speckle contrast of 100%. Since this may still be too high a speckle contrast, according to aspects of an embodiment of the disclosed subject matter a mechanism(s) may be provided to reduce the speckle contrast into or out of the pulse stretcher(s). The same can be said for the so-called mini-OPuSs discussed elsewhere.

Pulse trimming has been demonstrated, e.g., with the utilization of electro-optics, e.g., at 193 nm. Rather than polarization rotation, used in some other forms of pulse trimming, electro-optics can be used for beam steering, e.g., steering a seed laser light pulse beam within a single pulse in the beam. Utilization of such, e.g., at the output of the seed laser, can result in, e.g., according to aspects of an embodiment of the disclosed subject matter, the electro-optic material(s) only needing to be subject to a low average power seed laser beam. By, e.g., randomly and/or continuously changing the beam steering, e.g., within a single laser pulse, the angular acceptance of the power amplification stage can be "painted" or filled in for each laser pulse. As a result, a main pulse can have a divergence set, e.g., by the PO/power amplification stage optical configuration and not, e.g., by the seed laser characteristics. A greatly reduced coherence for the laser system output laser light pulse can be the result.

According to aspects of an embodiment of the disclosed subject matter an injection controlled amplifier laser system, e.g., with a plane cavity and flat rear mirror, may have suitable energy stability, e.g., for seed pulse inject energies in the range of 0.0085 to 0.99 mJ. This energy of the beam may be, e.g., incident on the rear mirror of, e.g., a power amplification stage, which may form the input coupler from the seed laser. This reflector may have, e.g., about a 90% reflection and about 10% transmission. Therefore, the seeding energy entering the amplification stage cavity itself may be, e.g., about an order of magnitude smaller than what is incident onto the back reflector. With a ring cavity, especially with a partially reflecting seed injection mechanism according to aspects of an embodiment of the disclosed subject matter, discussed elsewhere herein, e.g., the input seed energy may be much less wasted, e.g., about 80% is injected to the amplification stage. An Rmax and OC can be in an $F_2$ containing environment, and thus more robust, though, e.g., if polarization coupling is used, coupling efficiency may still be less than optimum for certain applications. A suitable architecture, e.g., in a MOPA configuration may be a 2-channel ("tic-toc") solid state seed laser, e.g., a $3^{rd}$ harmonic Nd:YLF MO or Nd:YAG system (tuned, e.g., to 351 nm) along with a pair of two 3-pass XeF PA modules. Such a system in a MOPO, e.g., a master oscillator/power amplification stage (such as a ring power oscillator amplification stage) configuration is also considered as an effective alternative. Such a two channel MOPO approach may be similar to the MOPA configuration, i.e., with two seeded power oscillators. Various coupling techniques could be used, e.g., MO coupling using a polarization technique or a seed inject mechanism. Efficiency v. $E_{mo}$ for differing PO/PA configurations has been found to be better for a MOPO or a three pass MOPA, though four pass MOPAs were not tested. Exemplary pulse width (FWHM) has been found to be for an MOPO about 17.3 ns, for a MOPA, single pass, about 13.9 ns and for a MOPA triple pass about 12.7 ns.

Applicants have examined speckle patterns for decorrelation with angular shift, e.g., in a MOPO output beam, e.g., with a Nd—YLF seed laser and a XeF power oscillator (e.g., a flat-flat polarization coupled arrangement). With the relative timing between the XeF discharge and the seed laser pulse adjusted and angular and spatial adjustment also made for maximum suppression of the weak line (353) produced by the XeF gain.

The maximum intensity of the seed pulse has been observed to occur during the initial, very low level, fluorescence of the amplification stage. This very low level fluorescence (and thus gain) is believed to be enhanced by this seed light, as observed in MOPO output. Adjustment of the timing of the seed earlier than or later than, e.g., about 20 or so ns before the amplification stage firing can, e.g., lead to an increase in weak line output.

According to aspects of an embodiment of the disclosed subject matter coherence busting may be accomplished by beam steering, e.g., with electro-optical elements, e.g., pointing of the seed beam during a single pulse using, e.g., a ConOptics E-O deflector assembly matched for the desired nominal center wavelength. Such E-O devices may be like those used in CD and DVD writers that use a doubled Ar-ion line near 351 nm having E-O deflectors used to modulate the beam. With a pointing coefficient of, e.g., about 0.6 μrad/volt and with a capacitance of 50 pF, even a full mrad of deflection requires only 1,700V. A drive circuit useful for pulse trimming, e.g., as illustrated schematically in FIG. 40 (discussed in more detail elsewhere in the present application) can be used, e.g., with a resister in series to produce a controlled sweep rate, e.g., during a single pulse. The seed pulse duration can be around 15 ns, so the rate of rise is well within the capabilities of such a driver, for reasonable pointing changes, such as up to a m Rad. With a pumping diode current of around 30 A and 4 A to the oscillator pump diode, the seed laser output laser light pulse beam pulse energy was determined to be 1.2 mJ, sufficient for seeding a gas discharge laser, e.g., a XeF gas discharge laser.

Figure 34:
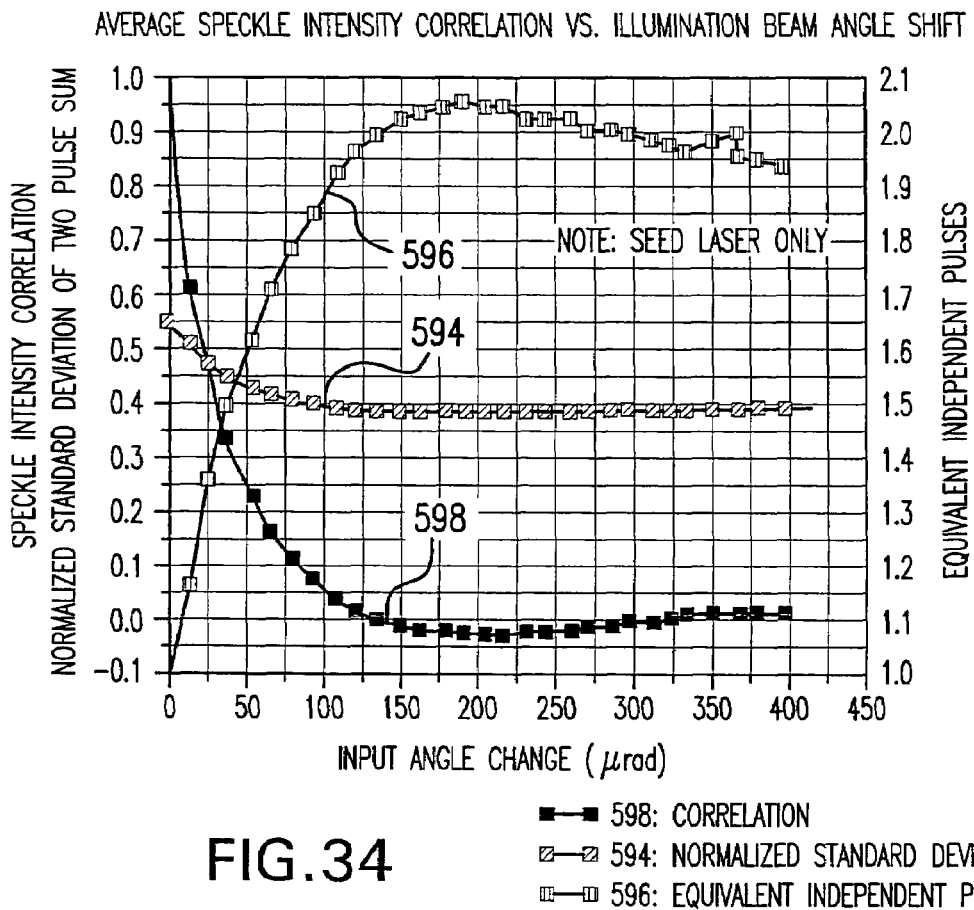
FIG. 34 illustrates exemplary coherency busting test results according to aspects of an embodiment of the disclosed subject matter.
Figure 36:
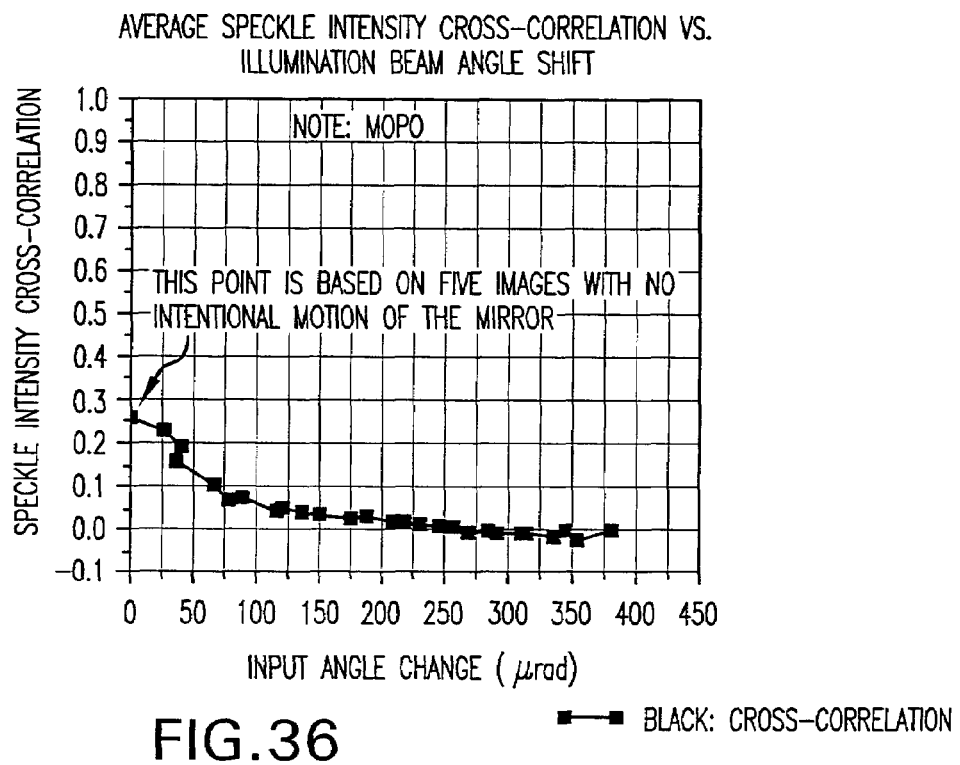
FIG. 36 illustrates exemplary coherency busting test results according to aspects of an embodiment of the disclosed subject matter.

A plot of speckle contrast (average speckle cross-correlation versus mirror tilt—input angle change) for a MOPO configuration is shown by way of example in FIG. 36. A similar plot for only a seed laser pulse passing through an amplifier gain medium in an oscillator configuration, but without excitation of the amplifier gain medium is illustrated by way of example as plot 590 in FIG. 37, which also shows by way of example a plot 592 of equivalent independent pulses. A similar plot is shown in FIG. 34, for the seed laser pulse only in the PO, with curve 596 being the equivalent independent pulses, curve 594 being the normalized standard deviation and curve 598 being the cross correlation. Similar to the MOPO case, it takes about 150-250 μrad of tilt to produce completely or essentially completely uncorrelated speckle patterns and about two equivalent independent pulses. But, as described above, the starting speckle contrast for no shift may be smaller than with the OC reflection only by a factor of about 1.25. Thus according to aspects of an embodiment of the disclosed subject matter applicants have discovered that, e.g., a MOPO single pulse speckle contrast may be significantly lower than a seed-only case, because, e.g., static fan out of the rays produced by the multiple OC-Rmax-OC-Rmax reflections, e.g., because each of these reflections exit at the illustrated separate slightly different angle, producing uncorrelated speckle patterns as shown by way of example in FIG. 26.

According to aspects of an embodiment of the present application applicants believe that this discovery may be utilized to greatly simplify the necessary coherence busting scheme. Instead of creating the electro-optic capability of, e.g., steering and/or more rapidly modulating ("hybrid painting," in the case of using both), e.g., the entire divergence space, e.g., in one or both axes (e.g., requiring high frequency devices), one can slightly misalign the seed to the PO, e.g., in one axis or the other or both, to exploit this spreading static ray out effect, the so-called hall of mirrors effect. It may then also be possible to use, e.g., only a linear sweep of pointing along one axis or the other or both, e.g., where the one axis is the other axis in the case of spreading only in one axis, with, e.g., a greatly reduced requirements on the E-O drive electronics. In the simplest case, misalignment spreading (beam fan-out so-called hall of mirrors effect, may be employed in only one axis and "singly painting" in the other, e.g., with a saw tooth signed to a tilt mirror and without AC creating hybrid painting. More complex permutations and combinations of these coherency busting techniques may also be applicable.

Figure 38:
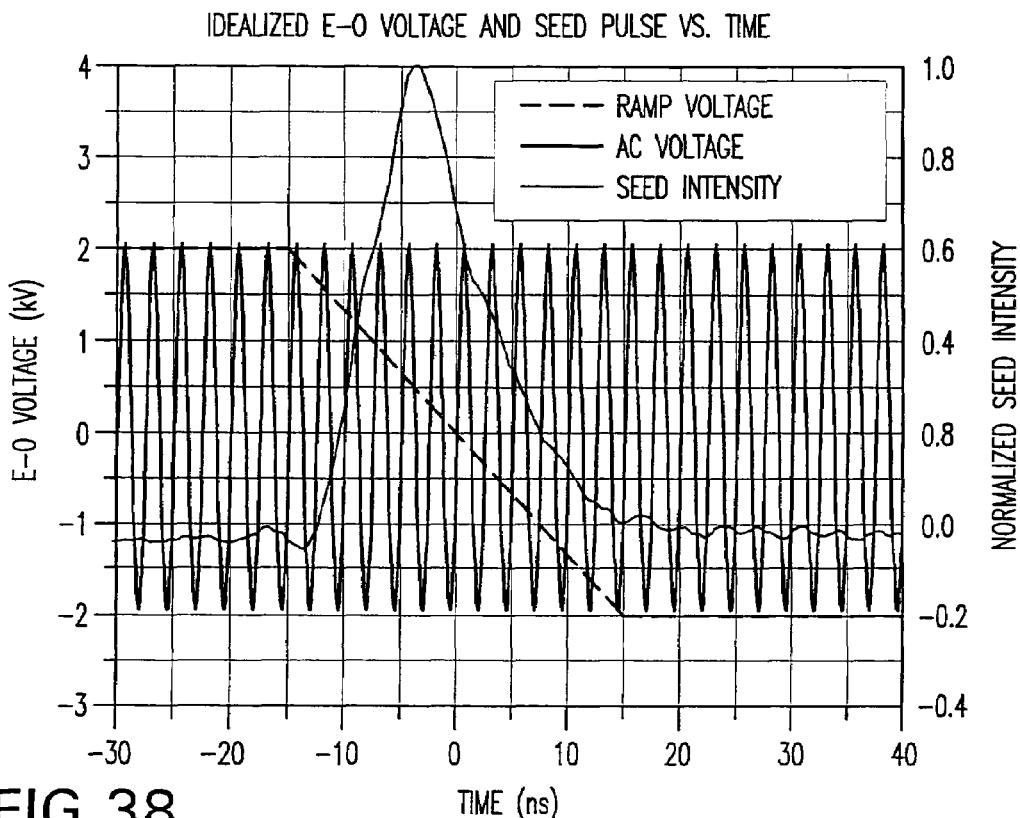
FIG. 38 illustrates a simulated E-O supply voltage with respect to a seed pulse intensity over time, according to aspects of an embodiment of the disclosed subject matter.
Figure 39:
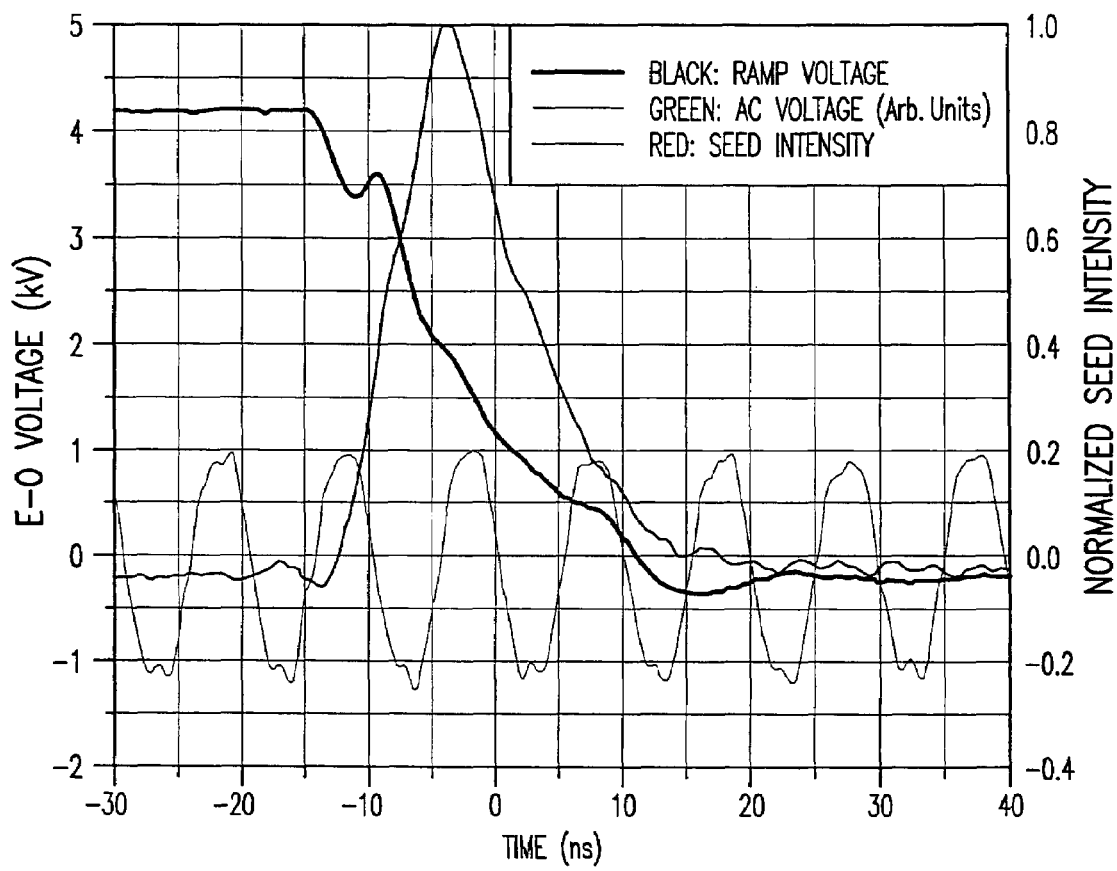
FIG. 39 illustrates a test E-O supply voltage with respect to a seed pulse intensity over time, according to aspects of an embodiment of the disclosed subject matter.

FIG. 38 gives an example of an idealized high frequency painting E-O voltage signal superimposed on a ramped (time varying) E-O DC voltage signal in relation to the intensity of the seed pulse being "painted", e.g., into a delay path or into the amplifying gain medium, e.g., a PA or PO or other power amplification stage. The ramp voltage may be created, e.g., by a fast R—C decay of an E-O cell capacitance as illustrated schematically in the circuit of FIG. 40. Due to certain constraints on a test circuit that applicants have so far built and tested, e.g., limited RF frequency, impedance mismatch, E-O load cell capacitance mismatch and the like, the actual voltages delivered by the "painting" circuit are shown in FIG. 39, as best as could be measured considering difficulties with probe loading, etc. These are approximately 25% of the needed RF frequency (e.g., about 100 MHz as opposed to 400 MHz) and 10% of the needed peak to peak voltage (e.g., around ±200 kV as opposed to ±2000 kV). The painting voltages could, of course, be better optimized, however, the test circuit was used to demonstrate the effectiveness of "painting" the seed beam into the amplifier gain medium for coherency/speckle reduction, e.g., with hybrid painting using both time varying DC steering and AC modulation, e.g., one in one axis and the other in a second axis, e.g., orthogonally related to each other.

Applicants experimental measurements have determined that with no ramp and no AC voltage the 2D speckle contrast overall is 76.8% and varies from the horizontal to the vertical axis. With painting using the ramp alone the speckle contrast overall was 29.4%, again varying in the two axes. Painting with the AC alone gave a speckle contrast overall of 59.9%, again varying in the two axes. With the ramp and AC voltages applied the spectral contrast was 28.1% overall and varying in both axes. This was using a less optimized circuit than the one of FIG. 40, which was not available for the testing and the actual tested circuit test results are shown in FIG. 39.

Figure 40:
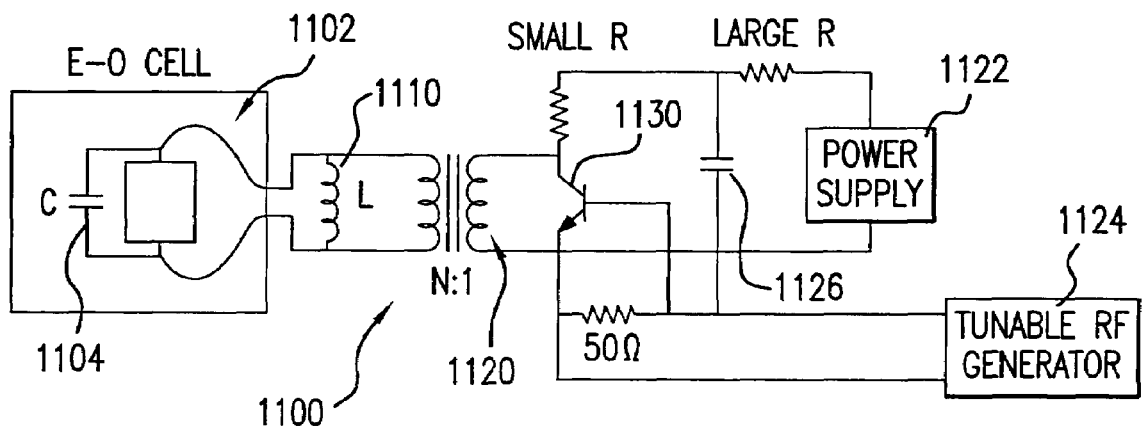
FIG. 40 illustrates a E-O cell drive circuit according to aspects of an embodiment of the disclosed subject matter.

Applicants believe that a more optimized circuit, shown by way of example in FIG. 40, will even improve further the reduction in speckle contrast. The circuit 1100 of FIG. 40 may include, e.g., an E-O cell, such as noted above, with an E-O cell capacitance 1104 and an impedance matching inductor 1110, and an N:1 step-up transformer 1120. Also included as illustrated may be, e.g., a DC power supply 1122 charging a capacitor 1126 through a large resistor 1130 and an RF frequency generator connected to a fast acting switch, e.g., a transistor 1140 (in reality a bank of transistors in parallel), through a 50Ω resistor. Also the capacitor 1126 discharges through a small resistor 1142 when the switch 1140 is closed.

According to aspects of an embodiment of the disclosed subject matter "painting" may also be done upstream of the amplifier gain medium, e.g., by tilting a mirror upstream of the amplification, e.g. a piezo-electrically adjustable mirror. The results with the seed only, both with OC only and with OC plus Rmax reflections, look very similar to those measured by applicants such as with tilting a mirror, e.g., through a diffuser as illustrated in FIG. 22. As with the previous measurements, the OPuS-like characteristics of the OC-Rmax reflections can be seen to lead to single-pulse speckle contrast values reduced by the equivalent number of sub-pulses produced. The angular tilt required to produce uncorrelated speckle patterns was determined to be about 200-250 μrad, again similar to the results with tilting the mirror, e.g., downstream from the power amplification stage.

Applicants have performed characterizations of a solid state MO./power amplification stage using an excimer seed laser, e.g., greatly attenuated to simulate the expected pulse energy of, e.g., a 193 nm solid state laser. The pulse duration produced, however, did not match that expected from a 193 nm solid state laser. Applicants believe that proper simulation of the seed pulse duration should further reduce the total seed laser energy required for MO/power amplification stage operation. Using a pulse trimmer, e.g., a Pockels cell to which was applied a step voltage, e.g., timed to trim the later portion of the excimer seed pulse shape (¼λ voltage=2.5 kV), and due to the rise time of the excimer seed laser pulse and the fall time of the Pockels cell, the shortest practical pulse shape attained was about 9 ns FWHM and ~15 ns foot-to-foot. Trimming the later portion of the seed pulse was determined to have virtually no impact on the MO/power amplification stage output pulse characteristics, e.g., intensity, even with approximately 25% of the seed pulse energy eliminated. However, as noted elsewhere in the present application pulse trimming may further reduce speckle by eliminating a portion(s) of the output pulse with the greatest coherency (least speckle contrast).

Required limits on ASE as currently understood are believed to be attainable with around 5 uJ of seed laser energy and below, e.g., with a long seed pulse shape. Saturation test results have shown applicants that output energy can be attained and the same ASE upper limit levels can be achieved with only 3.75 uJ of seed laser energy when using a short duration seed pulse. Further reductions in seed pulse duration might be possible, resulting in even smaller seed energy requirements. However such further reductions in seed energy may be unnecessary since applicants envision using 10 uJ of solid state 193 nm seed energy. Shorter pulse durations may prove difficult since, e.g., two stages of mini-OPuS may be used, e.g., between seed laser and the power amplification stage, with a requirement that the delay length of each mini-OPuS be greater than the seed laser pulse duration, the resulting stretched pulse then being approximately 10 ns FWHM.

Figure 19:
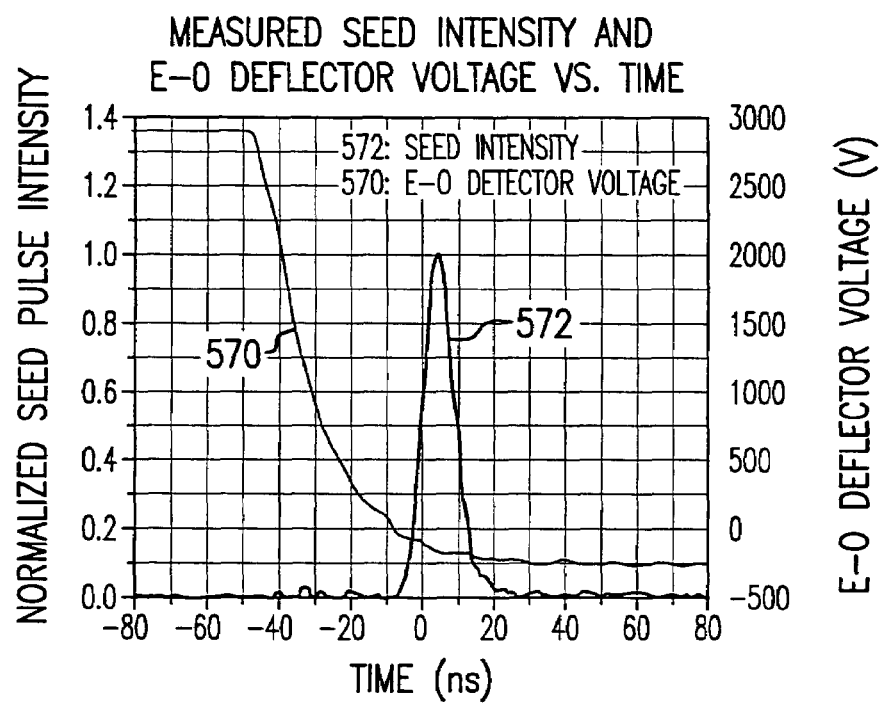
FIG. 19 illustrates an example of the timing of an E-O deflection voltage and a seed laser pulse spectrum according to aspects of an embodiment of the disclosed subject matter.

According to aspects of an embodiment of the disclosed subject matter it is contemplated to apply a time changing voltage on a timescale similar to the seed pulse duration, e.g., by applying a DC voltage level until triggered, at which point the high voltage may be shorted to ground, e.g., via a stack of fast MOSFETS, e.g., illustrated schematically in FIG. 40 as a single transistor 1130. A plot of the applied voltage and the seed laser pulse shape are shown in FIG. 19. Placing a series resister between the E-O cell terminal and voltage supply can be used to control, e.g., the voltage slope applied to the E-O cell. The 50 pF capacitance of the E-O cell in series with, e.g., a 200Ω resister gives an initial slope of about $10^{11}$ μrad/s. The voltage across the E-O cell drops, e.g., as seen in FIG. 19 from the DC level to nearly zero in a time similar to the seed pulse duration. By changing the relative timing between the E-O cell pulser and the seed laser one can, e.g., change the amount of pointing sweep that occurs during the seed pulse. In addition, one can change the value of the initial DC voltage to effect a greater or lesser pointing sweep during the seed pulse. Applicants have tested this fast pointing capability, e.g., with the seed laser only and reflecting from an OC only, therefore, with no OPuS effect from the multiple reflections from the OC and Rmax and no effects due to MOPO operation. Without optimizing for relative timing between the E-O cell and the seed pulse, applicants captured speckle patterns for a range of timing between the two. Applicants applied three difference levels of DC voltage to the E-O cell in order to change the maximum available pointing slope. The results showed a minimum speckle intensity normalized standard deviation at about 57 ns relative timing. Without any angular shift during the seed pulse, at both small and large relative timing values, below and above 57 ns the speckle contrast is high. This correlates with values found by applicants during static testing. When, e.g., the relative timing places the E-O Cell voltage slope coincident with the seed pulse, the speckle pattern of a single pulse is smeared in the vertical direction, in a dramatic and satisfactory way.

One can normalize these contrast values to the maximum value in order to evaluate the percentage reduction in contrast, e.g., brought about by the dynamic pointing shift. At the optimum relative timing point the speckle contrast was found to be reduced to about 40% of its peak. Using the $1/\sqrt{N}$ assumption for equivalent number of independent pulses the data can be used to derive the number of pulses required to achieve this level of speckle contrast reduction. At the optimum relative timing, and with 3 kV applied to the E-O cell, the contrast reduction was found to be equivalent to 6 pulses. Even higher voltage levels (and thus even larger pointing shift during a single pulse) could improve this result. Applicants performed similar measurements with the seed laser pulse entering the power amplification stage cavity, but no discharges between the amplification stage electrodes and noted that reflections from the OC and the Rmax in the XeF cavity, from the OPuS effect, beam spreading alone, indicated that the maximum speckle contrast was reduced by the amount predicted by the OPuS effect (N=1.56 with a 20% OC, giving $1/\sqrt{n}$=0.80. Thus 70% contrast becomes 56%). The effect of smearing, even though the initial speckle contrast is lower, appears not to change when adding the secondary reflections from the full. XeF cavity. The equivalent pulse for speckle reduction is still about 6.

Figure 17:
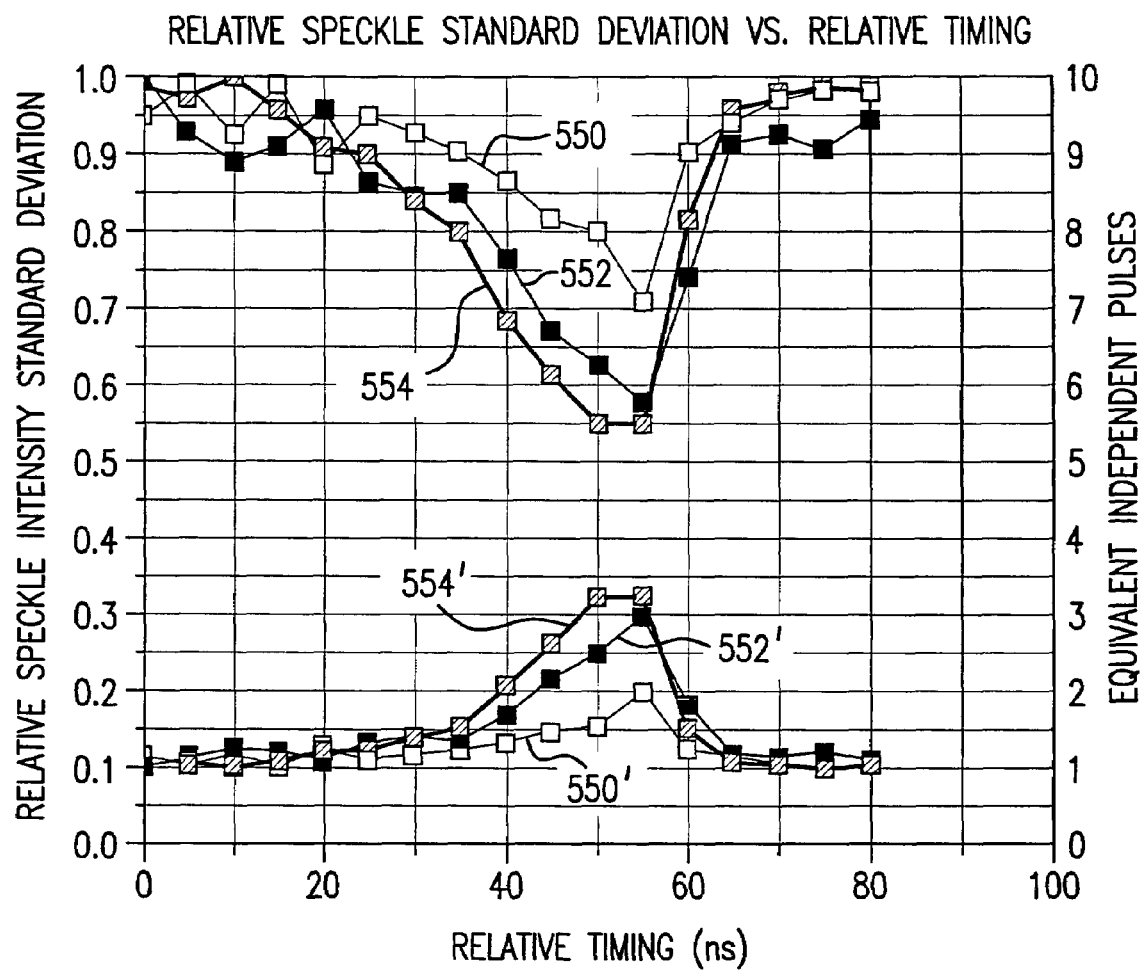
FIG. 17 illustrates relative speckle intensity for a various E-O deflector voltages related to relative timing between the EO and the pulse generation in the seed laser according to aspects of an embodiment of the disclosed subject matter.

Applicants performed similar measurements with amplification stage cavity electrodes discharging and thus implicating the effects of the amplification within the amplification stage cavity, which indicated as shown in FIG. 17 the decrease in the impact on speckle reduction through seed beam sweeping. With such a configuration, the effect was found to be just over half of the equivalent number of pulses produced, i.e., about 3, when operating as a MO/amplification stage, also found was a rather large reduction in peak speckle contrast, with no smearing. Previous measurements of MO/amplification stage operation showed a reduction equivalent to about 6 pulses. These results show a reduction equivalent to about 8 pulses. Applicants suspect that the amplification stage cavity may discriminate against off-axis ray angles, e.g., in a flat-flat cavity, and thus the spray of angles sent into the cavity may not all be equally amplified (this could be corrected, e.g., with a true stable cavity, e.g., employing a curved OC and a curved Rmax). Another explanation may be that not all of the seed pulse takes part in controlling the amplification stage characteristics. May be only, e.g., the first 5 ns of the seed pulse's 10-15 ns pulse duration controls the amplification stage and thus the E-O sweep is not fast enough to occur within that smaller window. This may also be corrected, e.g., by using a smaller resister and a shorter sweep.

Referring to FIG. 35, a beam mixer 1050 is shown for operation on a beam 1052 (which for illustrative purposes has been shown as having an upper white half and a lower black half). As explained in greater detail below, the beam mixer 1050 can be used to alter the intensity profile of a beam, e.g. improving intensity symmetry along a selected axis of a beam, and can be used to reduce beam coherency, or both. For the embodiment shown, the beam mixer 1050 includes a beam splitter 1054 and mirrors 1056a-c.

For the arrangement shown in FIG. 35, the beam can be initially incident upon the beam splitter 1054 whereupon a portion of the beam may directed, via reflection, toward mirror 1056a and the remainder 1066 is transmitted (, e.g., with substantially no change in direction) through the beam splitter 1054 and exits the beam mixer 1050 on an output beam path. In one setup, a beam splitter 1054 reflecting about forty to sixty percent of the incident light, e.g. fifty percent, may be used. For this setup, about fifty percent of the initial beam incident upon the beam splitter 1054 is directed toward the mirror 1056a. For the beam mixer 1050, mirrors 1056a-c may typically be flat, maximum reflectivity mirrors. As shown in FIG. 35, mirror 1056a may be positioned and oriented to receive light from the beam splitter 1054 at an angle of incidence of approximately thirty degrees. As further shown, mirror 1056b may be positioned and oriented to receive light reflected from mirror 1056a at an angle of incidence of approximately thirty degrees, and mirror 1056c may be positioned and oriented to receive light reflected from mirror 1056b at an angle of incidence of approximately thirty degrees.

Continuing with FIG. 35, light reflected from mirror 1056c can be made to be incident upon the beam splitter 1054 at an angle of incidence of about forty-five degrees. For a fifty percent reflectivity beam splitter, about half of the light from mirror 1056c is reflected onto the output beam path 1066 and about half of the light from mirror 1056c passes through the beam splitter 1054 on a beam path toward mirror 1056a, as shown. Thus, the output beam path includes a combined beam containing the portion of the initial beam 1052 that passed through the beam splitter 1054 and the portion of light from mirror 1056c that is reflected from the beam splitter 1054. Similarly, the light on the path from the beam splitter 1054 to mirror 1056a includes a combined beam containing the portion of the initial beam 1052 that is reflected by the beam splitter 1054 and the portion of light from mirror 1056c that is transmitted through the beam splitter 1054.

The beam entering the beam mixer 1050 in FIG. 35 is shown illustratively as having a rectangular cross-section that defines a long axis 1058. This type of beam is typical of a laser beam produced by an excimer laser with the long axis corresponding to the direction from one discharge electrode to the other. A typical beam may have dimension of about 3 mm by 12 mm. Moreover, for the output of an excimer laser, the intensity profile in one axis, e.g., the long axis 1058 is typically unsymmetrical, whereas the intensity profile in the other axis, e.g., the short axis (i.e. the axis normal to the long axis 1058) is approximately Gaussian. Although the beam mixer 1050 shown is particularly suitable for improving symmetry of a high power excimer discharge laser, it is to be appreciated that it can be used in conjunction with other types of laser systems and for other applications, for example, the beam mixer may be used to reduce coherency in a beam generated by a solid state laser.

Figure 47:
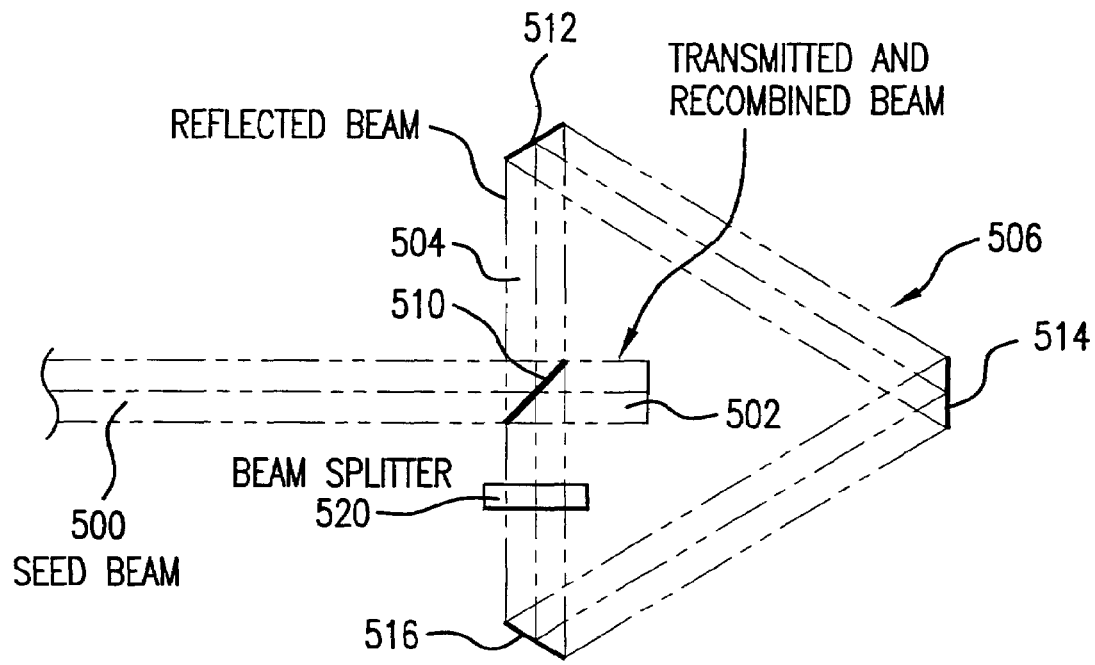
FIG. 47 shows schematically a coherence buster optical delay path according to aspects of an embodiment of the disclosed subject matter.

FIG. 35 shows that the beam extends along the axis 1058 from a first edge 1060 to a second edge 1062. FIG. 35 also shows that the mirrors 1056a-c establishing a spatially inverting path which has a beginning 1064 and an end 1066. As FIG. 35 illustrates, the inverting path may be characterized in that a part of the beam near the first beam edge 1060 at the beginning 1064 of the inverting path translates to the second beam edge at the end 1066 of the inverting path. More specifically, for the mixer 1050 shown, a photon at the 'top' of the beam which strikes mirror 1056a translates and leaves mirror 1056c at the 'bottom' of the beam. Since the inverting path constitutes a delay path, there will be some temporal stretching of the pulse, however, this can be minimized by minimizing the delay path, e.g., to a length of about a ns or so with suitable delay path time, etc., as noted elsewhere, the beam mixer 1050 could form a coherence buster mini-OPuS, e.g., as discussed in regard to FIG. 47.

Figure 15:
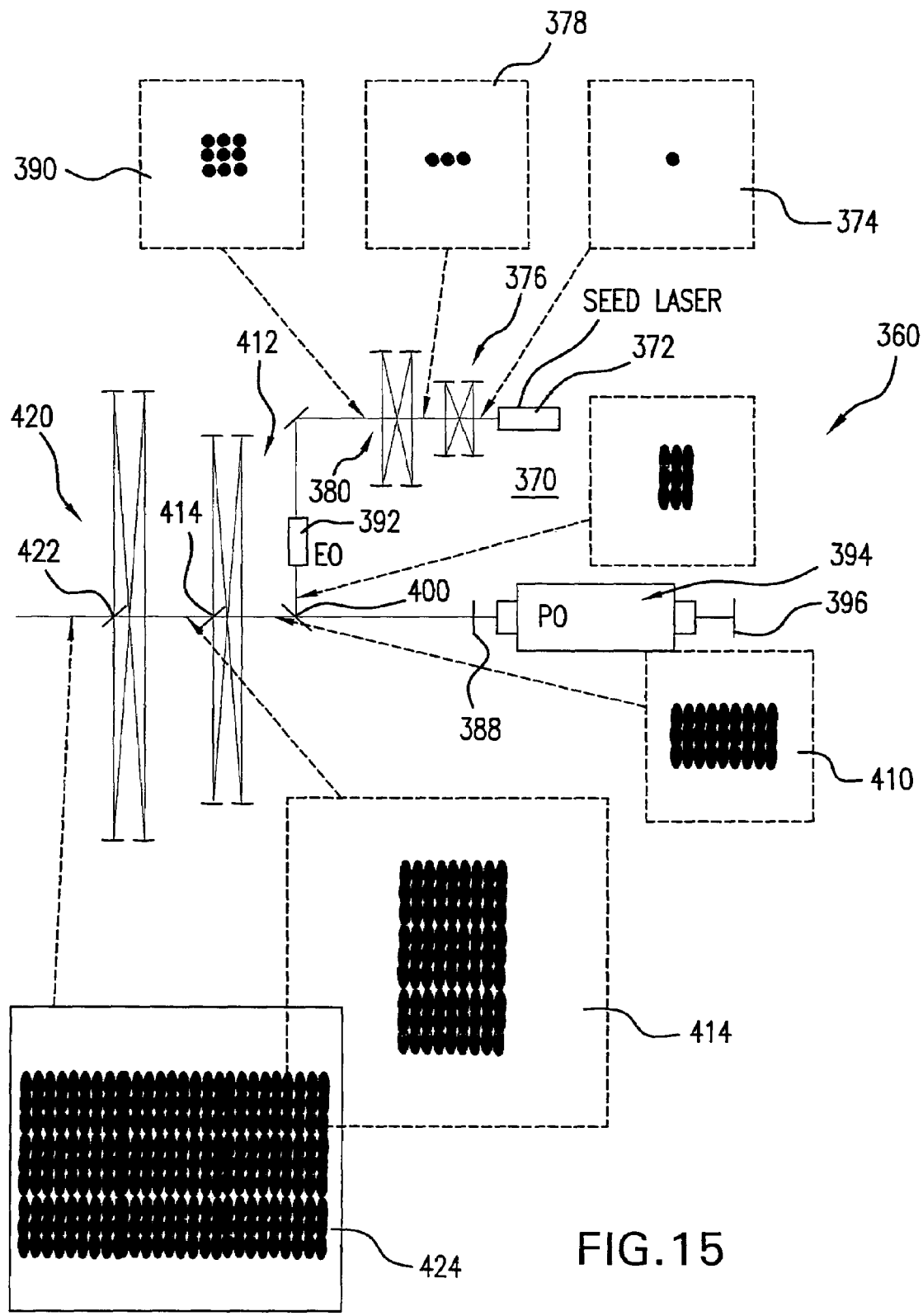
FIG. 15 shows partly schematically and partly in block diagram for an example of elements of a coherence busting scheme and the results of aspects of the scheme according to aspects of an embodiment of the disclosed subject matter.

The beam mixer 1050 may be placed in between the seed beam laser portion and the amplifier laser portion of a MOPA or MOPO configured multi-chambered laser system, or other master oscillator amplification gain medium arrangements, e.g., with a power amplification stage, such as a ring power amplification stage, such as that shown in FIGS. 15, 16, 23, 25 27 and 28. Specifically it may be substituted for the mini-OPuS (376 and/or 380) of FIG. 15. As an example, either or both of the short delay path pulse stretchers 376, 378 inserted between the MO 372 as shown in FIG. 15 and the PO amplifier portion 394 of the multi-chamber laser system of FIG. 15 may have substituted for it the beam mixer 1050 of FIG. 35.

FIG. 15 shows partly schematically and partly in block diagram form an example of a coherence busting scheme 360 and the results of aspects of the scheme according to aspects of an embodiment of the disclosed subject matter, e.g., in terms of beam divergence and thus coherence busting. The illustrated system may incorporate, e.g., an oscillator/amplifier laser 370, e.g., including a solid state or excimer seed laser 372, and an oscillator amplifier laser 394, or other power amplification stage, e.g., a ring power amplification stage. The amplifier gain medium 394 may be, e.g., an excimer laser arranged in a power oscillator configuration, e.g., with a fully reflective rear cavity mirror 396 and an input/output coupler, e.g., a partially reflective mirror 398. It will be understood that other seed laser/amplification stage arrangements, some of which are discussed herein, may also be used with the schematically illustrated coherence busting scheme shown by way of example in FIG. 15.

At the output of the seed laser 372 is illustrated a representation of the seed laser output laser light pulse beam pulse coherency 374 containing a single dot indicative of relatively high coherency. The output of the seed laser 372 may be passed through one or more coherency busters, e.g., 376, 378, e.g., as shown by example in FIG. 9, or 1050 illustrated in FIG. 35 (discussed in more detail in the co-pending application noted above, 11/471383 or other optical arrangements such as disclosed in US20050286599, referenced above, or one or more mini-OPuS coherence busting mechanisms discussed above, or combinations thereof. A possible embodiment according to aspects of an embodiment of the disclosed subject matter may be the use of a confocal OPuS, e.g., one like that disclosed in the co-pending U.S. patent application Ser. No. 10/847,799, entitled LASER OUTPUT LIGHT PULSE STRETCHER, filed on May 18, 2004, referenced above, with, e.g., two confocal spherical mirrors and four passes of delay path, i.e., from the beam splitter to mirror No. 1 to mirror No. 2 back to mirror No. 1 and back to mirror No. 2 and then returned to the beam splitter, passing through, e.g., an offset correction optic, e.g., as discussed in the co-pending U.S. patent application Ser. No. 11/394,512, entitled CONFOCAL PULSE STRETCHER, filed on Mar. 31, 2006, referenced above. This version of a so-called "mini-OpuS" may comprise two pulse stretchers in series, e.g., with a delay path offset selected to interleave the high frequency peaks in the temporal pulse intensity curve of the output of the master oscillator, such that individual mini-peaks superimposed on the general humped or multi-humped shape of the output pulse from the MO become interleaved in the treated pulse, with advantages in reducing speckle. This may be achieved by, e.g., a delay offset of about 2 ns for a first one ns and then three ns delay line mini-OPuS pair or about a 1 ns delay between a 3 ns and 4 ns delay line mini-OPuS pair in series or for a 4 ns and 5 ns delay line mini-OPus pair in series. It will be understood that the pulse itself will not be stretched sufficiently to overlap other pulses, but rather sill essentially not be stretched at all, since the delay path is so much shorter than the ten or so meters of delay path in the normal pulse stretching OPuSs currently sold by applicants' assignee.

The preferred embodiment uses a first delay something more than ins due to increased alignment problems with the shorter delay and increased aberrations in the pulse as stretched in a shorter delay path. Each of the delay paths is, however longer than the coherence length of the pulse and the second delay path is longer than the first, to achieve coherence busting effects discussed herein.

The mini-OPuS pulse stretchers may be selected and arranged to, e.g., fold the beam on itself or fan it out in first one axis, e.g., in a first mini-OPus 376, resulting in the coherency representation 378 and then in another orthogonally related axis, e.g., in a second mini-OPuS 380, resulting, e.g., in the coherency representation 390. A pulse trimmer/pulse steerer 392, e.g., and electro-optical ("E-O") element 392 may sweep (paint) the seed beam into the input/output coupler 400 of the amplifier portion 394 resulting in the blurring in one axis as shown in the pulse coherency representation out of the power oscillator 410 (and also the coherence representation 410 into the amplification gain stage 394). The "regular" or "standard" OPuS, e.g., a 4× $T_{is}$ OPuS (roughly tem meters of delay path), which may contain, e.g., 2 delay paths 412, 420 initiated by a first beam splitter 414 and a second beam splitter 422, similarly may be arranged to fold the beam on itself in first one axis and then a second resulting, e.g., in the pulse coherency representations of, respectively, 414 and 424. The final coherency representation 424 shows schematically that the coherency of the seed beam has been greatly reduced, i.e., the beam has been smeared in its passage from the seed laser 372 to the amplifier gain medium 394a and as amplified in the amplifier gain medium 394 and subsequently further having its coherency busted in the 4× regular OPuS 412, 420.

It will be understood by those skilled in the art that depending on the initial coherency of the pulse, e.g., out of the seed laser, e.g., almost completely coherent in the case of solid state seed lasers to very little coherency, but still coherency that is desired to be even further reduced, e.g., with an excimer seed laser the type, number and arrangement of coherency busting elements may vary. For example, it may only be necessary to do active coherency busting, e.g., with one form or another of pulse steering/painting, for solid state seed lasers, and this may in some cases for some applications prove to need only a ramp or only AC pulse deflection, i.e., in one axis or the other, or may prove to need both DC and AC pulse painting (Hybrid painting) along with OPuS effect coherency busting both between the MO and amplifier gain medium, e.g., PO or PA or other amplification gain medium stage, e.g., a ring power amplification stage, and also may need to employ the effect of the regular OPuS pulse stretcher(s) on the output of the amplifier gain medium. With an excimer gas discharge laser MO, with relatively much lower coherency than from a solid state seed laser, only passive coherency busting, e.g., between the MO and gain amplifier medium may be needed, e.g., with one or both of the mini-OPuSs 376, 380 or other passive optical elements as noted above between the MO and amplifier gain medium.

One may still need, however, to do beam steering also, e.g., with an active beam steering mechanism for even more smearing of the pulse (more divergence), that may be less essential and need a smaller sweeping angle. Such a seed laser mini-OPuS is believed to need approximately only a 1 foot total path delay each and can also be conveniently built onto the seed laser optical table as is currently the practice for relay optics in applicants' assignee's XLA series laser systems.

FIG. 17 illustrates an exemplary relative speckle intensity for a 1 kV E-O deflector voltage v. relative timing. The relative standard deviation curve 550 is for 1 kV and the equivalent pulse curve is curve 550'. A 2 kV E-O deflector voltage curve 552 and equivalent pulse curve 552' are also shown as is a 3 kV E-O deflector voltage curve 554 and equivalent pulse curve 554'. An example of a point shift vs. E-O voltage curve 560 is shown by way of example in FIG. 18.

It will be understood by those skilled in the art that an apparatus and method is disclosed for reaching very high average output power, e.g., around 200 W or more with an excimer or molecular fluorine gas discharge laser system in the DUV range of wavelengths, e.g., 351 for XeF, 318 for XeCl, 248 for KrF, 193 for ArF and 157 for $F_2$, utilizing, e.g., a power oscillator or other amplification gain stage, e.g., a ring power amplification stage, with little or no significant ASE interfering with the in-band desired radiation output of the laser system, e.g., with a ratio between the ASE and in-band radiation at or below about $5\times10^{-4}$, e.g., with, e.g., a 100 uJ pulse energy input into the power amplification stage cavity per pulse. According to aspects of an embodiment of the disclosed subject matter unwanted ring power amplification stage light propagates backwards and can also be sampled for diagnostics and ASE feedback control. Adding a small amount of line-narrowing, e.g., with prism tuning, can also help suppress ASE from the power amplification stage. Also according to aspects of an embodiment of the disclosed subject matter a PA may be used, e.g., along with a solid state MO, e.g., a 4 pass amplifier with no oscillation but with acceptable amplification and perhaps even high enough saturation. With such a design it may be necessary, e.g., for the 4 passes to each traverse the entire gain cross-section in each of the 4 passes. The cavity may have 2 prisms on each side of the cavity, in order to, e.g., reduce the energy density on the coated cavity optics and also provide dispersion for ASE reduction.

In addition, it may not be that the ultimate ASE levels in a MOPO, or other master oscillator/power amplification stage configurations, necessarily increase with decreasing MO energy, such that according to aspects of an embodiment of the disclosed subject matter decreasing MO output energy even below 10 μJ may not result in unacceptable ASE, even without, e.g., a partially reflective off axis seed injection mechanism and/or a regenerative ring power amplification stage configuration. A cavity with beam expansion and crossing beams may be constructed that does not exceed the cavity length of today's XLA, e.g., with the beam expansion prisms far enough away from the chamber to allow lateral translation for beam crossing, e.g., at a distance of a few centimeters of the chamber window, dictated by, e.g., beam width and crossing angle. A separate vessel for the prisms and/or beam reverser optics could also allow the use of a direct $F_2$ supply, e.g., at a different concentration than in the lasing gas mixture, e.g., at around 1% concentration. This could also, e.g., avoid contamination from the optics holders.

Figure 20A:
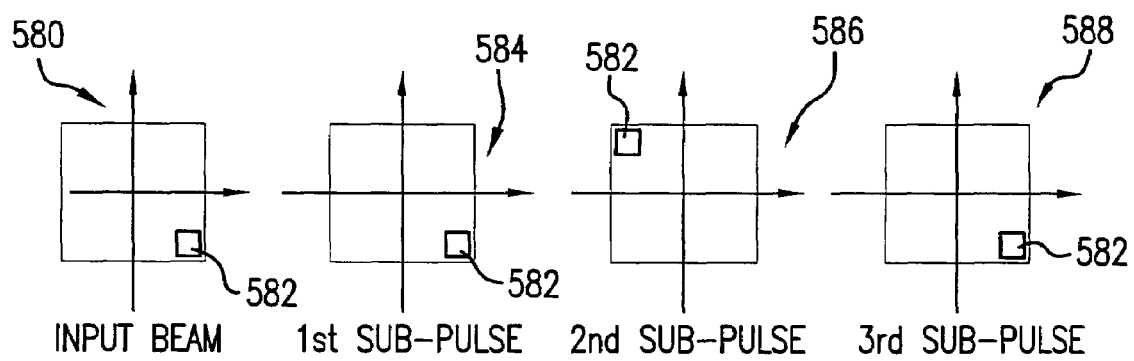
FIGS. 20A and B illustrate the effect of beam combining according to aspects of an embodiment of the disclosed subject matter.
Figure 20B:
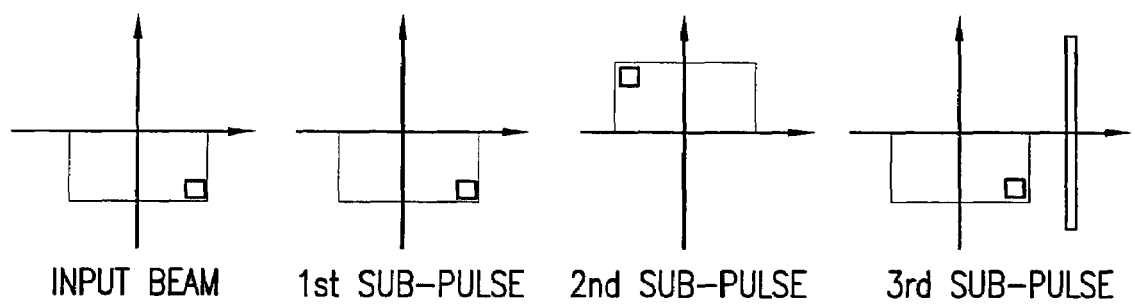

The effect of inverse imaging, e.g., in an optical delay path, e.g., in a mini-Opus with a delay path of only about one foot, is illustrated in FIG. 20A, e.g. for an input beam 580, in which a beam corner 582 is designated by the square initially in the lower right hand corner of the beam 580. For a first sub-pulse 584, e.g., between an entrance beam splitter and a first mini-OPuS mirror, the beam corner 582 remains the same. In a second sub-pulse 586, e.g., reflected from the first mirror, the beam has been, e.g., negatively imaged, e.g., to a second mini-OPuS mirror and the beam corner has moved to the upper left hand corner and then for a third sub-pulse 588, reflected to a fourth mini-OPus mirror, where the beam corner has been negatively imaged back to the bottom right hand corner, as illustrated in the figure. Combining all of these sub-pulses into an output pulse, with a relatively short optical pulse delay such that the pulse is not very significantly stretched from a $T_{is}$ standpoint, can still substantially reduce coherency by this effect of folding the beam on itself a plurality of times, depending on the number of mirrors in the delay path.

FIG. 20 B illustrates this same effect, e.g., on half of the beam, e.g., is the beam had been split into two halves before entry into the delay path of, e.g., two separate sources, e.g., two solid state seed lasers operating at X kHz in, e.g., a 2X kHz system. As can be seen the two halves are similarly negatively imaged in each sub-pulse resulting in even further reduction in coherency in an overall output pulse formed, e.g., by the combination of the two half pulses into a single output pulse, e.g., of the shape shown by way of example in FIG. 20A.

Turning now to FIG. 21 there is shown schematically and partly in block diagram form a beam combiner system 600, according to aspects of an embodiment of the disclosed subject matter. The beam combiner system 600 may include, e.g., a first amplifier gain medium portion 602 and a second amplifier gain medium portion 604, each of which may be, e.g., a PA or PO of ring power amplification stage, as described elsewhere in the present application. The output of each of the amplifier portions 602, 604 may pass through a beam expander 608, which may include a prism 610 and a prism 612, e.g., magnifying the beam by, e.g., about 2×. A turning mirror 620 may steer a first laser system output light pulse beam 622 from the amplifier 602 to a second turning mirror 624 which may steer the pulse beam 622 to form a pulse beam 632 onto a beam splitter for a first pulse stretcher 640 and thence to a beam splitter 646 for a second pulse stretcher 644. A turning mirror 630 may steer a second laser system output light pulse beam 632 from the second amplifier 604 to a second turning mirror 634, which may steer the beam 632 to form a beam 634 to be incident on the beam splitter 642 and thence the beam splitter 646. The output of the first OPuS and second OPuS, which may be "mini-OPuSs" as discussed elsewhere in the present application, may pass through another beam splitter 650, where, e.g., a small portion of the laser system output laser light pulse beam may be diverted, e.g., for metrology purposes, e.g., focused by a focusing lens 652 into a divergence detector 654, which may be part of a control system (not shown) providing feedback control signals 656, e.g., to the beam splitters 642, 646 of the first and/or second OPuSs 640, 644 or the turning mirrors for each of the beams 632, 634 to, e.g., insure the pointing from both amplifiers remain overlapped in the far field so that the beam appears to be as one beam, and also, e.g., so that the two pulse stretchers maintain the pointing chirp introduces=d, e.g., due to the confocal nature of the OPuS(s).

FIG. 22 illustrates schematically the impact of changing the pointing of the beam (sweeping the beam) in terms of coherency/speckle reduction. A pulse stretcher 662 may receive a laser system output laser light pulse beam 100 on a beam splitter 664 and, e.g., through changing the angle of the beam splitter sweep the pointing of the beam 100 across a slit, e.g., with a slit diameter of d, onto a diffuser 670. The resultant detected speckle pattern 680 indicates that the sweeping reduces the coherency contrast and thus speckle.

Turning now to FIG. 23 there is illustrated by way of example in schematic and partly block diagram form a very high power solid state seeded immersion lithography laser light source 700, which may include, e.g., a high pulse repetition rate, e.g. a 12 kHz, solid state seed laser 702. The output of the seed laser 702 may pass through formatting optics 704, which can include, e.g., a lens 706 and a lens 708, which may be used to, e.g., to reformat the beam from a round beam to a shape concomitant with the shape of the gain medium in the amplifier portion. The output laser light pulse beam from the seed laser 702 may then be passed through an x axis electro-optical ("E-O") steering mechanism 712, and/or a y-axis E-O steering mechanism 714 or both, e.g., an E-O cell model referenced above, each providing, in a respective axis, e.g., orthogonal to each other, a sweep of the beam in order to paint a reasonable percentage of the utilization tool (e.g., scanner or annealing tool) aperture, e.g., about 1 mrad, along with a high frequency AC painting voltage, as explained elsewhere in the present application. The laser output light pulse beam pulses from the seed laser 702 may then be split in a beam divider to provide alternating ("tic-toc") input pulses into a respective one of an amplifier gain medium, e.g., a first power oscillator 730 and a second power 730. The power oscillators 730 may comprise a ring power oscillator.

The beam divider 720 may comprise, e.g., a beam splitter 722 that selectively transmits, e.g., 50% of the output beam from the seed laser 702 onto a turning mirror 724 and a turning mirror 726, leading into the second amplifier gain medium 730 and reflects 50% to a turning mirror 728 leading to the second gain amplifier medium 730, e.g., on each pulse the beam splitter 720 could also comprise, e.g., an electro-optical or acousto-optical beam deflector alternating actuated to rend light to folding mirror 728 or folding mirror 724 on alternate pulses.

Each respective gain amplifier medium 730 may include, e.g., a power amplification stage chamber 732, an input coupler/rear cavity mirror 734, e.g., a concave mirror with an aperture on the axis of revolution of the mirror surface admitting the seed laser beam into the cavity formed by the rear cavity mirror 734 and a front cavity mirror 736 as are known in the art of unstable oscillation cavities. It will be understood that the amplifier gain medium may be in other configurations mentioned in the present application, e.g., a stable resonator with, e.g., a seed injection mechanism, discussed in the co-pending and contemporaneously filed application referenced above, and e.g., a ring power amplification stage, or a power amplifier, without an oscillator cavity and with only a fixed traversal path for amplification while the gain medium is energized (e.g., a population inversion exists) as is known in the art, without laser oscillation occurring, i.e., without an output coupler as is known in the art of laser oscillation cavities. In oscillation cavity environments, e.g., the convex mirrors could be replaced, e.g., by an input coupler such as the seed injection mechanism, discussed in more detail elsewhere in the present application, and the convex mirror 736 replaced with an output coupler. Beam expanding, beam combining and coherency busting and divergence measuring of the respective output beams 766 from the first amplifier gain medium 730 and 764 from the second amplifier gain medium 730, and feedback control may occur as discussed in regard to FIG. 21 with respective beam expander 740, comprising, e.g., prisms 742 and 744, beam combiner comprising mirrors 750, 752 from the first amplifier gain medium 730 and mirrors 760, 762 from the second amplifier gain medium 730 and pulse stretchers 640 and 644 and metrology unit 654.

Figure 24:
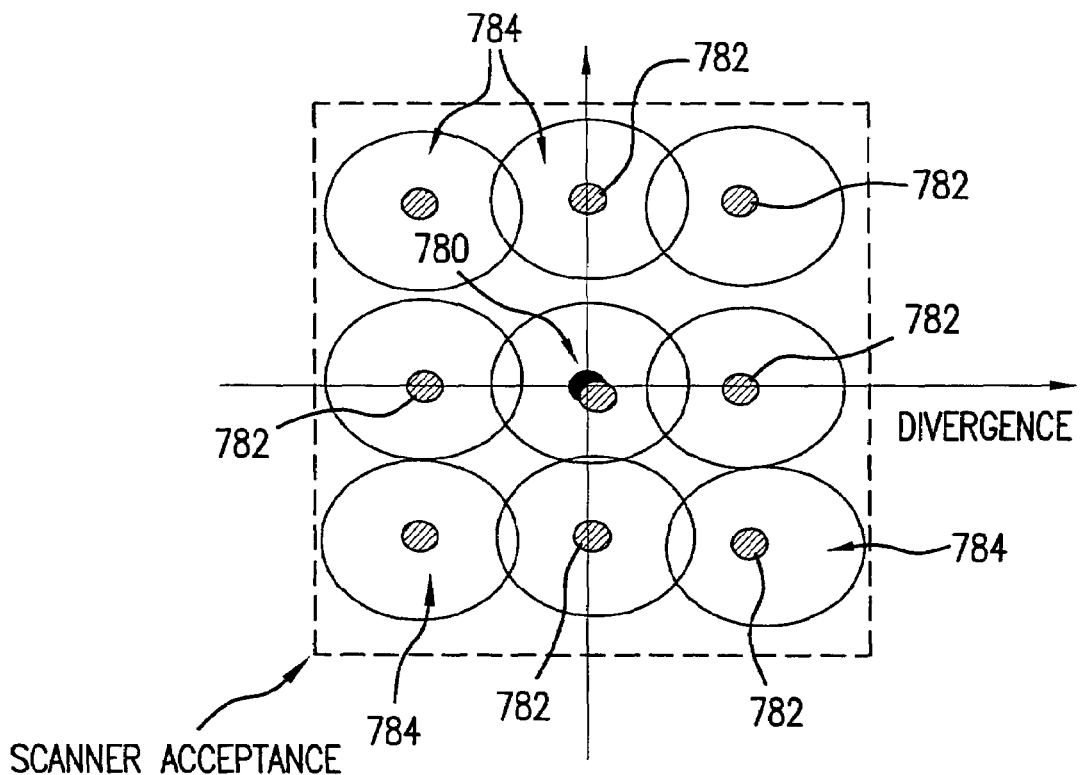
FIG. 24 shows schematically and in cartoon fashion the effects of multiple coherence busting schemes.

FIG. 24 illustrates schematically the results of a coherency busting scheme on an output laser pulse, e.g., in relation to a scanner acceptance window, e.g., introducing horizontal and vertical (as illustrated in the plane of the page drawing of FIG. 24) directions. The dot 780 illustrated schematically and by way of example an initial seed laser output pulse profile 780. The pattern of pulses 782 illustrate a pattern of sub-pulse profiles 782 after beam folding in a perfectly aligned beam delay path, or through a misaligned pulse stretcher(s) or both, or a combination thereof, and the circles 784 around each represent the effect on the profile of electro-optical smearing.

Figure 25:
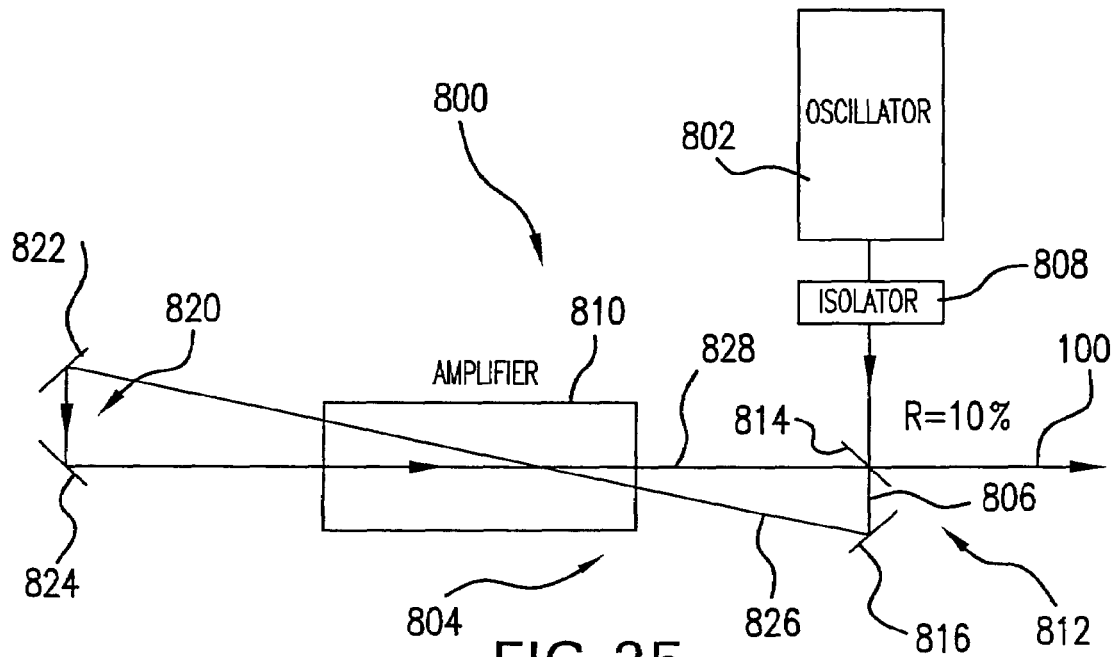
FIG. 25 illustrates schematically and partly in block diagram format a regenerative/recirculating power gain oscillator power amplification stage according to aspects of an embodiment of the disclosed subject matter.

FIG. 25 illustrates schematically and partly in block diagram form by way of example a ring power amplification stage oscillator laser system 800 and a seed injection mechanism 812, as discussed in more detail in the co-pending and contemporaneously filed patent application discussed above. The laser system 800 may comprise, e.g., a with bow-tie ring power amplification stage 804 and a seed laser, e.g., a solid state or gas discharge seed oscillator 802. The seed oscillator 802 may be isolated from the oscillator cavity of the power amplification stage 804 by an isolator to prevent unwanted lasing from feedback photons, which may be unnecessary, e.g., with a proper seed injection mechanism 812. The power amplification stage section 804 may include, e.g., a power amplification stage chamber 810, a seed injection mechanism 812, which may include, e.g., an input/output coupler 814 and a maximally reflective ("Rmax") mirror 816 beam reverser 820, reflecting the output beam 806 from the seed oscillator 802 into the amplifier portion chamber 804, and also include a beam reverser/returner 820, which may include, e.g., a first maximally reflective mirror 822 and a second mirror 824, e.g., made of a material, like the Rmax mirror 816, selected to be maximally reflective for a suitable band around the nominal center wavelength of the laser system, e.g., 351 for XeF, 318 for XeCl, 248 for KrF, 193 for ArF and 157 for $F_2$. The seed injection mechanism and beam returner, as explained in more detail in the co-pending and contemporaneously filed patent application referenced above, may be arranged so as to form the oscillation cavity of the power amplification stage 840 (whether technically speaking an oscillator or amplifier oscillator stage, i.e., depending on cavity length), such that on each oscillation along an oscillation path 826, 828 the output beam 806 from the seed laser 802 passes more than once through the gain medium formed between a pair of discharge electrodes (not shown in FIG. 25) per oscillation, i.e., along the path 826 in a first direction and 828 in a second direction generally opposite to the first direction but through the gain medium per every oscillation during the formation of the output laser light pulse beam 100 which eventually leaves the oscillation cavity 804, as is well know in the art of laser oscillation creating an output laser light pulse beam from a laser oscillator. It will be understood that the angle of offset of the beams 826,828 is greatly exaggerated for illustration purposes and could be around 11 rad.

Figure 27:
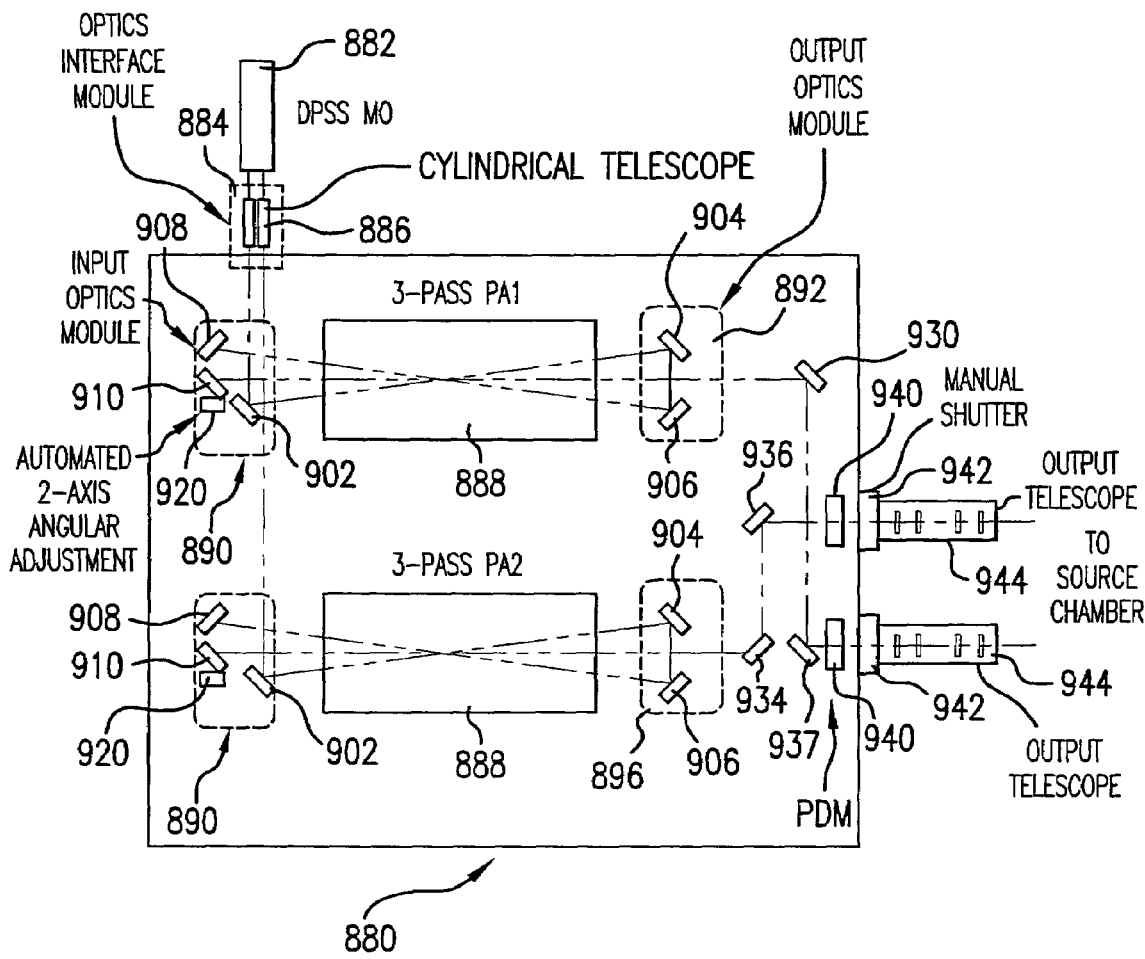
FIG. 27 illustrates schematically and partly in block diagram form a solid state seed laser/gain amplifier laser system according to aspects of an embodiment of the disclosed subject matter.

FIG. 27 illustrates schematically and partly in block diagram form a solid state seed/power amplifier laser system 880 according to aspects of an embodiment of the disclosed subject matter. The system may incorporate a solid state 12 kHz seed laser 882 and a pair of amplifier gain media, e.g., a pair of power amplifier chambers 888. An optical interface module 884 may receive the output of the seed laser 882 and direct it in tic-toc fashion into the respective amplifier gain medium 888, e.g., on alternating pulses. The optical interface module 884 may comprise, e.g., a pair of cylindrical telescopes 886, which may serve to format the beam, e.g., because the output may be astigmatic with the telescope serving to remove the astigmatism, and may also include, e.g., an input optics module 890, each including, e.g., a mirror 902, a mirror 908 and a mirror 910, which together with mirrors 904 and 906 may form, e.g., a fixed number of passes, e.g., three passes through the gain medium between electrodes (not shown in FIG. 27) in an amplifier gain medium configured, e.g., as a three pass power amplifier ("PA"). that is, no laser oscillation occurs in the amplifier gain medium. The respective outputs of the respective power amplifier 888 may be steered by beam turning mirror 930, 932 on the one hand and 934, 936 on the other through a respective energy sensor. These output beams from the system 880 may be combined in a beam combiner as discussed elsewhere in the present application.

A coherency buster, e.g., an automated two axis angular adjustment mechanism 910, e.g., modulating the tilt of the respective mirror 910 in the input optics module 890 may serve a similar purpose to that of the X and Y axis beam steering electro optic elements 712, 714 of the embodiment of FIG. 23, e.g., by sweeping the beam entering the amplifier gain medium from side to side and/or up and down for greater divergence and thus coherency busting as discussed elsewhere herein.

Figure 28:
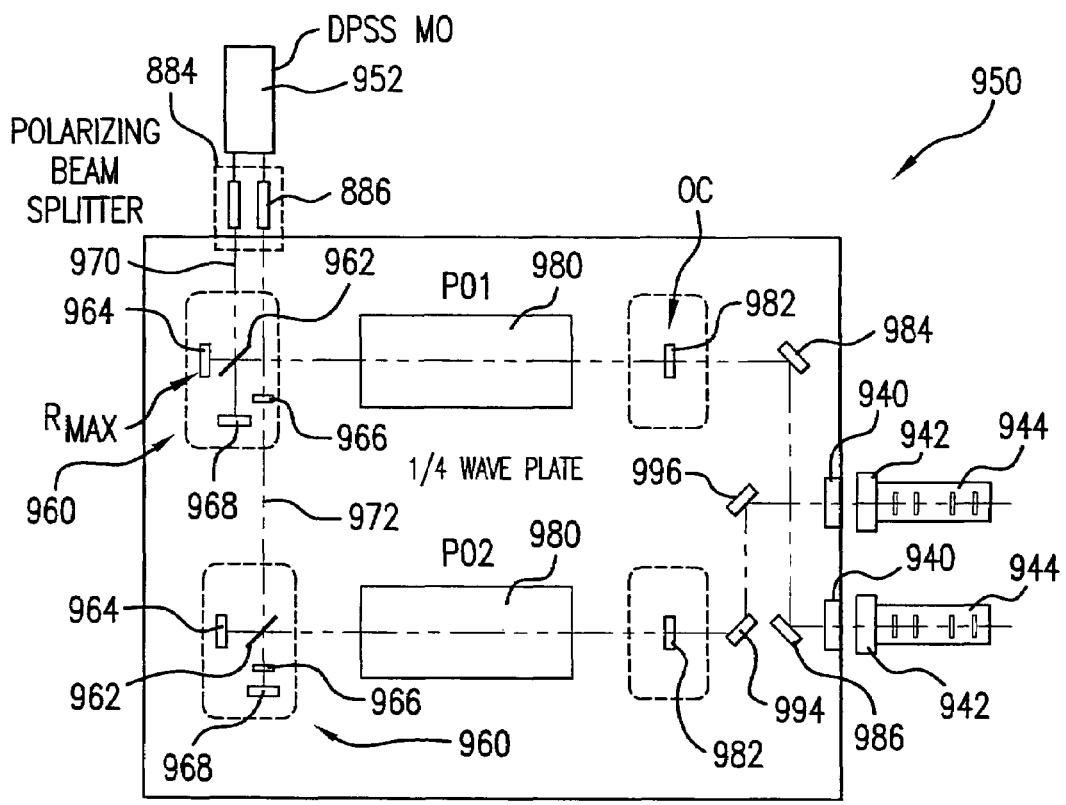
FIG. 28 illustrates schematically and partly in block diagram form a solid state seed laser/gain amplifier laser system according to aspects of an embodiment of the disclosed subject matter.

Turning now to FIG. 28 there is illustrates schematically and in partly block diagram format a seed laser/amplifier gain medium laser system such as a solid state seed/power amplification stage laser system 950 according to aspects of an embodiment of the disclosed subject matter. The system 950 may include, e.g., a seed laser, e.g., a solid state 12 kHz seed laser 952 the output of which may enter into an optical interface modules 884, e.g., into a respective one of a pair of cylindrical telescopes 886, as in the embodiment of FIG. 27. Input coupling modules 960 may include, e.g., a polarizing beam splitter 962, an Rmax 964, a quarter wave plate 966, and an input coupler Rmax mirror 968, which together function to couple output of the seed laser 952, respective seed beam 970, 972, into the respective gain amplifier medium, e.g., a power amplification stage oscillator having an output coupler 982, by e.g., using a polarization coupling. Turning mirrors 984, 986, 994, 996 serve the same purpose as the respective turning mirrors in the embodiment of FIG. 27.

Figure 29:
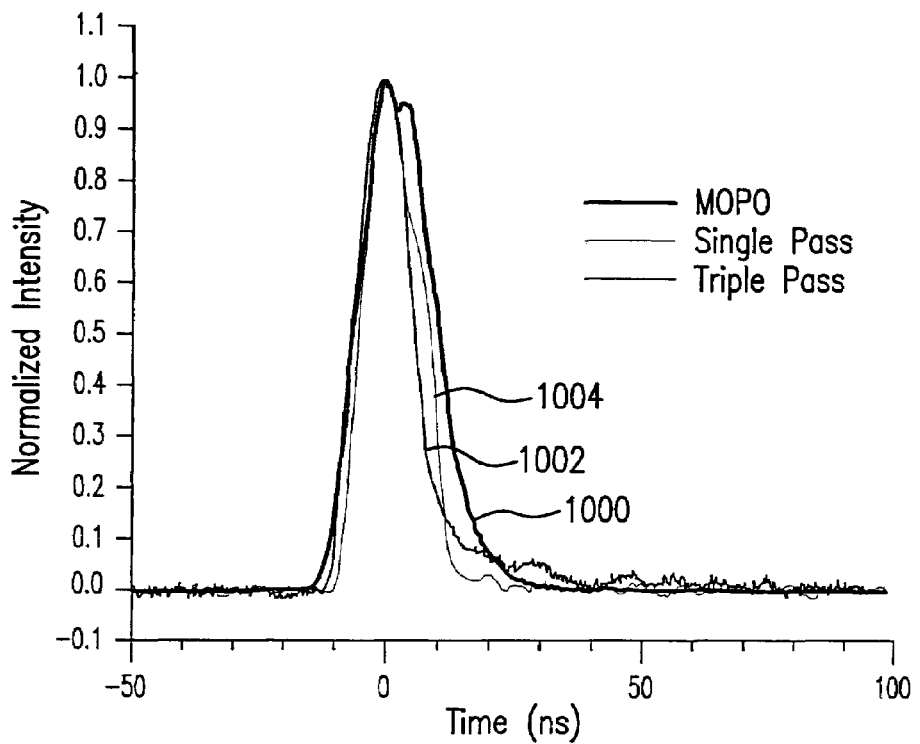
FIG. 29 illustrates normalized output pulse shapes from laser systems according to aspects of an embodiment of the disclosed subject matter.

FIG. 29 represents an illustrative normalized MOPO intensity 1000, a normalized single pass PA intensity 1002 and a normalized two pass PA intensity 1004.

Figure 30:
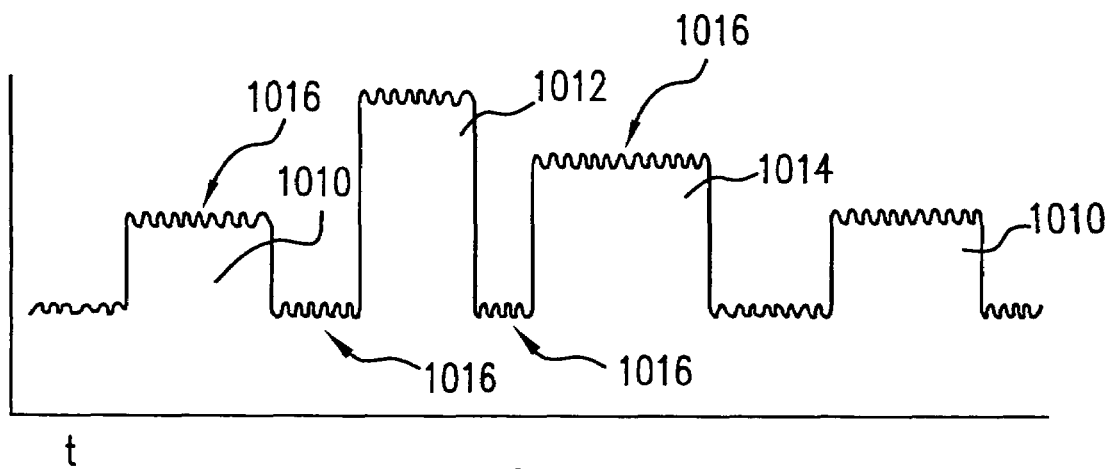
FIG. 30 represents schematically E-O cell laser steering input voltages according to aspects of an embodiment of the disclosed subject matter.
Figure 32:
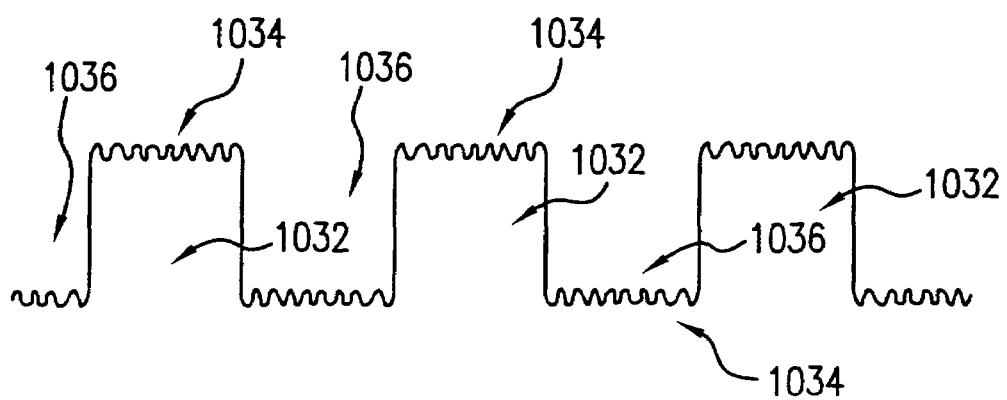
FIG. 32 represents schematically E-O cell laser steering voltages input signals according to aspects of an embodiment of the disclosed subject matter.

FIG. 30 represents an illustrative macroscopic steering pulse 1010, which may comprise a plurality of alternating high and low DC voltages 1010, 0102, and 1014, which may repeat in some pattern, e.g., of three different high voltages, as illustrated and a superimposed alternating current high frequency steering voltage 1016, which may occur, e.g., both at the higher voltage and at the low voltage. As illustrated, e.g., the high voltages may have different pulse durations and different low voltage duration intervals as well. As shown in FIG. 32, these high voltages 1032 may be of the same value and same low voltage duration interval 1036 with superimposed AC 1034.

Figure 31:
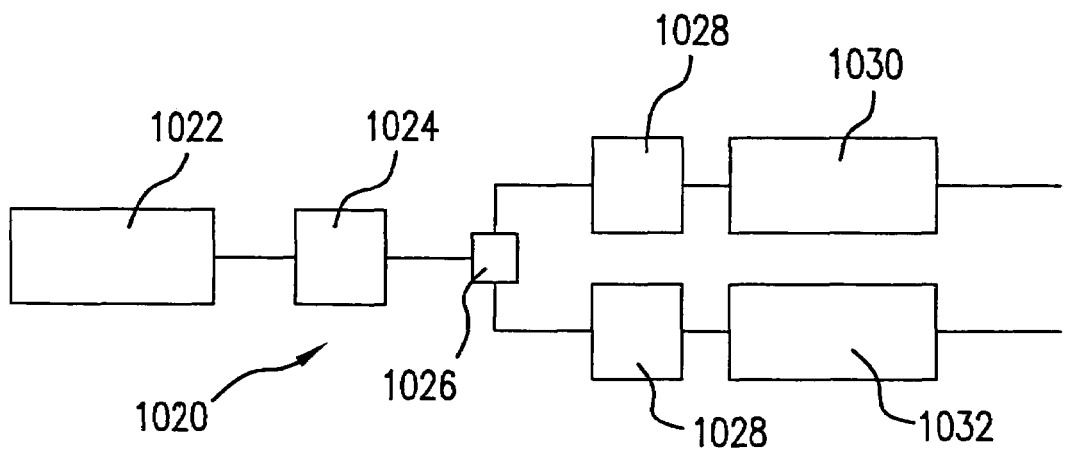
FIG. 31 represents schematically in block diagram form a laser steering system according to aspects of an embodiment of the disclosed subject matter.

FIG. 31 illustrates schematically and in block diagram form an optical switching and painting system 1020, according to aspects of an embodiment of the disclosed subject matter, which may include, e.g., a solid state seed 1022, a frequency converter 1024, and an optical switch and painter 1026, which may include an electro-optical beam director that, e.g., deflects the beam into a first one of an amplifier gain medium 1030 when the pulse, e.g., as shown in FIG. 32 is high (1032 in FIG. 32 and into the other amplifier gain medium 1032, when the pulse is low (1036 in FIG. 32) and also applies the AC beam steering 1034 into each amplifier 1030, 1032. A second frequency shifter 1028 may be intermediate the beam splitter/painter 1026 and the respective amplifier gain medium 1032, and may be in addition to the frequency shifting of the element 1024 or in lieu thereof.

According to aspects of an embodiment of the disclosed subject matter applicants propose to generate 193 nm laser light utilizing a solid-state seed laser, e.g., the generation of coherent 193 nm radiation in a solid-state configuration with a solid-state seed drive laser (or lasers) that drive linear or nonlinear frequency conversion stages. One potential seed laser is the pulsed Yb fiber laser, lasing at around 1060 nm, tunable in the 1050-1080 nm region. Such lasers constitute a mature and powerful fiber laser technology, which may, e.g., be configured to produce short temporal duration pulses (1-5 ns) at multi-kilohertz repetition frequencies. To generate 193 nm using 1060 nm as the longest wavelength mixing source, according to aspects of an embodiment of the disclosed subject matter, applicants propose to use, e.g., sum frequency generation ("SFG") with a long wavelength and a moderately short wavelength to generate deep ultraviolet ("DUV"). Second harmonic generation ("SHG") to reach 193 nm is not possible, due to the present lack of a 236.5 nm source as the other mixing wavelength. However, such a source could be derived by fourth harmonic generation, ("FHG") of the 946 nm output of a q-switched diode-pumped Nd:YAG laser (946 nm being a lower efficiency transition in Nd:YAG.

The output of the Nd:YAG is essentially a fixed wavelength, and overall tunability could be provided by tuning the output wavelength of the Yb fiber laser, e.g., a $Yb^{+3}$ fiber laser. Tunability of the Yb fiber laser output could be obtained via a CW diode seed laser, e.g., a New Focus Vortex TLB-6021. Such a diode laser seeders can provide fast wavelength control over limited wavelength ranges, e.g., via internal PZT control of reflectors, as desired for lithography source applications and have a high spectral purity. Nd:YAG lasers are operable at multi-kilohertz repetition frequencies, ensuring the overall system repetition rate can meet the repetition rate requirements for a practical excimer laser injection seeding source.

To achieve narrow bandwidth operation, both laser sources need individually to be narrowband. In Nd:YAG systems, this may be achieved, e.g., by injection seeding with a CW lower power Nd:YAG laser, e.g., in a non-planar ring oscillator architecture that is operating, e.g., with a single longitudinal mode output. In the Yb fiber laser case, the bandwidth could be assured via the CW diode laser seeder, which typically operates at very narrow linewidths, e.g., on the order of 100 MHz FWHM. Further, appropriate large-mode area ("LMA") fiber technology could be used to minimize spectral degradation due, e.g., to nonlinear effects in the fiber comprising the fiber laser oscillator or any subsequent amplification stages.

Figure 41:
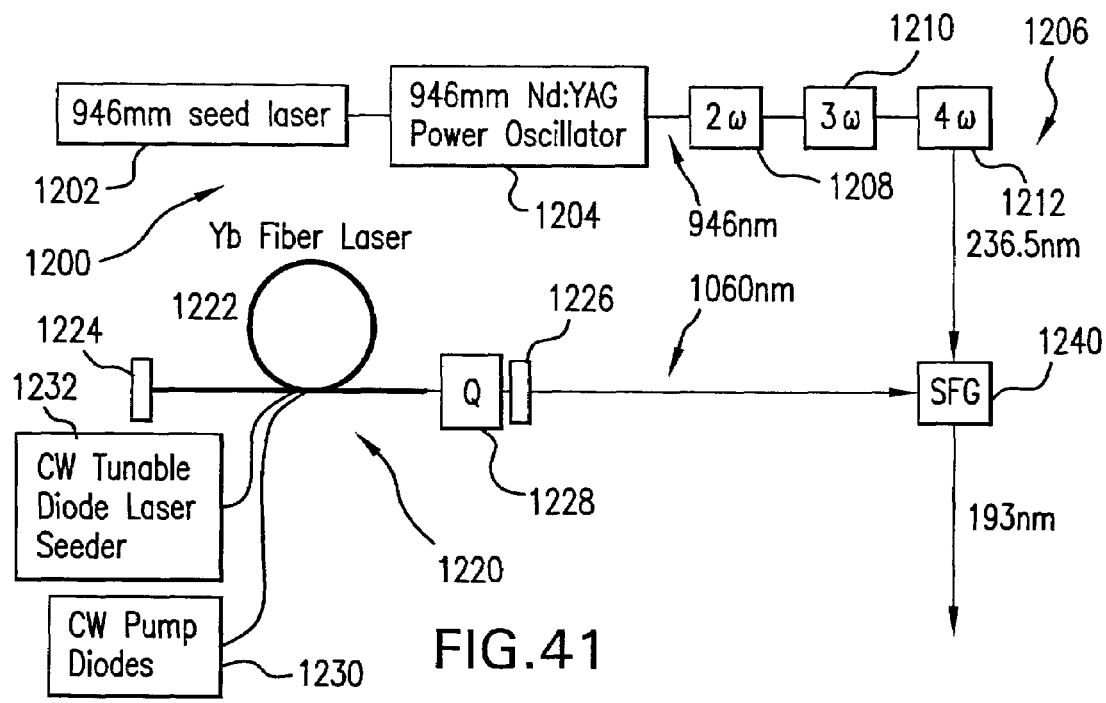
FIG. 41 illustrates schematically and partly in block diagram form a solid state seed laser with about 193 nm output light according to aspects of an embodiment of the disclosed subject matter.

To generate 193.4 nm radiation, e.g., as illustrated schematically and partly in block diagram form in FIG. 41, a system 1200 including, e.g., a pulsed 946 nm Nd:YAG laser 1204 seeded by a 946 nm seed laser, e.g., a 946 nm CW Nd:YAG seed laser 1202, which the output of the Nd:YAG laser 1204 frequency doubled, in a frequency converter 1206, which may include, e.g., a frequency doubler 1208, e.g., a non-linear material such as an LBO or KTP crystal, followed by either another frequency doubler (not shown) or a third harmonic generator 1210 and a fourth harmonic generator 1212 (e.g., each done using sum-frequency generation with residual pump radiation, e.g., using the above noted crystals), either approach generating the fourth harmonic at 236.5 nm. The 236.5 nm radiation can then be mixed, e.g., in a sum frequency generation with the 1060 nm output of the a Yb fiber laser in a final nonlinear crystal mixing stage, sum frequency generator 1240, e.g., a CLBO or a BBO. That is, e.g., $1/1040$ $(0.000943)+1/236.5$ $(0.00423)=1/193.3$ $(0.005173)$. The fiber laser 1222 may have a rear oscillation cavity mirror 1224 and a front window 1226, with a Q-switch 1228.

CLBO is cesium lithium borate, which is an effective $4^{th}$ or $5^{th}$ harmonic generator for Nd:YAG output light, can be phase matched up for 193 nm operation and has a damage threshold of >26 $GW/cm^2$. BBO is beta barium borate ($b-BaB_2O_4$), which is one of the most versatile nonlinear optical crystal materials available and most commonly used for second- or higher-order harmonic generation of Nd:YAG, Ti:Sapphire, argon ion and alexandrite lasers. CLBO is preferred because of its higher transparency and high acceptance angle, which may, however, require cryogenic cooling for phase matching, also being problematic because CLBO is a hygroscopic material). The alternative is BBO, which can be phase matched but is being operated very close to its absorption band edge at ~190 nm. BBO also has much a narrower acceptance angle than CLBO, but this can be managed through optical design, e.g., with anamorphic focusing. According to aspects of an embodiment of the disclosed subject matter both lasers 1024, 1022 can be made relatively powerful, e.g., with peal output power of greater than about 25 KW, helping to compensate for any inefficiencies in the nonlinear frequency conversion stages 1206, 1240.

According to aspects of the disclosed subject matter, the generation of 193.3 nm with solid state laser(s) for seeding an excimer amplifier gain medium may also be done, e.g., by the use of mature drive laser technologies, which may be wavelength tunable in a similar fashion to current tuning of excimer lasers. A seed laser system 1200', illustrated schematically and in partly block diagram form in FIG. 42, may comprise, e.g., an Er fiber laser 1260, e.g., lasing at around 1550 nm but tunable in the 1540-1570 nm range. Er fiber lasers are available, and use similar generic technologies to Yb fiber lasers. Such an approach is attractive because of the maturity of fiber and pump diode laser technology for this wavelength range, applied, e.g., in fiber-based telecommunications, e.g., erbium-doped fiber amplifiers or EDFAs used as signal boosters in optical fiber communication.

Figure 42:
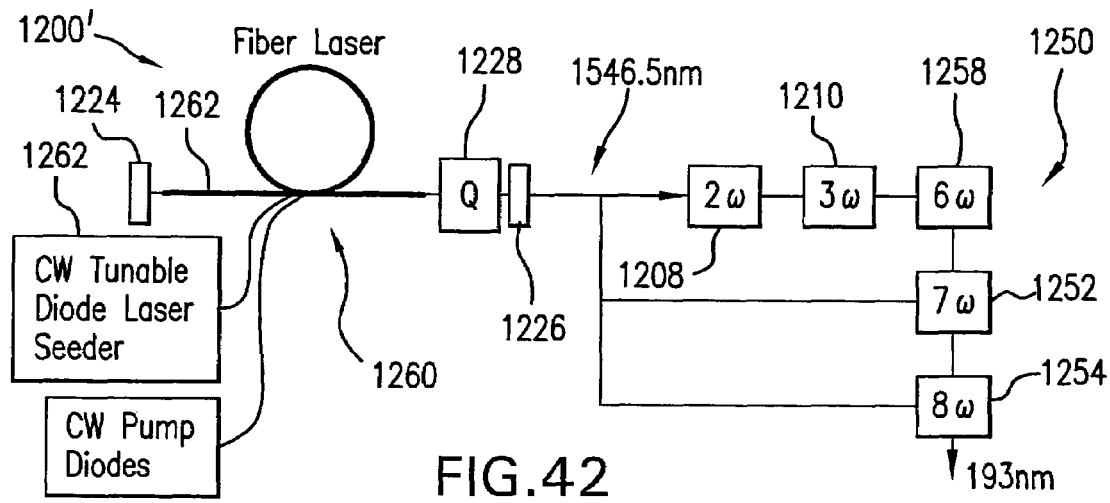
FIG. 42 illustrates schematically and partly in block diagram form a sold state seed laser with about 193 nm output light according to aspects of an embodiment of the disclosed subject matter.
Figure 43:
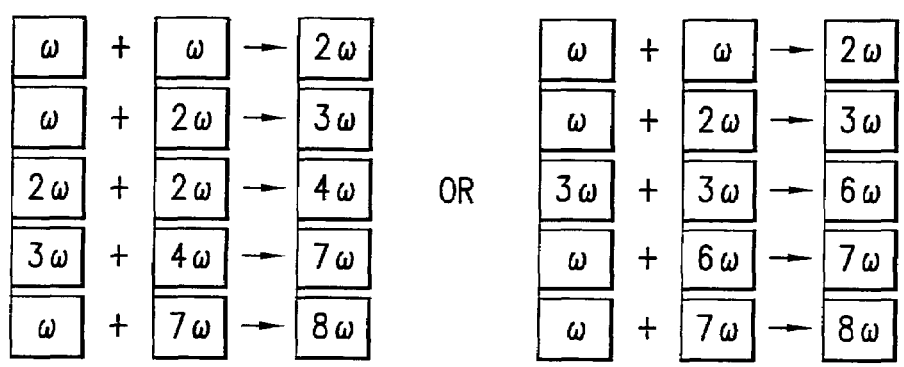
FIG. 43 illustrates various frequency up-conversion schemes.

According to aspects of an embodiment of the disclosed subject matter applicants propose to use a pulsed fiber laser oscillator 1260 as the source of moderate peak power (e.g., 5-50 kW) high-repetition-rate (multi-kHz, e.g., at least 12) 1546.5 nm narrowband pulsed radiation. That laser 1260 could be constructed using standard pulsed fiber laser technology, to use a single-mode CW tunable narrowband diode laser 1262 as an injection seeder for the fiber laser oscillator 1260 to ensure narrowband, single wavelength performance, and also to allow the fast wavelength tunability required for lithography light source applications. An example of the type of diode laser seeder 1262 is, e.g., a New Focus Vortex TLB-1647, which uses an external cavity diode configuration with PZT wavelength actuation for high-speed wavelength drive over a limited wavelength range, in parallel with mechanical drive for extended wavelength range operation. Further, appropriate large-mode area ("LMA") fiber technology could be used to minimize spectral degradation, e.g., due to nonlinear effects in the fiber comprising the fiber laser oscillator or any subsequent amplification stages. Using such approaches can, e.g., allow spatial beam quality to be maintained, employing techniques for ensuring single-mode operation in large mode area fibers, while reducing the peak power in the core of the fiber. After the 1546.5 nm radiation is generated, it may then be frequency upconverted directly to 193.3 nm, e.g., using five stages of nonlinear frequency conversion, either second harmonic generation, or sum frequency generation. This can be achieved through the steps listed in FIG. 43, one of which is illustrated by way of example in FIG. 42, wherein ω refers to 1546.5 nm and 8 ω becomes 193.3 nm. In FIG. 42 there is shown the generation of the second harmonic 2ω of 1546.5 nm in SHG 1208, and the third harmonic generation, e.g., by adding the base frequency to the second harmonic to in SFG 1258 to get 3ω, and frequency doubling 3 W to get 6ω in frequency double 1258, followed by similar such sum frequency generations as just noted in SFGs 1252 and 1254 to get, respectively, 7ω and 8ω. In addition, according to aspects of an embodiment of the disclosed subject matter relatively low-power pulsed fiber laser oscillator outputs, e.g., seeded by a diode laser for spectrum/wavelength control, could then be boosted in peak power via, e.g., a subsequent stage(s) of fiber amplification (not shown). Applicants propose also, the development of an all-fiber solid state drive laser based on this approach.

Figure 44:
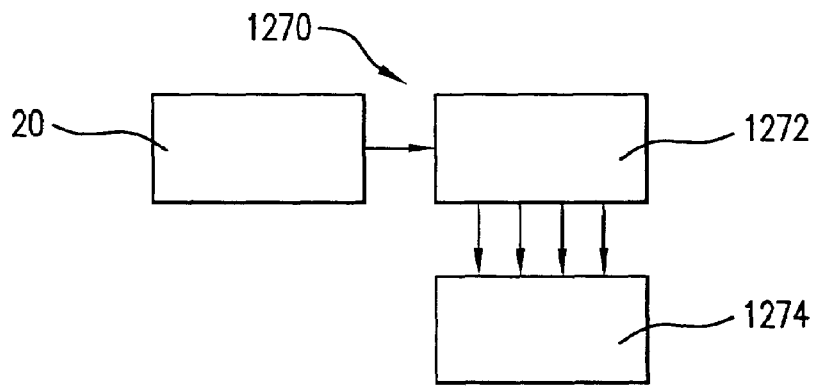
FIG. 44 illustrates schematically and in block diagram form a broad band light source and laser surface treatment system using the DUV laser light according to aspects of an embodiment of the disclosed subject matter.

Turning to FIG. 44 there is illustrated schematically and in block diagram form a laser treatment system, e.g., and LTPS or tbSLS laser annealing system, e.g., for melting and recrystallizing amorphous silicon on sheets of glass substrates at low temperature. The system 1070 may include, e.g., a laser system 20 such as described herein and a optical system 1272 to transform the laser 20 output light pulse beam from about 5×12 mm to 10 or so microns×390 mm or longer thin beams for treating a workpiece, e.g., held on a work piece handling stage 1274.

MOPO energy vs. MO-PO timing has been examined at different values of seed laser energy, ArF chamber gas mixture, percentage reflectivity of output coupler (cavity Q) and seed laser pulse duration, with the results as explained in relation to FIG. 45.

ASE vs. MO-PO timing has been examined for different values of seed laser energy, ArF chamber gas mixture, percentage reflectivity of output coupler (cavity Q) and seed laser pulse duration with the results also explained in relation to FIG. 45.

Turning to FIG. 45 there is shown a chart illustrating by way of example a timing and control algorithm according to aspects of an embodiment of the subject matter disclosed. The chart plots laser system output energy as a function of the differential timing of the discharge in the seed laser chamber and the amplification stage, e.g., the ring power amplification stage as curve 600a, which is referred to herein as dtMOPO for convenience, recognizing that the amplification stage in some configurations may not strictly speaking be a PO but rather a PA though there is oscillation as opposed to the fixed number of passes through a gain medium in what applicants' assignee has traditionally referred to as a power amplifier, i.e., a PA in applicants' assignee's MOPA XLA-XXX model laser systems, due, e.g., to the ring path length's relation to the integer multiples of the nominal wavelengths. Also illustrated is a representative curve of the ASE generated in the amplification stage of the laser system as a function of dtMOPO, as curve 602a. In addition there is shown an illustrative curve 604a representing the change in the bandwidth of the output of the laser system as a function of dtMOPO. Also illustrated is a selected limit for ASE shown as curve 606a.

It will be understood that one can select an operating point on the ASE curve at or around the minimum extremum and operate there, e.g., by dithering the control selection of dtMOPA to, e.g., determine the point on the operating curve 602a at which the system is operating. It can be seen that there is quite a bit of leeway to operate around the minimum extremum of the ASE curve 602a while maintaining output pulse energy on the relatively flat top portion of the energy curve to, e.g., maintain laser system output pulse energy and energy σ, and the related dose and dose a constant, within acceptable tolerances. In addition as shown, there can be a concurrent use of dtMOPO to select bandwidth from a range of bandwidths while not interfering with the E control just noted.

This can be accomplished regardless of the nature of the seed laser being used, i.e., a solid state seed or a gas discharge laser seed laser system. Where using a solid state seed laser, however, one of a variety of techniques may be available to select (control) the bandwidth of the seed laser, e.g., by controlling, e.g., the degree of solid state seed laser pumping. Such pump power control may, e.g., put the pumping power at above the lasing threshold in order to select a bandwidth. This selection of bandwidth may shift or change the pertinent values of the curve 604a, but the laser system will still be amenable to the type of E and BW control noted above using dtMOPO to select both a BW and concurrently an operating point that maintains the output energy of the laser system pulses at a stable and more or less constant value in the flat top region of the illustrated energy curve 600. It is also possible to use a non-CW solid state seed laser and to adjust the output bandwidth. For example, selection of the output coupler reflectivity of the master oscillator cavity (cavity-Q) can adjust the output bandwidth of the seed laser system. Pulse trimming of the seed laser pulse may also be utilized to control the overall output bandwidth of the laser system.

It can be seen from FIG. 45 that either the selected ASE upper limit or the extent of the portion of the energy curve that remains relatively flat with changes in dtMOPO may limit the range of available bandwidth for selection. The slope and position of the BW curve also can be seen to influence the available operating points on the ASE curve to maintain both a constant energy output and a minimum ASE while also selecting bandwidth from within an available range of bandwidths by use of the selection of a dtMOPO operating value.

It is similarly known that the pulse duration of discharge pulses in a gas discharge seed laser, among other things, e.g., wavefront control may be used to select a nominal bandwidth out of the seed laser and thus also influence the slope and/or position of the BW curve 604 as illustrated by way of example in FIG. 45.

According to aspects of an embodiment of the subject matter disclosed one may need to select an edge optic, that is an optic that may have to be used, and thus perhaps coated, all the way to its edge, which can be difficult. Such an optic could be required, e.g., between the output coupler, e.g., 162 shown in FIG. 2 and the maximum reflector, e.g., 164, shown in FIG. 2, together forming a version of a seed injection mechanism 160, shown in FIG. 2, e.g., depending upon the separation between the two, since there may be too little room to avoid using an edge optic. If so, then the edge optic should be selected to be the Rmax, e.g., because of the ray path of the exiting beam as it passes through the OC portion 162. From a coatings standpoint it would be preferable to have the OC be the edge optic because it has fewer layers. However, an alternative design, according to aspects of an embodiment of the subject matter disclosed has been chose by applicants and is illustrated schematically and by way of example in FIG. 30, e.g., wherein the use of an edge optic can be avoided, e.g., if a large enough spacing is provided between out-going and in-coming ring power amplification stage beams, e.g., as created by the beam expander, 142 shown in FIG. 2, e.g., prisms 146, 148. For example, about a 5 mm spacing between the two beams has been determined to be satisfactory enough to, e.g., to avoid the use of any edge optics.

Figure 46:
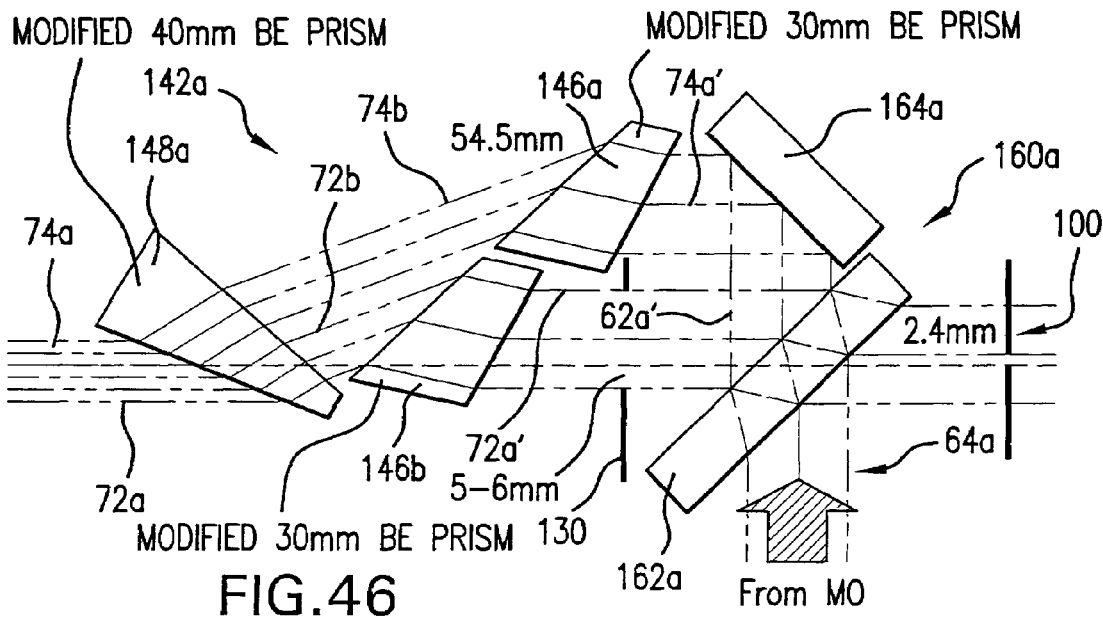
FIG. 46 shows schematically a seed injection mechanism and beam expander according to aspects of an embodiment of the subject matter disclosed.

As illustrated by way of example in FIG. 46 the laser system, e.g., system 110 illustrated by way of example in FIG. 2, may produce a laser system output pulse beam 100, e.g., using a ring power amplification stage 144 to amplify the output beam 62 of a master oscillator 22 in a ring power amplification stage 144. A beam expander/disperser 142, shown in more detail by way of an example of aspects of an embodiment of the subject matter disclosed may be comprised of a first expansion/dispersion prism 146a, and a second expansion/dispersion prism 146b, and a third prism 148.

The seed injection mechanism 160 may comprise a partially reflective input/output coupler 162, and a maximally reflective (Rmax) mirror 164, illustrated by way of example and partly schematically in FIG. 30 in a plan view, i.e., looking down on the seed injection mechanism and m expansion/dispersion 160 and the ring power amplification stage chamber (not shown) into and out of which, respectively the beams 74 and 72 traverse, that is from the perspective of the axis of the output beam 62 traveling from the master oscillator chamber 22, which in such an embodiment as being described may be positioned above the chamber 144 (the beam 62 having been folded into the generally horizontal longitudinal axis as shown (the beam also having been expanded in the MOPuS in its short axis, as described elsewhere, to make it generally a square in cross-sectional shape.

With regard to the configuration of the beam expansion prisms 146a, 146b and 148 inside the ring power amplification stage cavity a similar arrangement may be provided to that of the beam expansion on the output of the power amplifier ("PA") stage in applicants' assignee's XLA-XXX model laser systems, e.g., with a 4× expansion, e.g., provided by a 68.6° incident and 28.1° exit, e.g. on a single prism or on two prisms with the same incident and exit angles. This can serve to, e.g., balance and minimize the total Fresnel losses. Reflectivity coatings, e.g., anti-reflectivity coatings may be avoided on these surfaces since they will experience the highest energy densities in the system. According to aspects of an embodiment of the subject matter disclosed the beam expander/disperser 160 may be implemented with the first prism 146 split into to small prisms 146a, and 146b, which may be, e.g., 33 mm beam expander prisms, e.g., truncated, as shown by way of example in FIG. 30, to fit in the place where one similarly angled prism could fit, with the split prism having a number of advantages, e.g., lower cost and the ability to better align and/or steer the beams 72, 74 (in combination with the beam reverser (not shown in FIG. 30) and the system output beam 100.

The master oscillator seed beam 62 may enter the seed injection mechanism 160 through the beam splitter partially reflective optical element 162, acting as an input/output coupler, to the Rmax 164 as beam 62a, from which it is reflected as beam 74a to the first beam expander prism 146a, which serves to de-magnify the beam in the horizontal axis by about ½× (it remains about 10-11 mm in the vertical axis into the plane of the paper as shown in FIG. 30). The beam 74b is then directed to the second beam expansion prism 148, e.g., a 40 mm beam expansion prism, where it is again de-magnified by about ½× so the total de-magnification is about ¼× to form the beam 74 entering the gain medium of the ring power amplification stage (not shown in FIG. 30. the beam is reversed by the beam reverser, e.g., a beam reverser of the type currently used in applicants' assignee's XLA-XXX model laser system PAs and returns as beam 72 to the prism 148, e.g., having crossed in the gain medium in a bow-tie arrangement or having traveled roughly parallel, perhaps overlapping to some degree in a version of a race-track arrangement. from prism 148 where the beam 72 is expanded by roughly 2× the beam 72b is directed to prism 142b and is expanded a further approximately 2× into beam 72a. Beam 72a is partially reflected back to the Rmax as part of beam 62a and is partially transmitted as output beam 100, which gradually increases in energy until an output beam pulse of sufficient energy is obtained by lasing oscillation in the ring power amplification stage. The narrowing of the beam entering the amplification gain medium, e.g., the ring power amplification stage has several advantageous results, e.g., confining the horizontal widths of the beam to about the width of the electrical gas discharge between the electrodes in the gain medium (for a bow-tie arrangement the displacement angle between the two beams is so small that they each essentially stay within the discharge width of a few mm even thought they are each about 2-3 mm in horizontal width and for the race track embodiment, the bean 72 or the bean 72 only passes through the gain medium on each round trip, or the beams may be further narrowed, or the discharge widened, so that both beams 72, 74 pass through the discharge gain medium in each round trip of the seed beams 72, 74.

The positioning and alignment of the prisms 146a, 146b and 148, especially 146a and 146b can be utilized to insure proper alignment of the output beam 100 from the ring power amplification stage into the laser output light optical train towards the shutter. The beam leaving the input/output coupler 162 may be fixed in size, e.g., in the horizontal direction, e.g., by a horizontal size selection aperture 130, forming a portion of the system aperture (in the horizontal axis) to about 10.5 mm. Another aperture, e.g., in the position roughly of the present PA WEB, e.g., in applicants' assignee's XLA-XXX laser system products, can size the beam in the vertical dimension. since the beam has about a 1 mRad divergence, the sizing may be slightly smaller in each dimension than the actual beam dimensions wanted at the shutter, e.g., by about 1 mm. According to aspects of an embodiment of the subject matter disclosed applicants propose that a system limiting aperture be positioned just after the main system output OPuS, e.g., a 4× OPus. A ring power amplification stage aperture may be located about 500 mm further inside the laser system. This distance is too great to avoid pointing changes turning into position changes at the specified measurement plane (present system aperture). Instead the limiting system aperture can be located just after the OPuS, and may have a 193 nm reflecting dielectric coating instead of a stainless steel plate commonly used. This design can allow for easier optical alignment, while at the same time reduce heating of this aperture.

According to aspects of an embodiment of the subject matter disclosed, applicants propose to implement a relatively stress-free chamber window arrangement similar to or the same as that discussed in an above referenced co-pending U.S. patent application, e.g., at least on the bean reverser side of the chamber, because of the use of, e.g., a PCCF coated window a this location.

According to aspects of an embodiment of the subject matter disclosed, applicants propose to, e.g., place ASE detection, e.g., backward propagation ASE detection, in either the LAM or in an MO wavefront engineering box ("WEB"), or in a so-called MOPuS, which can, e.g., include elements of the MOWEB from applicants' assignee's existing XLA-XXX model laser systems along with the mini-OPuSs discussed elsewhere in this application and in the co-pending application 11/521854 referenced herein, as well as, e.g., beam expansion, e.g., using one or more beam expansion prisms to expand the output beam of the MO in its short axis, e.g., to form generally a square cross-sectional beam. The current MO WEB and its beam turning function is represented schematically as the turning mirror, e.g., 44 shown in FIG. 2. As a preference, however, the backward propagation detector may be placed "in" the MO WEB/MOPuS, that is, e.g., by employing a folding mirror (fold #2), e.g., 44 in FIG. 2, with, e.g., a reflectivity of R=95% instead of R=100% and monitoring the leakage through this mirror 44. Some drift and inaccuracy of this reading may be tolerated, e.g., since it may be utilized as a trip sensor (i.e. measurements in the vicinity of 0.001 mJ when conditions are acceptable—essentially no reverse ASE—as opposed to around 10 mJ when not acceptable—there is reverse ASE), e.g., when the ring power amplifier is not timed to amplify the seed pulse, but still creates broad band laser light. Existing controller, e.g., TEM controller, cabling and ports and the like for new detectors may be employed. The detector may, e.g., be the detector currently used by applicants' assignee on existing XLA-XXX model laser systems to measure beam intensity, e.g., at the laser system output shutter.

According to aspects of an embodiment of the disclosed subject matter one or more mini-OPuS(s), which may be confocal, such that they are highly tolerant to misalignment and thus of potentially low aberration, e.g., for the off-axis rays needed in the proposed short OPuS(s), the so-called mini-OPuS, can have delay times of 4 ns and 5 ns respectively, where more than one is employed. These values were chosen so that both OPuSs exhibit low wavefront distortion with spherical optics in addition to appropriate delay paths for coherence busting. The low wavefront requirement may actually prevent significant speckle reduction from the mini-OPuS(s) unless an angular fan-out from the output of the mini-OPuS(s) is generated, e.g., by replacing a flat/flat compensating plate with a slightly wedged plate, so that the transmitted beam and the delayed beam in the mini-OPuS are slightly angularly offset from each other. The laser beam, e.g., from the master oscillator is partially coherent, which leads to speckle in the beam. Angularly offsetting the reflected beam(s) reentering the mini-OPuS output with the transmitted beam, along with the delay path separation of the main pulse into the main pulse and daughter pulses, can achieve very significant speckle reduction, e.g., at the wafer or at the annealing workpiece, arising from the reduction in the coherence of the laser light source pulse illuminating the workpiece (wafer or crystallization panel). This can be achieved, e.g., by intentionally misaligning the delay path mirrors, probably not possible with a confocal arrangement, but also with the addition of a slight wedge in the delay path prior to the beam splitter reflecting part of the delayed beam into the output with the transmitted beam and its parent pulse and preceding daughter pulses, if any. For example, a 1 milliradian wedge in the plate will produce an angular offset in the reflected daughter pulse beam of 0.86 milliradians.

The optical delay path(s) of the mini-OPuS(s) may have other beneficial results in terms of laser performance and efficiency. According to aspects of an embodiment of the disclosed subject matter, as illustrated schematically in FIG. 47, the laser beam, e.g., seed beam 500 from the seed source laser (not shown in FIG. 47, may be split into two beams 502, 504 using a partially reflective mirror (beam splitter) 510. This mirror 510 transmits a percentage of the beam into the main beam 502 and reflects the rest of the beam 500 as beam 504 into an optical delay path 506. The part 502 that is transmitted continues into the rest of the laser system (not shown in FIG. 47). The part 504 that is reflected is directed along a delay path 506 including, e.g., mirrors 512, 514 and 516, with mirror 514 being displaced perpendicularly to the plane of the paper in the schematic illustration, in order to allow the main beam 502 to reenter the rest of the laser system, e.g., to form a laser output beam or for amplification in a subsequent amplification stage. The beam 504 may then be recombined with the transmitted portion 502 of the original beam 500. The delayed beam 504 may be passed through a wedge (compensator plate) 520 essentially perpendicularly arranged in the path of beam 504. Thus, the daughter pulse beam(s) 504 from the delay path 506 are slightly angularly displaced from the main part of the beam in the transmitted portion 502 in the far field. the displacement may be, e.g., between about 50 and 500 μRad.

The length of the delay path 506 will delay the beam pulses so that there is a slight temporal shift between the part of the beam that is transmitted and the part that is reflected, e.g., more than the coherence length, but much less than the pulse length, e.g., about 1-5 ns. By selecting the appropriate path length, which determines the delay time, the addition of the two beams can be such that the energy in the pulse is spread into a slightly longer $T_{is}$, which in combination with later pulse stretching in the main OPuS(s) can improve laser performance, as well as providing other beneficial laser performance benefits.

Figure 48:
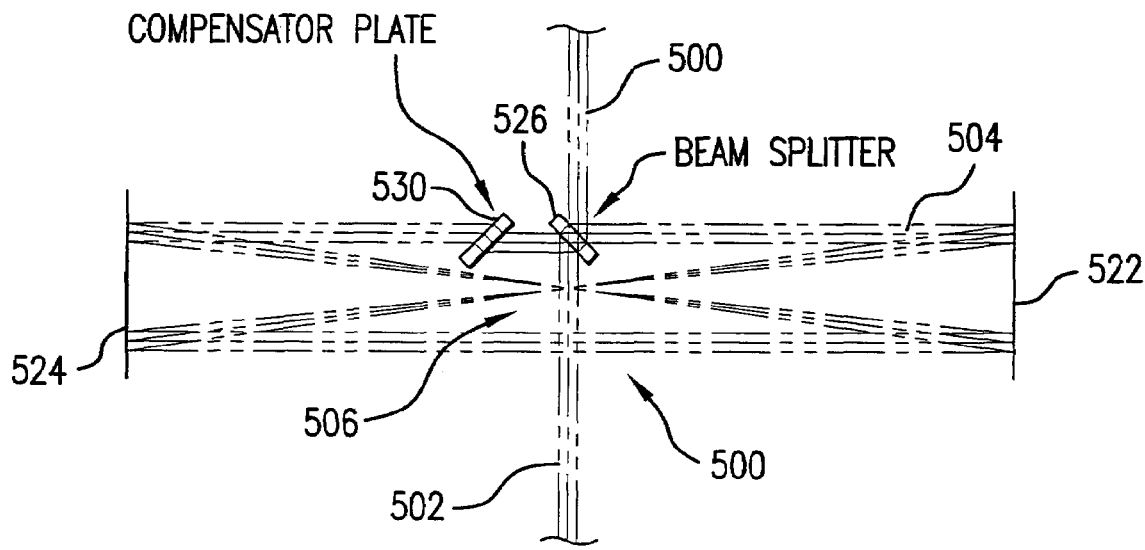
FIG. 48 shows schematically a coherence buster optical delay path according to aspects of an embodiment of the disclosed subject matter.

Two mini-OPuSs may be needed to achieve the desired effect. The offset time between the pulses from the two mini-OPuSs may be, e.g., one nanosecond. Based upon optical and mechanical considerations, the delays selected for the stretchers may be, e.g., a 3 ns delay path in the first mini-OPuS and a 4 ns delay path in the second. If the delay is shorter, the optical system, e.g., if it uses confocal or spherical mirrors can introduce unacceptable aberrations. If the delay is longer, it may be difficult to fit the system into the available space in the laser cabinet. The distance the beam must travel to achieve the 3 ns delay is 900 mm and to delay by 4 ns is 1200 mm. A confocal optical system 500, minimizing the sensitivity to misalignment, illustrated schematically in FIG. 48 may consist of two mirrors 522, 524, whose focal points are located at the same position in space and whose center of curvatures are located at the opposite mirror, along with a beam splitter 526. A compensator plate 530 (e.g., a wedge) can be added to insure that the reflected beam and the transmitted beam are slightly misaligned as noted above with respect to FIG. 48. In this case, the compensator plate is placed in the path of the delayed beam at an angle for proper functioning.

The delay path time(s) in the mini-OPuS(s) for coherence busting and other purposes may be as short as about the temporal coherence length and as long as practical due to the noted optical and space considerations, such as misalignment and aberration tolerance. If there are two or more mini-OPuSs then the delay path in each must be different in length, e.g., by more than the coherence length and selected such that there is no significant coherence reaction (increase) due to the interaction of daughter pulses from the separate OPuS(s). For example the delay path times could be separated by at least a coherence length and by not more than some amount, e.g., four or five coherence lengths, depending on the optical arrangement.

According to aspects of an embodiment of the subject matter disclosed applicants propose to employ a coherence-busting optical structure that, e.g., generates multiple sub-pulses delayed sequentially from a single input pulse, wherein also each sub-pulse is delayed from the following sub-pulse by more than the coherence length of the light, and in addition with the pointing of each sub-pulse intentionally chirped by an amount less than the divergence of the input pulse. In addition applicants propose to utilize a pair of coherence-busting optical delay structures, where the optical delay time difference between the pair of optical delay structures is more than the coherence length of the input light. Each of the two optical delay structures may also generate sub-pulses with controlled chirped pointing as noted in regard to the aspects of the previously described coherence busting optical delay structure.

According to aspects of an embodiment of the disclosed subject matter two imaging mini-OPuSs, which may be confocal, such that they are highly tolerant to misalignment and thus of potentially low aberration, e.g., for the off-axis rays needed in the proposed short OPuSs, the so-called mini-OPuSs, and can have delay times of 4 ns and 5 ns respectively. These values were chosen so that both OPuSs exhibit low wavefront distortion with spherical optics. The low wavefront requirement may prevent significant speckle reduction from the mini-OPuSs unless an angular fan-out from the mini-OPuSs is generated, e.g., by replacing a flat/flat compensating plate with the slightly wedged plate.

Figure 49:
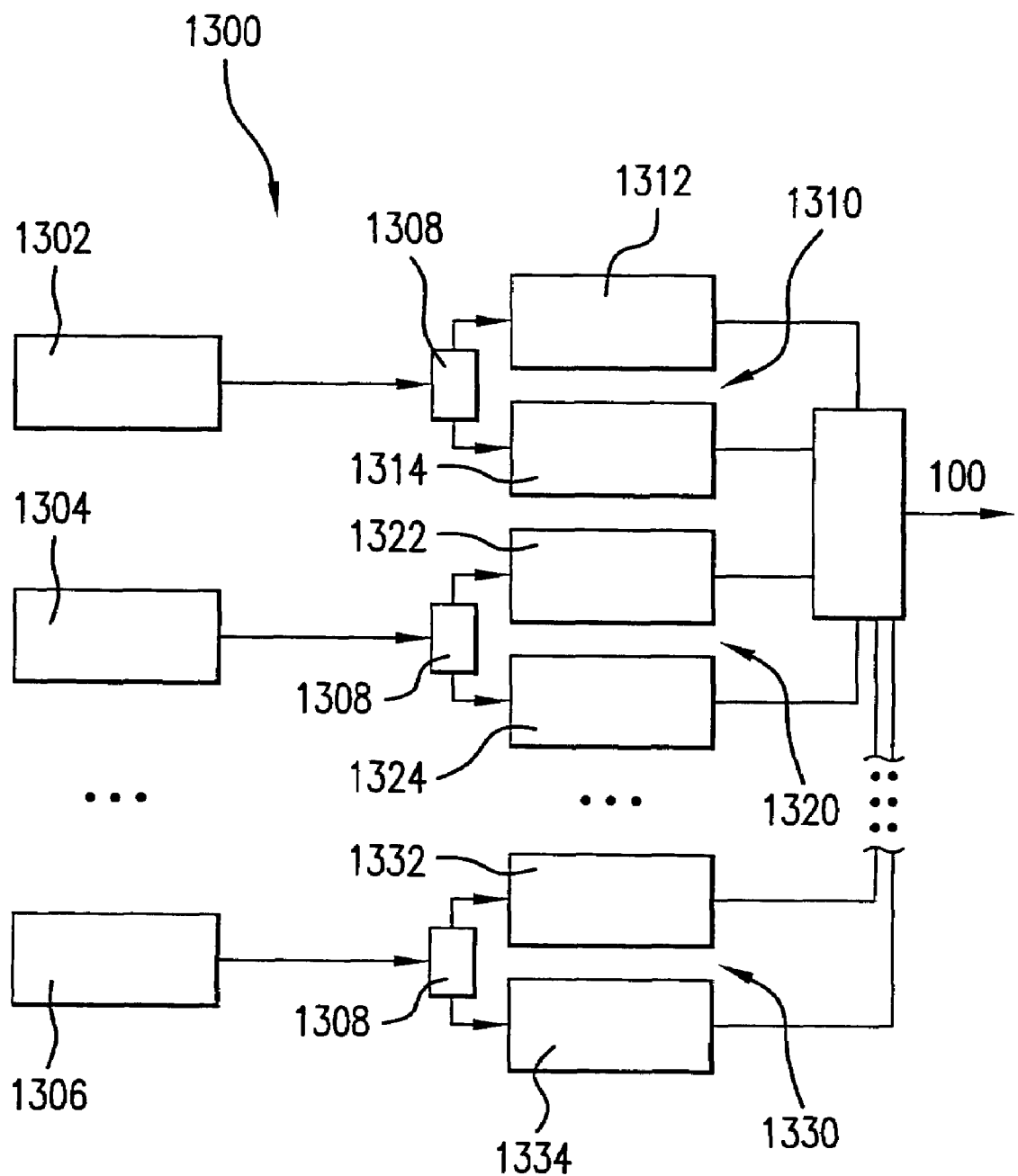
FIG. 49 shows schematically and in block diagram form a laser system according to aspects of an embodiment of the disclosed subject matter.

Turning now to FIG. 49, there is shown schematically and in block diagram form a laser system 1300 according to aspects of an embodiment of the disclosed subject matter. The laser system 1300 may include a plurality of seed lasers 1302, 1304 and 1306, with seed laser 1306 comprising an nth seed laser with the intervening seed lasers between seed laser 1304 and 1306 not shown in FIG. 49. Each of the seed lasers may be a solid state seed including any of the versions as discus It will be understood by those skilled in the art that according to aspects of an embodiment of the disclosed subject matter, adequate coherence busting may be achieved sufficiently to significantly reduce the effects of speckle on the treatment of a workpiece being exposed to illumination from the laser system, such as in integrated circuit photolithography photoresist exposure (including the impact on line edge roughness and line width roughness) or laser heating, e.g., for laser annealing of amorphous silicon on a glass substrate for low temperature recrystallization processes. This may be accomplished by, e.g., passing the laser beam, either from a single chamber laser system or from the output of a multi-chamber laser system or from the seed laser in such a multi-chamber laser system before amplification in another chamber of the multi-chamber laser system, through an optical arrangement that splits the output beam into pulses and daughter pulses and recombines the pulses and daughter pulses into a single beam with the pulses and daughter pulses angularly displaced from each other by a slight amount, e.g., between, e.g., about 50 μRad and 500 μRad and with each of the daughter pulses having been delayed from the main pulse(s), e.g., by at least the temporal coherence length and preferably more than the temporal coherence length.

This may be done in an optical beam delay path having a beam splitter to transmit a main beam and inject a portion of the beam into a delay path and then recombining the main beam with the delayed beam. In the recombination, the two beams, main and delayed, may be very slightly angularly offset from each other (pointed differently) in the far field, referred to herein as imparting a pointing chirp. The delay path may be selected to be longer than the temporal coherence length of the pulses.

The angular displacement may be accomplished using a wedge in the optical delay path prior to the delayed beam returning to the beam splitter which wedge imparts a slightly different pointing to the delayed beam (a pointing chirp). The amount of pointing chirp, as noted above may be, e.g., between about 50 and 500 μRad.

The optical delay paths may comprise two delay paths in series, each with a respective beam splitter. In such an event each delay path can be different in length such that there is not created a coherence effect between the main and daughter pulses from the respective delay paths For example, if the delay in the first delay path is 1 ns the delay in the second delay path could be about 3 ns and if the delay in the first delay path is 3 ns the delay in the second could be about 4 ns.

The wedges in the two separate delay paths may be arranged generally othogonally to each other with respect to the beam profile, such that the wedge in the first delay path can serve to reduce coherence (speckle) in one axis and the wedge in the other delay path can reduce coherence (speckle) in the other axis, generally orthogonal to the first. thus, the impact on speckle, e.g., contribution to line edge roughness ("LER") and/or line width roughness ("LWR"), e.g., at the wafer in exposure of photoresist in an integrated circuit manufacturing process can be reduced along feature dimensions in two different axes on the wafer.

According to aspects of an embodiment of the subject matter disclosed, with, e.g., a 6 mrad cross of the bowtie in a bowtie ring power amplification stage, the magnification prisms inside the ring cavity may be slightly different for the in-going and outgoing beams, and could be arranged so that the beam grows slightly as it travels around the ring or shrinks slightly as it travels around the ring. Alternatively, and preferably according to aspects of an embodiment of the subject matter disclosed, a result of breaking the larger beam expansion prism into two separate pieces, e.g., enabled by larger spacing between out-going and in-coming beams, e.g., about 5-6 mm, as illustrated by way of example in FIG. 30, applicants propose to adjust the angles of the two prisms, e.g., 146, 148 shown schematically in FIG. 4, such that they result in the same magnification for both out-going and in-coming beams, e.g., beams 100 and 62, respectively, shown illustratively and schematically in FIG. 30.

According to aspects of an embodiment of the subject matter disclosed applicants propose to place the Rmax, e.g., 164 and the OC, e.g., 162 portions of the version of the seed injection mechanism containing an Rmax 164 and an OC 162, e.g., along with the positioning of the system horizontal axis beam output aperture on that same stage. This enables, e.g., prior alignment of each as an entire unit and removes the need for field alignment of the individual components. This can allow, e.g., for the position of the Rmax/OC assembly, e.g., 160, shown in FIG. 2 (a seed injection mechanism) to be fixed, just like the OC location in a applicants' assignee's single chamber oscillator systems (e.g., XLS 7000 model laser systems) is fixed. Similarly, such an arrangement can allow for the achievement of tolerances such that the Rmax/OC are positioned relative to the system aperture properly without need for significant ongoing adjustment. The beam expansion prism may be moveable for alignment of the injection seed mechanism assembly with the chamber 144 of the amplification gain medium and the output beam 100 path with the laser system optical axis.

According to aspects of an embodiment of the subject matter disclosed applicants propose to employ a coherence-busting optical structure that generates multiple sub-pulses delayed sequentially from a single input pulse, wherein also each sub-pulse is delayed from the following sub-pulse by more than the coherence length of the light, and in addition with the pointing of each sub-pulse intentionally chirped by an amount less than the divergence of the input pulse. In addition applicants propose to utilize a pair of coherence-busting optical delay structures, where the optical delay time difference between the pair of optical delay structures is more than the coherence length of the input light. Each of the two optical delay structures may also generate sub-pulses with controlled chirped pointing as noted in regard to the aspects of the previously described coherence busting optical delay structure.

According to aspects of an embodiment of the subject matter disclosed applicants propose to position a mechanical shutter to block the MO output from entering the ring, when appropriate, similar to such as are utilized on applicants' assignee's OPuSs, e.g., to block them during alignment and diagnosis. The exact location could be, e.g., just above the last folding mirror prior to the ring power amplification stage, where the mini-OPuSes are protected during unseeded ring power amplification stage alignment and operation.

Turning now to FIG. 49 there is shown schematically and in block diagram a laser DUV light source according to aspects of an embodiment of the disclosed subject matter. The system 1300 may include, e.g., a plurality of seed laser systems, which may be solid state lasers, 1302, 1304, 1306, for example as described elsewhere in the present application, with the seed laser 1306 being an nth seed laser in the system. for each seed laser the may be a corresponding amplification laser system, e.g., 1310, 1320 and 1330, with the amplification laser system 1306 being an nth amplification laser system. each amplification laser system 1310, 1320, 1330 may have a plurality of A, in the illustrative case A=2, amplification gain mediums 1312, 1314, and 1322, 1324 and 1332, 1334, with the amplification gain mediums 1332, 1334 comprising an exemplary nth amplification gain medium system 1330. Each gain medium 1312, 1314, 1322, 1324, 1332, 1334 may comprise a gas discharge laser, such as an excimer or molecular fluorine laser, and more specifically may comprise a ring power amplification stage as described elsewhere in the present application and in above identified co-pending applications filed on the same day as the present application. Each of the respective A amplification gain mediums 1312, 1314 and 1322, 1324 and 1332, 1334 may be supplied with output pulses from the respective seed laser 1302, 1304 and 1306 by a beam divider 1308. The respective amplifier gain mediums 1312, 1314, 1322, 1324 and 1332, 1334 may operate at a fraction of the pulse repetition rate X of the respective seed lasers, e.g., A/X. A beam combiner 1340 may combine the outputs of the amplifier gain mediums 1312, 1314, 1322, 1324, 1332, 1334 to form a laser system 1300 output laser light source beam 100 of pulses at a pulse repetition rate of nX.

Turning to FIG. 50 there is illustrated schematically and in block diagram form a laser system 1350 according to aspects of an embodiment of the disclosed subject matter. which may comprise a plurality of seed lasers 1352a, 1352b and 1352c which may be solid state lasers, 1352a, 1352b, 1352c, for example as described elsewhere in the present application, with the seed laser 1352c being an nth seed laser in the system 1450. Each of the seed lasers may feed a pair of respective amplifier gain mediums 1356, 1358, 1360, 1362 and 1364, 1366, with the amplifier gain mediums 1364, 1366 being the nth pair in the system 1350, corresponding to the nth seed laser 1352c, with a respective beam divider 1354. Each amplification gain medium may be a gas discharge laser, such as an excimer or molecular fluorine laser, and more specifically may comprise a ring power amplification stage as described elsewhere in the present application and in above identified co-pending applications filed on the same day as the present application. Each of the pairs of amplification gain mediums 1356, 1358, 1360, 1362, and 1364, 1366 may operate at ½ the pulse repetition rate X of the respective seed laser 1252a, 1352b and 1352c, with the seed lasers 1352a, 1352b and 1352c all operating at the same pulse repetition rate X, to produce a laser light source output light beam of pulses 100 at nX, or each may operate at a respective pulse repetition rate X, X', X" . . . X$^{n'}$ some but not all of which may be equal to others, such that the output pulse rate in the output pulse beam 100 is ΣX'+X" . . . X$^n$, through a beam combiner 1370.

It will be understood by those skilled in the art that disclosed in the present application is a method and apparatus which may comprise a line narrowed pulsed lithography laser light source which may comprise: a seed pulse providing laser system which may comprise: a first pulsed seed laser producing seed pulses at a rate of X kHz; a second pulsed seed laser producing seed pulses at a rate of X kHz; an amplification system which may comprise: a first amplifier gain system which may comprise a first and a second pulsed gas discharge amplifier gain medium, each with a nominal center wavelength in the UV range, and each operating at ½X kHz on output pulses from the first seed laser; a second amplifier gain system which may comprise a first and a second pulsed amplifier gain medium, each with a nominal center wavelength in the UV range, and each operating at ½ X kHz on output pulses from the second seed laser; a first and a second line narrowing module each selecting a desired bandwidth for, respectively, the first and second seed laser; a pulse combiner combining the output pulses from the first and second amplifier gain systems to produce an output laser light pulse beam at a pulse repetition rate of 2X kHz. The first and second pulsed seed laser systems each may comprise a gas discharge laser with a nominal center wavelength essentially the same as the nominal center wavelength of the amplifier gain medium. The system and method may comprise a seed laser output beam divider providing output pulses of the first pulsed seed laser to the respective first amplifier gain medium and second amplifier gain medium of the first amplifier gain system and a second seed laser output beam divider providing output pulses of the second pulsed seed laser respectively to the first amplifier gain medium and the second amplifier gain medium of the second amplifier gain system. Each pulsed amplifier gain medium may comprise a gas discharge laser system. X kHz may be at least 6 kHz. Each respective amplifier gain medium may comprise a ring power amplification stage. The apparatus and method may comprise a narrow band pulsed lithography laser light source which may comprise: a seed pulse providing laser system which may comprise a single pulsed solid state seed laser with a nominal center wavelength outside of the UV range and operating at 2X kHz and having a bandwidth of $\leq$0.2 pm FWHM or $\leq$0.5 pm E95%; an amplification system which may comprise: a first amplifier gain system which may comprise a first and a second pulsed gas discharge amplifier gain medium, each with a nominal center wavelength in the UV range, and each operating at ½ X kHz on output pulses from the first seed laser system; a second amplifier gain system which may comprise a first and a second pulsed amplifier gain medium, each with a nominal center wavelength in the UV range, and each operating at ½ X kHz on output pulses from the second seed laser system; a seed pulse divider providing pulses from the solid state seed laser to a first amplifier gain system pulse divider and to a second amplifier gain system pulse divider, the first amplifier gain system pulse divider providing pulses to the first and second pulsed amplifier gain medium of the first amplifier gain system and the second amplifier gain system pulse divider providing pulses to the first and second amplifier gain medium of the second amplifier gain system; a pulse combiner combining the output pulses from the first and second amplifier gain systems to produce a light source output laser light pulse beam at a pulse repetition rate of 2X kHz. The apparatus and method may comprise a frequency converter converting the wavelength of the output of the seed laser to a UV wavelength suitable for amplification in the amplifier gain medium. Each pulsed amplifier gain medium may comprise a gas discharge laser system. X kHz may be at least 6 kHz. Each respective amplifier gain medium may comprise a ring power amplification stage. The apparatus and method may comprise a line narrowed pulsed lithography laser light source which may comprise: a first pulsed seed laser system producing seed pulses at a rate of X kHz; a second pulsed seed laser system producing seed pulses at a rate of X kHz, an nth pulsed seed laser system producing seed pulses at a rate of X kHz; a first amplifier gain system which may comprise A amplifier gain mediums each with a nominal center wavelength in the UV range, and each operating at (1/A)*X kHz on respective Ath output pulses from the first seed laser system; a second amplifier gain system which may comprise A pulsed amplifier gain mediums, each with a nominal center wavelength in the UV range, and each operating at (1/A)*X kHz on respective Ath output pulses from the second seed laser system; an nth amplifier gain system comprising A pulsed amplifier gain mediums, each with a nominal center wavelength in the UV range, and each operating at (1/A)*X kHz on respective Ath output pulses from the nth seed laser system; n line narrowing modules each selecting a desired bandwidth for, respectively, the first through nth seed laser system; a pulse combiner combining the output pulses from the n amplifier gain systems to produce an output laser light pulse beam at a pulse repetition rate of nX kHz. Each pulsed seed laser system may comprise a gas discharge laser with a nominal center wavelength essentially the same as the nominal center wavelength of the respective amplifier gain medium. The apparatus and method may comprise a seed laser beam divider providing output pulses of a respective pulsed seed laser to one of n amplifier gain system beam dividers; the respective n amplifier gain system beam divider providing each Ath pulse to a respective one of the A amplifier gain mediums in the respective amplifier gain system. Each pulsed amplifier gain medium may comprise a gas discharge laser system. X kHz is at least 4 kHz. Each respective amplifier gain medium may comprise a ring power amplification stage. The apparatus and method may comprise a line narrowed pulsed lithography laser light source which may comprise: a first pulsed solid state seed laser system producing seed pulses at a rate of X kHz; a second pulsed solid state seed laser system producing seed pulses at a rate of X kHz, an nth pulsed solid state seed laser system producing seed pulses at a rate of X kHz; a first amplifier gain system comprising A pulsed gas discharge amplifier gain mediums, each with a nominal center wavelength in the UV range, and each operating at (1/A)*X kHz on respective Ath output pulses from the first seed laser system; a second amplifier gain system comprising A pulsed amplifier gain mediums, each with a nominal center wavelength in the UV range, and each operating at (1/A)*X kHz on respective Ath output pulses from the second seed laser system; an nth amplifier gain system comprising A pulsed amplifier gain mediums, each with a nominal center wavelength in the UV range, and each operating at (1/A)*X kHz on respective Ath output pulses from the nth seed laser system; a pulse combiner combining the output pulses from the amplifier gain systems to produce an output laser light source pulse beam at a pulse repetition rate of nX kHz. The apparatus and method may comprise a seed laser beam divider providing output pulses of the respective pulsed seed laser to each of the A amplifier gain mediums in the respective nth amplifier gain system. Each pulsed amplifier gain medium may comprise a gas discharge laser system. X kHz may be at least 6 kHz. Each respective amplifier gain medium may comprise a ring power amplification stage. The apparatus and method may comprise a broad band pulsed laser light source which may comprise a first pulsed seed laser system producing seed pulses at a rate of X kHz; a second pulsed seed laser system producing seed pulses at a rate of X kHz; an nth pulsed seed laser system producing seed pulses at a rate of X kHz; a first amplifier gain system comprising A pulsed gas discharge amplifier gain mediums, each with a nominal center wavelength in the UV range, and each operating at (1/A)*X kHz on respective Ath output pulses from the first seed laser system; a second amplifier gain system comprising A pulsed amplifier gain mediums, each with a nominal center wavelength in the UV range, and each operating at (1/A)*X kHz on respective Ath output pulses from the second seed laser system; an nth amplifier gain system comprising A pulsed amplifier gain mediums, each with a nominal center wavelength in the UV range, and each operating at (1/A)*X kHz on respective Ath output pulses from the nth seed laser system; a pulse combiner combining the output pulses from the amplifier gain systems to produce an output laser light pulse beam at a pulse repetition rate of nX kHz. The pulsed seed laser systems may comprise a gas discharge laser with a nominal center wavelength essentially the same as the nominal center wavelength of the amplifier gain medium. The apparatus and method may comprise a seed laser beam divider providing output pulses of the pulsed seed laser to a respective one of the n amplifier gain system beam dividers; the respective nth amplifier gain system beam divider providing each Ath pulse to a respective one of the A amplifier gain mediums in the respective amplifier gain system. Each pulsed amplifier gain medium may comprise a gas discharge laser system. X kHz may be at least 6 kHz. Each respective amplifier gain medium may comprise a ring power amplification stage. The apparatus and method may comprise a line narrowed pulsed lithography laser light source which may comprise: a narrow band seed pulse providing laser system which may comprise a pulsed seed laser system producing a beam of seed pulses with a bandwidth of $\leq$0.2 pm FWHM or $\leq$0.5 pm E95%, at a rate of X kHz; a beam splitter receiving the output of the seed laser system and providing a split output of every pulse from the pulse splitter; an amplifier gain system comprising a first gas discharge amplifier gain medium and operating at Y kHz on respective outputs from the pulse splitter and a second gas discharge amplifier gain medium operating at Z kHz on respective outputs from the pulse splitter, where Y+Z=X; a pulse combiner combining the output pulses from the first and second amplifier gain systems to produce an output laser light pulse beam at a pulse repetition rate of X kHz. The apparatus and method may comprise a plurality of N light sources; a pulse combiner providing an output of line narrowed laser pulses at a pulse repetition rate of NX. The seed pulse providing system may comprise a solid state laser, e.g., a fiber laser, e.g., selected from a group comprising Nd-based, Er-based and Yb-based solid state lasers, or a gas discharge laser and a line narrowing module. The beam splitter may comprise a geometric beam splitter transmitting at least one spatial portion of the pulse beam on one path and at least a second portion of the pulse beam on a second path. These various combinations of seed laser systems and amplification systems may enable the generation of such high power average output power with pulse repetition rated of 12 kHz or higher and, for example with 17 mJ or less in each of the output pulses, i.e., without the seed lasers or amplification gain medium lasers having to run pulse repetition rates where operation is difficult for any of the reasons noted above. In addition the outputs of the seed laser(s) may be kept at levels, e.g., 1 mJ or less, especially with ring power amplification stages for amplification gain mediums, such that operation at, e.g., 90 W or even higher can be maintained with very much increased MO lifetimes, as noted above, which may be contributed to further where the seed lasers are solid state. In the latter cases, the multiple amplification stages in the amplifications systems may increase the repetition rates, without the problems noted above, such that operation at 60 w-90 w is easily obtainable with longer life for both the MO and amplification stages or operation at 200 w or even well above can be obtained with, e.g., acceptable repetition rates in individual components of the systems. Another benefit may be, e.g., lower energy outputs required from individual seed lasers may allow for beam splitters/direction modulators to operate with much lower fluences and with, e.g., concomitant longer live. The beam splitter may comprise a partially reflective optic, e.g., a beam splitter, reflecting a portion of each pulse in the pulse beam on one path and transmitting a portion of each pulse in the pulse beam on a second path, such that the amplification stages can run at reduced rep pates, and receive only roughly half of the output energy of the seed laser, but still produce output pulses at the pulse repetition rate of the seed laser. The beam splitter may comprise a stimulated optical path modulator such as, e.g., an elector-optical or acousto-optical beam modulator, directing a first portion of a pulse in the pulse beam in a first path during a first time period and a second portion of a pulse on a second path during a second time period, or directing separate pulses on respective ones of a plurality of separate path in respective time periods, e.g., individual pulse time periods. The gas discharge amplifier gain medium comprising a power amplifier. Each gas discharge amplification gain medium may comprise a power oscillator. The apparatus and method may comprise: the pulse combiner comprising a beam combining optical element forming a laser light source output beam comprising a first spatially defined component from the first amplifier gain medium and a second spatially defined component from the second amplifier gain medium. The pulse combiner may comprise a beam combining optical element forming a laser light source output beam comprising a first component from the first amplifier gain medium and a second component from the second amplifier gain medium exiting the pulse combiner along a path comprising a single optical axis. The pulse combiner may comprise comprising an OPuS pulse stretcher.

Applicants have simulated through calculations speckle reduction as relates to the location of coherence lengths within a single gas discharge (e.g., ArF or KrF excimer) laser system output pulse after such a pulse has passed through the two OPuS pulse stretchers sold on laser systems manufactured by applicants' assignee Cymer, Inc., used for pulse stretching to increase the total integrated spectrum ($T_{is}$) to reduce the impact of peak intensity in the laser output pulse on the optics in the tool using the output light from the laser system, e.g., a lithography tool scanner illuminator. There are two OPuS in series, with the first having a delay path sufficient to stretch the $T_{is}$ of the output pulse from about 18.6 ns to about 47.8 ns and the second to stretch the pulse further to about 83.5 ns, e.g., measured at E955 (the width of the spectrum within which is contained 95% of the energy of the pulse.

Starting with the unstretched pulse, applicants divided the pulse into portions equal to the approximate coherence length, assuming a FWHM bandwidth of 0.10 pm and a Gaussian shape for the coherence length function. The impact of the pulse stretching on the coherence length portions of the pulse after passing through the first OPuS was to show that a first intensity hump in the spectrum of the stretched pulse was made up of the coherence length portions of the main pulse, a second intensity hump was mad up of coherence length portions of the main pulse overlapped with coherence length portions of a first daughter pulse. A third hump in the intensity spectrum is the result of overlapping of the first and second daughter pulses. Looking at the individual coherence length portions of the two humps applicants observed that the multiple versions (including daughters) of the coherence length portions remained sufficiently separated to not interfere with each other.

After passage through the second OPuS the simulated spectra, again only looking at the content of the first three humps in the stretched pulse, in the simulation (under the second hump were contributions from the original undelayed pulse, as before, the first delayed pulse from the first OPuS, as before and the first delayed pulse from the second OPuS), applicants observed that in this second pulse the multiple versions of the coherence length portions were very close together. This is caused by the fact that the first OPuS has a delay of ~18 ns and the second has a delay of ~22 ns. Thus only ~4 ns separates the versions of the coherence length portions, which is still not close enough for interference.

Under the third hump applicants observed contributions from the first delayed pulse from the first OPuS, the second delayed pulse from first OPuS, the first delayed pulse from the second OPuS, and the second delayed pulse from second OPuS. applicants observed that the separation between some related coherence portions is larger than for others in the third hump in the intensity spectrum of the pulse stretched by two OPuSs. This increase in separation is due to the fact that two round trips through each OPuS equal ~36 ns=18*2 and ~44 ns=22*2. Thus the separation between coherence lengths grows with each round trip.

Applicants concluded that for a mini-OPuS as described in this application a single mini-OPuS with delay equal to one coherence length will create a train of pulses that dies out after about 4 coherence length values. Thus, applicants determined that for a single mini-OPuS to be effective, the two main OPuSs should not bring any daughter coherence lengths to within 4 coherence lengths of each other. but, applicants have observed in the simulation that the main OPuSs do just that, though only marginally so. The separation between coherence lengths for the third and greater humps is sufficient. Applicants believe that the impact of a single mini-OPuS between MO and amplification gain medium will be nearly the full expected coherence busting effect. A second mini-OPuS between MO and PA may not adequately interact with the two main OPuss. The empty spaces, not filled with related coherence length portions of the spectra pulse humps get more scarce when one combines a single min-OPuS and two regular OPuSs, and the second may be too much. according to aspects of an embodiment of the present invention applicants propose the coordinated change of the regular OPuS delay lengths when the mini-OPuS(s) are installed, including whether they are part of the laser system or installed down stream of the regular main OPuSs, e.g., in the lithography tool itself. Applicants believe that such mini-OPuS(s) can fill in the valleys of the pulse duration somewhat, leading to an increase in $T_{is}$, e.g., allowing a reduction in the delay lengths of one of the two main OPuSes for better overall coherence length separation.

It will be understood by those skilled in the art that the aspects of embodiments of the disclosed subject matter disclosed above are intended to be preferred embodiments only and not to limit the disclosure of the disclosed subject matter(s) in any way and particularly not to a specific preferred embodiment alone. Many changes and modification can be made to the disclosed aspects of embodiments of the disclosed invention(s) that will be understood and appreciated by those skilled in the art. The appended claims are intended in scope and meaning to cover not only the disclosed aspects of embodiments of the disclosed subject matter(s) but also such equivalents and other modifications and changes that would be apparent to those skilled in the art. In additions to changes and modifications to the disclosed and claimed aspects of embodiments of the disclosed subject matter(s) noted above others could be implemented.

While the particular aspects of embodiment(s) of the LASER SYSTEM described and illustrated in this patent application in the detail required to satisfy 35 U.S.C. §112 is fully capable of attaining any above-described purposes for, problems to be solved by or any other reasons for or objects of the aspects of an embodiment(s) above described, it is to be understood by those skilled in the art that it is the presently described aspects of the described embodiment(s) of the disclosed subject matter are merely exemplary, illustrative and representative of the subject matter which is broadly contemplated by the disclosed subject matter. The scope of the presently described and claimed aspects of embodiments fully encompasses other embodiments which may now be or may become obvious to those skilled in the art based on the teachings of the Specification. The scope of the present LASER SYSTEM is solely and completely limited by only the appended claims and nothing beyond the recitations of the appended claims. Reference to an element in such claims in the singular is not intended to mean nor shall it mean in interpreting such claim element "one and only one" unless explicitly so stated, but rather "one or more". All structural and functional equivalents to any of the elements of the above-described aspects of an embodiment(s) that are known or later come to be known to those of ordinary skill in the art are expressly incorporated herein by reference and are intended to be encompassed by the present claims. Any term used in the specification and/or in the claims and expressly given a meaning in the Specification and/or claims in the present application shall have that meaning, regardless of any dictionary or other commonly used meaning for such a term. It is not intended or necessary for a device or method discussed in the Specification as any aspect of an embodiment to address each and every problem sought to be solved by the aspects of embodiments disclosed in this application, for it to be encompassed by the present claims. No element, component, or method step in the present disclosure is intended to be dedicated to the public regardless of whether the element, component, or method step is explicitly recited in the claims. No claim element in the appended claims is to be construed under the provisions of 35 U.S.C. §112, sixth paragraph, unless the element is expressly recited using the phrase "means for" or, in the case of a method claim, the element is recited as a "step" instead of an "act".

It will be understood also be those skilled in the art that, in fulfillment of the patent statutes of the United States, applicant(s) has disclosed at least one enabling and working embodiment of each invention recited in any respective claim appended to the Specification in the present application and perhaps in some cases only one. For purposes of cutting down on patent application length and drafting time and making the present patent application more readable to the inventor(s) and others, applicant(s) has used from time to time or throughout the present application definitive verbs (e.g., "is", "are", "does", "has", "includes" or the like) and/or other definitive verbs (e.g., "produces," "causes" "samples," "reads," "signals" or the like) and/or gerunds (e.g., "producing," "using," "taking," "keeping," "making," "determining," "measuring," "calculating" or the like), in defining an aspect/feature/element of, an action of or functionality of, and/or describing any other definition of an aspect/feature/element of an embodiment of the subject matter being disclosed. Wherever any such definitive word or phrase or the like is used to describe an aspect/feature/element of any of the one or more embodiments disclosed herein, i.e., any feature, element, system, sub-system, component, sub-component, process or algorithm step, particular material, or the like, it should be read, for purposes of interpreting the scope of the subject matter of what applicant(s) has invented, and claimed, to be preceded by one or more, or all, of the following limiting phrases, "by way of example," "for example," "as an example," "illustratively only," "by way of illustration only," etc., and/or to include any one or more, or all, of the phrases "may be," "can be", "might be," "could be" and the like. All such features, elements, steps, materials and the like should be considered to be described only as a possible aspect of the one or more disclosed embodiments and not as the sole possible implementation of any one or more aspects/features/elements of any embodiments and/or the sole possible embodiment of the subject matter of what is claimed, even if, in fulfillment of the requirements of the patent statutes, applicant(s) has disclosed only a single enabling example of any such aspect/feature/element of an embodiment or of any embodiment of the subject matter of what is claimed. Unless expressly and specifically so stated in the present application or the prosecution of this application, that applicant(s) believes that a particular aspect/feature/element of any disclosed embodiment or any particular disclosed embodiment of the subject matter of what is claimed, amounts to the one an only way to implement the subject matter of what is claimed or any aspect/feature/element recited in any such claim, applicant(s) does not intend that any description of any disclosed aspect/feature/element of any disclosed embodiment of the subject matter of what is claimed in the present patent application or the entire embodiment shall be interpreted to be such one and only way to implement the subject matter of what is claimed or any aspect/feature/element thereof, and to thus limit any claim which is broad enough to cover any such disclosed implementation along with other possible implementations of the subject matter of what is claimed, to such disclosed aspect/feature/element of such disclosed embodiment or such disclosed embodiment. Applicant(s) specifically, expressly and unequivocally intends that any claim that has depending from it a dependent claim with any further detail of any aspect/feature/element, step, or the like of the subject matter of what is claimed recited in the parent claim or claims from which it directly or indirectly depends, shall be interpreted to mean that the recitation in the parent claim(s) was broad enough to cover the further detail in the dependent claim along with other implementations and that the further detail was not the only way to implement the aspect/feature/element claimed in any such parent claim(s), and thus be limited to the further detail of any such aspect/feature/element recited in any such dependent claim to in any way limit the scope of the broader aspect/feature/element of any such parent claim, including by incorporating the further detail of the dependent claim into the parent claim.

We claim:

1. An apparatus comprising:
a narrow band pulsed lithography laser light source comprising:
   a seed pulse providing laser system comprising:
      a single pulsed solid state seed laser with a nominal center wavelength outside of the UV range and operating at 2X kHz;
an amplification system comprising:
   a first amplifier gain system comprising a first and a second pulsed gas discharge amplifier gain medium, each with a nominal center wavelength in the UV range, and each operating at ½ X kHz on output pulses from the first seed laser system; and
   a second amplifier gain system comprising a first and a second pulsed amplifier gain medium, each with a nominal center wavelength in the UV range, and each operating at ½ X kHz on alternating output pulses from the second seed laser system;
a seed pulse divider providing pulses from the solid state seed laser to a first amplifier gain system pulse divider and to a second amplifier gain system pulse divider, the first amplifier gain system pulse divider providing pulses to the first and second pulsed amplifier gain mediums of the first amplifier gain system and the second amplifier gain system pulse divider providing pulses to the first and second amplifier gain mediums of the second amplifier gain system; and
a pulse combiner combining the output pulses from the first and second amplifier gain systems to produce a light source output laser light pulse beam at a pulse repetition rate of 2X kHz.

2. The apparatus of claim 1 further comprising:
a frequency converter converting the wavelength of the output of the seed laser to a UV wavelength suitable for amplification in the amplifier gain mediums.

3. The apparatus of claim 2 further comprising:
each pulsed amplifier gain medium comprising a gas discharge laser system.

4. The apparatus of claim 3 further comprising:
X kHz is at least 4 kHz.

5. The apparatus of claim 4 further comprising:
each respective amplifier gain medium comprising a ring power amplification stage.

6. An apparatus comprising:
a narrow band pulsed solid state seed laser operating at an output repetition rate;
a seed pulse divider that receives an output from the narrow band pulsed solid state seed laser and produces alternating output pulses;
an amplification system comprising a plurality of pulsed gas discharge amplifier gain systems each operating at repetition rate that is a fraction of the output repetition rate and each supplied with alternating output pulses from the seed pulse divider; and
a pulse combiner combining the output pulses from the plurality of pulsed gas discharge amplifier gain systems to produce an output laser light pulse beam having pulses firing at interleaving times and at the output repetition rate.

7. The apparatus of claim 6, wherein each pulsed gas discharge amplifier gain system comprises a ring power amplification stage.

8. The apparatus of claim 6, wherein the output laser light pulse beam has a wavelength of about 193 nm.

9. The apparatus of claim 6, wherein the alternating output pulses received at the amplification system have a wavelength of about 193 nm.

10. The apparatus of claim 6, further comprising a frequency converter converting the wavelength of the output of the seed laser to a wavelength suitable for amplification in the pulsed gas discharge amplifier gain systems.

11. An apparatus comprising:
a narrow band pulsed solid state seed laser operating at an output repetition rate;
a seed pulse divider that receives an output from the narrow band pulsed solid state seed laser and produces output pulses;
an amplification system comprising a plurality of pulsed gas discharge amplifier gain systems each operating at repetition rate that is a fraction of the output repetition rate and each supplied with output pulses from the seed pulse divider; and
a pulse combiner combining the output pulses from the plurality of amplifier gain systems to produce an output laser light pulse beam having pulses firing at the output repetition rate and having a wavelength of 193 nm.

12. The apparatus of claim 11, wherein each pulsed gas discharge amplifier gain system comprises a ring power amplification stage.

13. The apparatus of claim 11, further comprising a frequency converter converting the wavelength of the output of the seed laser to a wavelength suitable for amplification in the pulsed gas discharge amplifier gain systems.

14. An apparatus comprising:
a narrow band pulsed solid state seed laser operating at an output repetition rate;
a seed pulse divider that receives an output from the narrow band pulsed solid state seed laser and produces alternating output pulses;
an amplification system comprising a plurality of pulsed gas discharge amplifier gain systems each comprising a ring power amplification stage operating at repetition rate that is a fraction of the output repetition rate and each supplied with output pulses from the seed pulse divider; and
a pulse combiner combining the output pulses from the plurality of pulsed gas discharge amplifier gain systems to produce an output laser light pulse beam having pulses firing at interleaving times and at the output repetition rate.

15. The apparatus of claim 14, further comprising a frequency converter converting the wavelength of the output of the seed laser to a wavelength suitable for amplification in the pulsed gas discharge amplifier gain systems.

* * * * *